US012588420B2

(12) United States Patent
Sakamoto et al.

(10) Patent No.: US 12,588,420 B2
(45) Date of Patent: Mar. 24, 2026

(54) POWER-GENERATING MAGNETOSTRICTIVE ELEMENT AND MAGNETOSTRICTIVE POWER GENERATION DEVICE

(71) Applicant: Nippon Steel Chemical & Material Co., Ltd., Tokyo (JP)

(72) Inventors: Hiroaki Sakamoto, Tokyo (JP); Masao Tanabe, Tokyo (JP)

(73) Assignee: Nippon Steel Chemical & Material Co., Ltd., Tokyo (JP)

( * ) Notice: Subject to any disclaimer, the term of this patent is extended or adjusted under 35 U.S.C. 154(b) by 757 days.

(21) Appl. No.: 17/788,746

(22) PCT Filed: Dec. 24, 2020

(86) PCT No.: PCT/JP2020/048501
§ 371 (c)(1),
(2) Date: Jun. 24, 2022

(87) PCT Pub. No.: WO2021/132482
PCT Pub. Date: Jul. 1, 2021

(65) Prior Publication Data
US 2023/0046395 A1    Feb. 16, 2023

(30) Foreign Application Priority Data

Dec. 25, 2019    (JP) ................................. 2019-234429
Dec. 25, 2019    (JP) ................................. 2019-234437
Dec. 25, 2019    (JP) ................................. 2019-234443

(51) Int. Cl.
*H10N 35/00*        (2023.01)
*H10N 35/80*        (2023.01)
*H10N 35/85*        (2023.01)

(52) U.S. Cl.
CPC ........... *H10N 35/101* (2023.02); *H10N 35/80* (2023.02); *H10N 35/85* (2023.02)

(58) Field of Classification Search
CPC ........ H10N 35/00; H10N 35/01; H10N 35/80; H10N 35/85
(Continued)

(56) References Cited

U.S. PATENT DOCUMENTS 4,265,682 A * 5/1981 Tsuya ...................... C22C 38/02
335/297
2011/0057458 A1    3/2011 Lee et al.
(Continued)

FOREIGN PATENT DOCUMENTS

JP        2015-070741        4/2015
JP        2015-180126        10/2015
(Continued)

OTHER PUBLICATIONS

Meadinfo, SUS304 stainless steal an overview, (Year: 2015).*
(Continued)

*Primary Examiner* — Eric Johnson

(57)        ABSTRACT

Task of the present invention is to provide a power-generating magnetostrictive element and a magnetostrictive power generation device equipped with the same, which are capable of achieving the same or a greater magnetostrictive power generation amount compared to conventional technology while employing materials lower in cost compared to conventional magnetostrictive materials. The task is achieved by providing a magnetostrictive element comprising a magnetostrictive part formed of an electromagnetic metal sheet. The present invention also provides a power-generating magnetostrictive element and a power-generating magnetostrictive element having high voltage with little variation. The task is achieved by providing a magnetostric-
(Continued)

30 tive element comprising a magnetostrictive part formed from a magnetostrictive material and a stress control part formed from an elastic material, the materials each having a Young's modulus and a sheet thickness simultaneously satisfying specific relationships.

12 Claims, 12 Drawing Sheets

(58) Field of Classification Search
USPC .......................................................... 310/26
See application file for complete search history.

(56) References Cited

U.S. PATENT DOCUMENTS

| | | | |
|---|---|---|---|
| 2014/0300216 A1 | 10/2014 | Toyoda | |
| 2014/0346902 A1 | 11/2014 | Ucno | |
| 2015/0115748 A1 | 4/2015 | Shimanouchi | |
| 2015/0155472 A1 | 6/2015 | Furukawa et al. | |
| 2015/0325778 A1* | 11/2015 | Furukawa | H02N 2/186 |
| | | | 310/26 |
| 2019/0131892 A1* | 5/2019 | Ueno | H10N 35/101 |
| 2021/0172812 A1 | 6/2021 | Narita et al. | |

FOREIGN PATENT DOCUMENTS

| | | |
|---|---|---|
| JP | 2015-223061 | 12/2015 |
| JP | 5880579 | 2/2016 |
| JP | 6076250 | 2/2017 |
| JP | 2018-148791 | 9/2018 |
| WO | WO 2013/038682 | 3/2013 |
| WO | WO 2013/186876 | 12/2013 |
| WO | WO 2014/021197 | 2/2014 |
| WO | WO 2017/183325 | 10/2017 |
| WO | WO 2018/230154 | 12/2018 |

OTHER PUBLICATIONS

Examination Report Under Sections 12 & 13 of the Patents Act, 1970 and the Patents Rules, 2003 Dated Oct. 12, 2022 From the Government of India, Intellectual Property India, Patents, Designs, Trade Marks, Geographical Indications, The Patent Office Re. Application No. 202247035880. (6 Pages).

International Search Report and the Written Opinion Dated Jun. 1, 2021 From the International Searching Authority Re. Application No. PCT/JP2020/048501 and Its Translation of Search Report Into English. (9 Pages).

Notice of Reasons for Refusal Dated Feb. 25, 2022 From the Japan Patent Office Re. Application No. 2019-234429 and Its Translation Into English. (8 Pages).

Kyoto University The 43rd Annual Conference on Magnetics in Japan, Kyoto University Yoshida Campus, Japan, Sep. 25-27, 2019, 3 P., Sep. 25, 2019.

Osanai et al. "Study on Energy Harvesting With (100) [001] Silicon Steel Sheet", Summary of the 2019 43th Annual Conference on Magnetics, Japan, Sep. 11, 2019, p. 170, Sep. 11, 2019 With English Translation.

Supplementary Partial European Search Report and the European Provisional Opinion Dated Jul. 27, 2023 From the European Patent Office Re. Application No. 20908324.5. (12 Pages).

Okada et al. "Vibration Power Generation Property of U-Shaped Unimorph Device Using Grain-Oriented Electrical Steel", Materials Transactions, XP093065246, 62(12): 1798-1801, Oct. 29, 2021.

Communication Pursuant to Rule 114(2) EPC (Third Party Observation for Application Number EP20200908324) Dated Jan. 26, 2024 From the European Patent Office Re. Application No. 20908324. 5. (3 Pages).

Deng et al. "Modeling and Design of Galfenol Unimorph Energy Harvesters", Smart Materials and Structures, 24(12): 125019-1-125019-14, Nov. 5, 2015.

Submission of Publications and the Like Dated Feb. 7, 2024 From the Japan Patent Office Re. Application No. 2019-234443 and Its Translation Into English. (9 Pages).

Deng et al. "Multiphysics Modeling and Design of Galfenol-Based Unimorph Harvesters", Industrial and Commercial Applications of Smart Structures Technologies, Proceedings of the SPIE, 9433: 94330B-1-94330B-10, Apr. 1, 2015.

Ueno "Proposal of Mass-Production Structure of Magnetostrictive Vibrational Power Generator for Battery-Frec IoT", Journal of the Japan Society of Applied Electromagnetics and Mechanics, AEM, 26(1): 185-190, 2018. English Abstract.

Ueno "Proposal of Mass-Production Structure of Magnetostrictive Vibrational Power Generator for Battery-Free IoT", Website of Journal of the Japan Society of Applied Electromagnetics and Mechanics, AEM, 26(1): 185-190, 2018.

* cited by examiner

<u>30</u>

<u>600</u>

<u>700</u>

1

POWER-GENERATING MAGNETOSTRICTIVE ELEMENT AND MAGNETOSTRICTIVE POWER GENERATION DEVICE

TECHNICAL FIELD

The present invention relates to a magnetostrictive element for power generation and a magnetostrictive power generation device.

BACKGROUND ART

In the use of the Internet in a product (Internet of Things, hereinafter abbreviated as "IoT"), which has been developing in recent years, a wireless sensor module, in which a sensor, a power supply, a wireless communication device, and the like are integrated, is used for connecting the product and the Internet. As a power supply of such a wireless sensor module, there is a demand for the development of a power generation device which is capable of generating power from the energy generated in the environment of the installation site without a need of periodic manual maintenance, such as battery replacement or charging.

An example of such a power generation device is a magnetostrictive vibration power generation device using reverse magnetostriction, the reverse effect of magnetostriction. The reverse magnetostriction is a phenomenon in which the magnetization of the magnetostrictive material changes when strain is applied to the magnetostrictive material by vibration or the like. In the magnetostrictive vibration power generation, strain is applied to the magnetostrictive material by vibration, and an electromotive force is generated in the coil wound around the magnetostrictive element, in accordance with the law of electromagnetic induction.

Conventionally, a method of increasing the amount of magnetostriction of a magnetostrictive material has been attempted for enhancing the power generation performance of the magnetostrictive material. This is because when tensile strain and compressive strain are alternately applied to the magnetostrictive material, the larger the amount of magnetostriction, the larger the increase in magnetic flux density change ($\Delta B$) utilizing the reverse magnetostriction, thereby also increasing the power generation output. From this viewpoint, a FeGa alloy, a FeCo alloy, a FeAl alloy, and the like have been developed as materials having large amount of magnetostriction, and power generation devices using these magnetostrictive materials have also been developed (Patent Literatures (PTLs) 1 to 6).

For example, in the power generation device described in PTL 1, in order to reduce variations in quality by improving the power generation performance, a magnetostrictive material and a soft magnetic material are bonded together so as to change the magnetization of the soft magnetic material by the magnetization of the magnetostrictive material. In this way, in addition to the voltage due to the change in magnetization of the magnetostrictive material, the voltage due to the change in the magnetization of the soft magnetic material is also induced in the detection coil. FeCo, FeAl, Ni, NiFe, NiCo, and the like are described as the magnetostrictive material used, and Fe, FeNi, FeSi, and electromagnetic stainless are described as the soft magnetic material. As methods for bonding the magnetostrictive material and the soft magnetic material, thermal diffusion bonding, hot rolling, hot drawing, adhesion, welding, clad rolling, explosive bonding and the like are described.

With respect to the power generation device described in PTL 2, for improving electromotive force, reducing manufacturing cost, and improving mass productivity, a parallel pillar structure combining the magnetostrictive material and the magnetic material is produced, and an actuator having a configuration which uses the magnetic material in a magnetically saturated state obtained by a bias magnetic field is disclosed. In this actuator, the back yoke is U-shaped, and the neutral surface is provided outside the magnetostrictive material, so as to improve the electromotive force by superimposing the change in the bias magnetic field due to vibration to the change in magnetization of the magnetostrictive material. FeGa, FeCo, FeAl, FeSiB, amorphous material and the like are described as the magnetostrictive materials, and SPCC, carbon steel (SS400, SC, SK, SK2), ferritic stainless steel (SUS430) and the like are described as the magnetic materials. As methods for bonding the magnetostrictive material and the magnetic material, and also bonding to the back yoke, there are described a solder bonding of both ends of the magnetostrictive material, welding, brazing, resistance welding, laser welding, ultrasonic bonding, and adhesives.

PTL 3 discloses a power generation element in which, for improving power generation efficiency and uniform stress loading, a magnetostrictive material and a non-magnetic material (as a reinforcing material) are bonded together so that the cross-sectional area ratio of the magnetostrictive material and the reinforcing material (reinforcement material/magnetostrictive material) becomes >0.8. FeGa, FeCo, FeNi and the like are described as the magnetostrictive material. A filler-containing resin, Al, Mg, Zn, Cu, and the like are described as the reinforcing material, and preferred are those having a Young's modulus of 40 to 100 GPa. As methods for bonding the magnetostrictive material and the reinforcing material, ultrasonic bonding, solid phase diffusion bonding, liquid phase diffusion bonding, resin adhesive, and metal brazing material are described.

In the power generation device of PTL 4, a structure capable of increasing the number of turns of a coil is adopted for improving power generation output. Specifically, a structure is produced in which a magnetostrictive sheet and a non-magnetic structure are surface-bonded together, and magnetic field is refluxed from the magnetostrictive sheet through a U-shaped yoke with a coil wound therearound. FeGa and FeCo are described as the magnetostrictive sheet, and stainless steels (SUS304, etc.) are described as the non-magnetic structure. An adhesive and an adhesive sheet (a photocurable resin, a thermosetting resin) are described as methods for bonding the magnetostrictive material and the non-magnetic structure.

In the power generation device of PTL 5, for improving power generation efficiency and uniform stress application, structures are produced by laminating a magnetostrictive material and a non-magnetic material (reinforcing material) and the produced structures are used as two parallel pillars. FeGa, FeCo, a FeCo amorphous material, a Fe-based amorphous material, a Ni-based amorphous material, a metamagnetic shape memory alloy, a ferromagnetic shape memory alloy, and the like are described as the magnetostrictive materials, and silicon oxide, alumina, polyimide, polycarbonate, fiber reinforced plastic, non-magnetic metals (Al, Cu), and the like are described as the non-magnetic materials.

In the power generation device of PTL 6, for improving power generation output, use is made of a structure in which a magnetostrictive material and a magnetic material are placed apart as parallel pillars. By adopting such a structure, the device is designed to use the magnetic material in a magnetically non-saturated state, and to change the magnetic flux of the magnetic material by the change in the magnetic flux of the magnetostrictive material, to thereby output a voltage which is a sum of the induced voltage by the magnetostrictive material and the induced voltage by the magnetic material. FeGa, FeCo, FeNi, FeDyTb are described as the magnetostrictive materials, and ferritic stainless steel, FeSi, NiFe, CoFe, SmCo, NdFeB, CoCr, CoPt are described as the magnetic materials.

CITATION LIST

Patent Literature

PTL 1
International Publication No. 2018/230154
PTL2
Japanese Patent Application Laid-Open No. 2018-148791
PTL 3
International Publication No. 2014/021197
PTL 4
International Publication No. 2013/038682
PTL5
International Publication No. 2013/186876
PTL 6
Japanese Patent Application Laid-Open No. 2015-70741

SUMMARY OF INVENTION

Technical Problem

As is apparent from the description of PTLs 1 to 6, in the magnetostrictive power generating element and the magnetostrictive power generating device, various magnetostrictive materials are used together with other materials. A FeGa alloy, a material known to have a largest amount of magnetostriction, is described as the magnetostrictive material in PTLs 2 to 6, and the FeGa alloy is very expensive because it is manufactured by a single-crystal pulling method (CZ method). A FeCo alloy described in PTLs 1 to 6 are produced by a rolling method, but it is also expensive because it contains Co. Further, the FeAl alloy described in PTLs 1 and 2 are less expensive as compared with the FeGa alloy and FeCo alloy, but is still expensive. The FeAl alloy has additional problems such as low toughness and difficulty to produce a sheet by a conventional rolling method.

The FeGa alloy, FeCo alloy, and FeAl alloy, the conventionally used magnetostrictive materials, are described in a number of PTLs as magnetostrictive materials used in the magnetostrictive element for power generation because these materials have λ100 (amount of magnetostriction in <100> direction) of 80 ppm or more. However, these magnetostrictive materials have problems such as high manufacturing cost and limited formability.

PTLs 1 and 6 describe a FeSi alloy (an electromagnetic steel sheet) as a soft magnetic material, but in both PTLs, the FeSi alloy is used as a material to be bonded to the magnetostrictive material, and not as the magnetostrictive materials. Such use of the FeSi alloy is a common utility of the FeSi alloy in a conventional magnetic circuitry.

Solution to Problem

In view of the above-mentioned problems, the first aspect of the present invention is the following magnetostrictive element for power generation.

[1] A magnetostrictive element for power generation, comprising a magnetostrictive part formed of an electrical steel.

[2] The magnetostrictive element for power generation according to [1], further comprising a stress control part formed of an elastic material laminated to the electrical steel sheet.

[3] The magnetostrictive element for power generation according to [2], wherein, when the electrical steel sheet has a Young's modulus Em [GPa] and a sheet thickness tm [mm], and the elastic material has a Young's modulus Es [GPa] and a sheet thickness ts [mm], the magnetostrictive element simultaneously satisfies the relationships of the following Equations (1) and (2):

$$Em < Es \tag{1}$$

$$1.1 \le \frac{Es \times ts^2}{Em \times tm^2}. \tag{2}$$

[4] The magnetostrictive element for power generation according to [2] or [3], wherein the elastic material is a non-magnetic material.

[5] The magnetostrictive element for power generation according to any of [1] to [4], wherein the electrical steel sheet is a grain-oriented electrical steel sheet.

[6] The magnetostrictive element for power generation according to any of [1] to [4], wherein the electrical steel sheet is a non-oriented electrical steel sheet.

The second aspect of the present invention is the following magnetostrictive power generation device.

[7] A magnetostrictive power generation device comprising the magnetostrictive element for power generation according to any one of [1] to [6].

[8] A magnetostrictive power generation device comprising: the magnetostrictive element according to any of [2] to [6] having a magnetostrictive part formed of an electrical steel sheet and a stress control part formed of an elastic material; and a frame continuous with the magnetostrictive element for power generation, wherein at least a part of the frame is composed of a laminate comprising the electrical steel sheet extending from the magnetostrictive part and the elastic material extending from the stress control part.

[9] The magnetostrictive power generation device according to [8], wherein whole of the frame is formed integrally with the electrical steel sheet extending from the magnetostrictive part.

[10] The magnetostrictive power generation device according to [8], wherein whole of the frame is formed integrally with the elastic material extending from the stress control part.

[11] The magnetostrictive power generation device according to [8], wherein whole of the frame is formed integrally with the magnetostrictive element for power generation.

[12] The magnetostrictive power generation device according to any of [8] to [11], wherein the frame has a shape with at least one bent portion, and wherein, in the frame and the magnetostrictive element for power generation, the electrical steel sheet is positioned at an inner side of the magnetostrictive power generation device and the elastic material is positioned at an outer side of the magnetostrictive power generation device.

[13] The magnetostrictive power generation device according to any of [8] to [11], wherein the frame has a shape with at least one bent portion, and wherein, in the frame and the magnetostrictive element for power generation, the elastic material is positioned at an inner side of the magnetostrictive power generation device and the electrical steel sheet is positioned at an outer side of the magnetostrictive power generation device.

The magnetostrictive power generation device according to any of [7] to [13], wherein: the electrical steel sheet is a grain-oriented electrical steel sheet, and the grain-oriented electrical steel sheet is configured such that a bias magnetic field is applied in <100> direction thereof.

The third aspect of the present invention is the following magnetostrictive element for power generation and a magnetostrictive power generation device.

[15] A magnetostrictive element for power generation, comprising: a magnetostrictive part formed of a magnetostrictive material selected from a group consisting of a FeGa-based alloy, a FeCo-based alloy, and a FeAl-based alloy, and a stress control part formed of an elastic material laminated to the magnetostrictive material, wherein, when the magnetostrictive material has a Young's modulus Em [GPa] and a sheet thickness tm [mm], and the elastic material has a Young's modulus Es [GPa] and a sheet thickness ts [mm], the magnetostrictive element simultaneously satisfies the relationships of the following equations (1) and (2):

$$Em < Es \tag{1}$$

$$1.1 \le \frac{Es \times ts^2}{Em \times tm^2}. \tag{2}$$

[16] The magnetostrictive element for power generation according to [15], wherein the elastic material is a non-magnetic material.

[17] A magnetostrictive power generation device comprising the magnetostrictive element for power generation according to [15] or [16].

Advantageous Effects of Invention

According to the present invention, provided are a magnetostrictive element for power generation and a magnetostrictive power generation device which are lower in cost than those using a FeGa alloy, FeCo alloy or FeAl alloy as a magnetostrictive material, but are capable of achieving a magnetostrictive power generation in an amount equivalent to or larger than those of conventional art.

DESCRIPTION OF EMBODIMENTS

Figure 1:
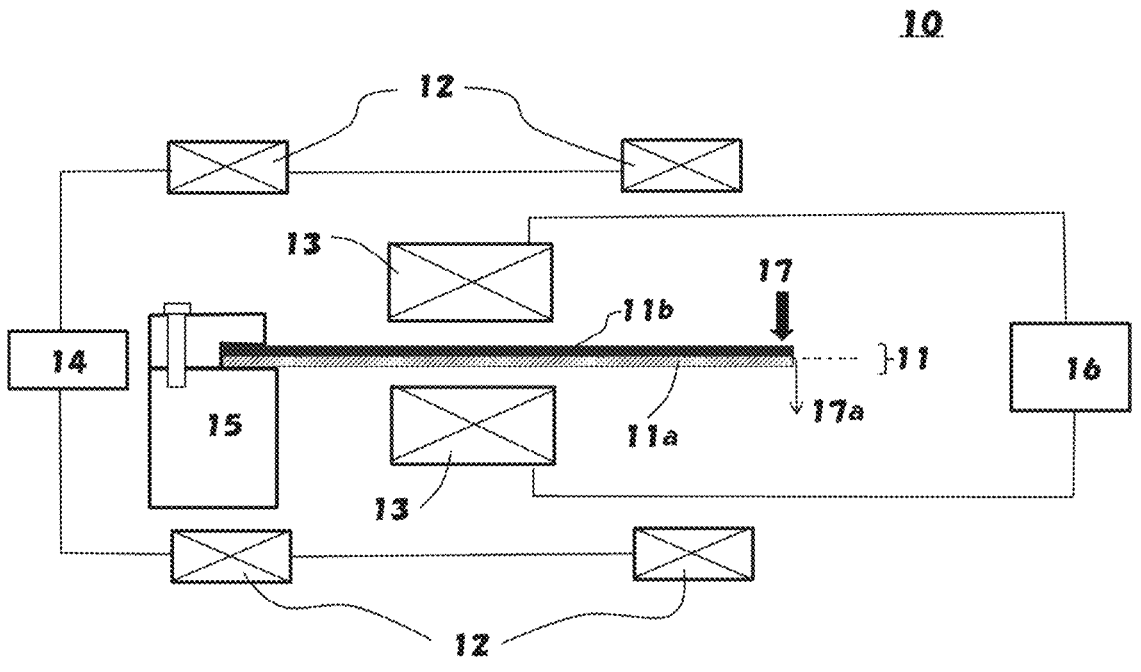
FIG. 1 is a schematic diagram of a unit for measuring the magnetic flux density change ΔB by applying a bending strain to a magnetostrictive element.

As described above, the magnetostrictive materials for power generation described in the prior art are mainly magnetostrictive materials having large saturation magnetostriction, such as a FeGa alloy having a saturation magnetostriction at a level of about 200 ppm, or a FeCo alloy or FeAl alloy having a saturation magnetostriction at a level of 80 ppm. This is because the larger the saturation magnetostriction, the larger the magnetoelastic energy generated when a strain is applied to the magnetostrictive material, and the change in the direction of magnetization in the magnetostrictive material is more likely to occur for lowering the generated energy. In other words, conventionally, there was no anticipation for using an electromagnetic steel sheet (i.e., a FeSi alloy) having a saturation magnetostriction at a level of 8 ppm as a magnetostrictive material for power generation.

In addition, the electrical steel sheet is conventionally a material used as a yoke material for constituting magnetic circuits of transformers and motors. In such applications, attempts have been made to reduce the magnetostriction of the electrical steel sheets for reducing iron loss which results in energy loss. Therefore, in the art, there was not even an idea of using the electrical steel sheet as a magnetostrictive material for the magnetostrictive element for power generation.

Under such circumstances, the present inventors have found that even an electromagnetic steel sheet with small saturation magnetostriction is capable of achieving a power generation equivalent to or greater than FeCo alloys when it is used as a magnetostrictive material in a magnetostrictive element for power generation. The present invention has been completed based on this finding.

Hereinafter, the present invention will be described with reference to exemplary embodiments, but the present invention is not limited to the following embodiments.

1. Magnetostrictive Element for Power Generation

A embodiment 1 of the present invention relates to a magnetostrictive element for power generation which comprises a magnetostrictive part formed of an electrical steel sheet. In the present invention, a "magnetostrictive element for power generation" (hereinafter, frequently abbreviated to "magnetostrictive element") is an element having a magnetostrictive part formed from a magnetic material having a magnetostrictive property, i.e., a change in shape (i.e., warpage) due to application of a magnetic field, and being capable of generating electricity based on reverse magnetostriction of the magnetostrictive part.

In the magnetostrictive element for power generation of the embodiment 1 of the present invention, the magnetostrictive part is formed of an electrical steel sheet. In the present invention, an "electrical steel sheet" is a functional material sometimes referred to as a "silicon steel sheet" in which the magnetic properties of iron are improved by adding silicon (Si) to iron (Fe). The electrical steel sheet used in the present invention is an electrical steel sheet having a silicon content of 0.5% or more and 4% or less. Electromagnetic steel sheet having a silicon content of 0.5% or more and 4% or less is suitable for use in the magnetostrictive part because the added silicon increases the electrical resistance and suppresses the generation of eddy currents which hinder the magnetization change by the alternating vibration.

Further, the electrical steel sheets include a grain-oriented electrical steel sheet and a non-oriented electrical steel sheet, and in the embodiment 1 of the present invention, both the grain-oriented electrical steel sheet and non-oriented electrical steel sheet can be used in the magnetostrictive part. The grain-oriented electrical steel sheet is an electrical steel sheet obtained by aligning the crystal orientation of metal crystals in the rolling direction of the steel sheet. Specifically, it is an electrical steel sheet having a {110}<100> GOSS texture in which the rolling direction is aligned in <100> direction and the rolled surface is in {110} orientation. On the other hand, the non-oriented electrical steel sheet is an electrical steel sheet having a relatively random crystal orientation in which the crystal orientation of the metal crystals is not aligned in a particular direction. Both the grain-oriented electrical steel sheet and the non-oriented electrical steel sheet are materials with saturation magnetostriction lower than those of the FeGa alloys and FeCo alloys, but are capable of generating electricity in an amount comparable to or larger than the conventional magnetostrictive materials. The reason for such phenomena is not clear, but it is presumed as follows.

As described above, the grain-oriented electrical steel sheet has a {110}<100> GOSS texture in which the rolling direction is aligned in <100> direction and the rolled surface is in {110} orientation. The present inventors have newly found that the magnetic flux density of the grain-oriented electrical steel sheet changes greatly when compressive strain is applied while applying bias magnetic field in the <100> direction of the grain-oriented electrical steel sheet. Such phenomenon is understood as follows. When a predetermined magnetic field is applied in the <100> direction of the grain-oriented electrical steel sheet, the proportion of the 180° domain parallel to the <100> direction and the 90° domain changes to a proportion where both domains interact synergistically. As a result, when strain is applied to the grain-oriented electrical steel sheet, conversion from the 180° domain to the 90° domain, or conversion from the 90° domain to the 180° domain is likely to occur. Specifically, when compressive strain is applied in a direction parallel to the direction of magnetization of the 180° domain (i.e., in the <100> direction), the 180° domain decreases and the 90° domain increases; and when tensile strain is applied in the <100> direction, the 90° domain decreases and the 180° domain increases. Further, when compressive strain is applied in perpendicular to the direction of magnetization of the 180° domain (i.e., <100> direction), the 90° domain decreases and 180° domain increases; and when tensile strain is applied in the <100> direction, the 180° domain decreases and the 90° domain increases. Such changes in the magnetic domains alter the magnetization of the grain-oriented electrical steel sheet, and the grain-oriented electrical steel sheet functions as the magnetostrictive part of the magnetostrictive element. In the magnetostrictive power generation device, the above change in the magnetization induces voltage in the detection coil wound around the magnetostrictive element.

Present inventors also found that crystal orientation, such as those seen in the grain-oriented electrical steel sheet, is not present in the non-oriented electrical steel sheet, but a large magnetic flux density change occurs when strain is applied while applying a bias magnetic field. The non-oriented electrical steel sheet has relatively random crystal orientation and, thus, the magnetic domains are smaller than those of the grain-oriented electrical steel sheet. In this situation, when strain is applied to a non-oriented electrical steel sheet, movement of the magnetic domains becomes possible starting from more movable magnetic domains among plurality of magnetic domains, and therefore, a large magnetic flux density change is obtained when the non-oriented electrical steel sheet is used as the magnetostrictive part of the magnetostrictive element.

In the embodiment 1 of the present invention, use of the grain-oriented electrical steel sheet as the magnetostrictive part is preferred because the grain-oriented electrical steel sheet tends to induce a larger change in magnetization than the non-oriented electrical steel sheet.

Specific examples of the grain-oriented electrical steel sheets include, for example, ORIENTCORE, ORIENT- CORE HI-B (e.g., 27ZH100), ORIENTCORE HI-B LS, ORIENTCORE HI-B PM, each manufactured by Nippon Steel Corporation.

Specific examples of the non-oriented electrical steel sheet include, for example, HILITECORE (e.g., 35H210), HOMECORE, each manufactured by Nippon Steel Corporation.

There is no particular limitation on the dimensions of the magnetostrictive part of the magnetostrictive element for power generation of the present invention because the size of the magnetostrictive element for power generation may be different based on the dimensions of the magnetostrictive power generation device comprising the magnetostrictive part. Regarding the dimensions of the magnetostrictive part, the larger are preferred because larger voltage can be obtained by increasing the number of turns of the coil in the power generation device. Although there is no particular limitation on the thickness of the electromagnetic steel sheet forming the magnetostrictive part, it is generally 0.2 mm or more and 0.5 mm or less. When the thickness of the magnetostrictive part is 0.2 mm or more, the change in magnetic flux can be increased and this is advantageous for increasing the generated voltage; and when the thickness of the magnetostrictive part is 0.5 mm or less, this is advantageous for facilitating the design of the rigidity suitable for vibration.

Furthermore, the magnetostrictive element for power generation according to the embodiment 1 of the present invention may have a stress control part formed of an elastic material. When bending strain is applied to a single-sheet of a sheet-shaped magnetostrictive material, the neutral surface is positioned at the center in the thickness direction and it separates the magnetostrictive material into the side with the compressive strain and the other side with the tensile strain. As a result, inside of the magnetostrictive material is placed under a state where the changes in the magnetic flux density are cancelling each other. The voltage induced in the detection coil becomes decreased by this cancellation. In this situation, the concept of laminating a magnetostrictive material with an elastic material to thereby position the neutral surface inside the elastic material have been conventionally known.

The stress control part in the magnetostrictive element of the embodiment 1 of the present invention is a part for controlling the stress to achieve a state where either one of the compressive strain and the tensile strain is applied to the entire magnetostrictive part when bending strain or the like is applied to the magnetostrictive element. There is no particular limitation with respect to the material forming the stress control part, and either a non-magnetic material or a magnetic material can be used.

A non-magnetic material is preferred because when the elastic material forming the stress control part is the non-magnetic material, the magnetic field flows preferentially only into the magnetostrictive part of the magnetostrictive element section (section corresponding to the magnetostrictive element) and the adjustment of the bias magnetic field becomes easy. Furthermore, the present inventors have found that, when bending strain is applied to a magnetostrictive element with a magnetostrictive part formed of a grain-oriented electrical steel sheet and a stress control part formed of a non-magnetic material, there is a larger magnetic flux density change as compared with other combinations. Reason behind this finding is considered as follows. When a magnetic material is used as the elastic material, magnetic interaction occurs between the elastic material and the electrical steel sheet and conversion of the 90° domain and the 180° domain may be hindered; however, when the elastic material is a non-magnetic material, such magnetic interaction does not occur, and the conversion of the 90° domain and the 180° domain of the electrical steel sheet are more likely to occur.

There is no particular limitation with respect to the elastic material for forming the stress control part, and there can be mentioned fiber reinforced plastics (e.g., glass fiber reinforced plastic (GFRP), carbon fiber reinforced plastic (CFRP)), austenitic stainless steel (e.g., SUS304, SUS316, etc.), copper alloys (e.g., brass, phosphor bronze), aluminum alloys (e.g., duralumin), titanium alloys (e.g., Ti-6Al-4V), and the like. Among them, the fiber reinforced plastics and austenitic stainless steels are preferred because these materials have relatively high Young's modulus and are easy to position the neutral surface outside of the magnetostrictive part when bending strain is applied.

Forming the stress control part by a magnetic material which is an elastic material is effective for reducing the cost. When the magnetostrictive part of the magnetostrictive element is either a grain-oriented electrical steel sheet or a non-oriented electrical steel sheet and the elastic material forming the stress control part is a steel sheet which is a magnetic material, application of a bias magnetic field results in the flow of the bias magnetic field into both the magnetostrictive part and the stress control part. However, since the grain-oriented electrical steel sheet or non-oriented electrical steel sheet forming the magnetostrictive part is originally a material with high magnetic permeability, larger amount of the bias magnetic field flows through the magnetostrictive part, and occurrence of magnetic domain change is considered sufficient for power generation. On the other hand, compared to an element having a stress control part formed of a non-magnetic material, the amount of magnetic force applied to the magnetostrictive part decreases by the amount of magnetic flux flowing through the stress control part formed of a magnetic material. To compensate for this decrease in magnetic force, the strength of a magnet provided in the magnetostrictive power generation device can be increased.

There is no particular limitation with respect to the elastic material, which is a magnetic material, forming the stress control part, and there can be mentioned general structural rolled steels (e.g., SS400), general structural carbon steels (e.g., S45C), high tensile strength steels (e.g., HT80), ferritic stainless steels (e.g., SUS430), and martensitic stainless steels (e.g., SUS410).

In the magnetostrictive element having a stress control part, the stress control part forms a laminate with the magnetostrictive part. Such a laminate can be formed by bonding the stress control part and the magnetostrictive part. There is no particular limitation with respect to the method for bonding, but in general, there can be mentioned bonding via an adhesive or an adhesive sheet, brazing material bonding, liquid phase diffusion bonding, and the like.

In the magnetostrictive element of the embodiment 1 of the present invention, the magnetostrictive material forming the magnetostrictive part and the elastic material forming the stress control part preferably satisfies the relationships of the following Equations (1) and (2) simultaneously.

$$Em < Es \tag{1}$$

$$1.1 \le \frac{Es \times ts^2}{Em \times tm^2} \tag{2}$$

(In the Equations, Em is the Young's modulus [GPa] of the magnetostrictive material, tm is the sheet thickness [mm] of the magnetostrictive material, Es is the Young's modulus [GPa] of the elastic material, and ts is the sheet thickness [mm] of the elastic material.)

For example, each of the above-mentioned PTLs 1 to 6 describes an invention which uses a combination of a magnetostrictive material and another material in place of the magnetostrictive material alone for forming the magnetostrictive element, to thereby improve the power generation performance of the magnetostrictive element. In particular, each of PTLs 1 to 4 describes a method of laminating a magnetostrictive material and another material using an adhesive or the like. Such lamination of a magnetostrictive material with another material enables the increase of voltage by moving the neutral surface at the time of application of the bending strain to the magnetostrictive material to the outside of the magnetostrictive material. However, uniformly bonding the entire surface of the magnetostrictive material with another material is difficult, and it was found that the non-uniform bonding results in variations in the position of the neutral surface at the time of application of the bending strain to the magnetostrictive power generating element. This phenomenon is noticeable when an insert material, such as an adhesive, is present between the magnetostrictive material and another material. Further, the power generation voltage of the power generation device containing such power generation element was also found to vary as a result of the variations in the neutral surface.

The present inventors have found that, in the magnetostrictive power generation device using a magnetostrictive element in which the magnetostrictive material and the elastic material are bonded together using an insert material (such as an adhesive), a more uniform strain can be applied to the magnetostrictive part when the Young's modulus Em and sheet thickness tm of the magnetostrictive material, and the Young's modulus Es and sheet thickness ts of the elastic material simultaneously satisfy the relationships of the above Equations (1) and (2). Such effect is considered to result from the neutral surface being located far away from the magnetostrictive part. Furthermore, transmission of stress from the elastic material to the magnetostrictive material is considered to be less susceptible to the variations in the thickness of the adhesive, and this leads to less difference in the generated voltage.

The Young's modulus of each of the magnetostrictive material and elastic material can be measured by tensile test, resonance method, ultrasonic pulse method, and the like. With respect to the above Equation (2), stress-strain curve was measured by tensile test (JIS Z2241), and a value obtained from the slope of the elastic area was used for calculation.

With respect to the relationships shown by the above Equations (1) and (2), the sheet thickness of each of the magnetostrictive material and the elastic material is a value measured by a commercially available micrometer, and a micrometer with a tip having a planar shape was used for the measurement.

Equation (1) shows that the Young's modulus Em of the magnetostrictive material is smaller than the Young's modulus Es of the elastic material. Satisfaction of the relationship of Equation (1) enables the reduction of the thickness of the elastic material, and instead, enables the increase of the number of turns of the detection coil. As a result, power generation performance can be improved.

Equation (2) represents the relationship between the Young's modulus Es and the sheet thickness ts of the magnetostrictive material and the Young's modulus Em and the sheet thickness tm of the elastic material. When the value obtained by the equation at the right side of Equation (2) is 1.1 or more, the neutral surface at the time of application of a bending strain to the magnetostrictive part can be constantly positioned in the elastic material even when the bond between the magnetostrictive material forming the magnetostrictive part and the elastic material forming the stress control part is not uniform over the entire surface and an insert material is present between the magnetostrictive part and the elastic material. As a result, it becomes possible to achieve a state where either one of the compressive strain and the tensile strain is applied to the entire magnetostrictive part, and also to reduce the variations in power generation performance. Details of the mechanism are not clear, but it is considered as follows.

By using the concept of material mechanics, the present inventors have studied the position of the neutral surface while applying a bending strain to the laminate of the magnetostrictive material and the elastic material, and derived the following relational equation.

$$Es \times ts^2 > Em \times tm^2$$

(In the equation, Em is the Young's modulus [GPa] of the magnetostrictive material, tm is the sheet thickness [mm] of the magnetostrictive material, Es is the Young's modulus [GPa] of the elastic material, ts is the sheet thickness [mm] of the elastic material.)

When the magnetostrictive element satisfies the above relationship, the neutral surface exists in the elastic material. Therefore, when a bending strain is applied to the magnetostrictive element, either one of the compressive strain and the tensile strain can be applied to the entire magnetostrictive material, and variations of power generation performance can be reduced.

However, the above result is satisfied only by an ideal bonding, that is, a case where the magnetostrictive material and the elastic material are uniformly bonded over the entire surface, and an insert material (such as an adhesive) is not present inbetween the magnetostrictive material and the elastic material. In practice, uniform bonding of the magnetostrictive material and the elastic material over the entire surface is difficult because the bonding is non-uniform and, thus, there is variations in power generation performance even when the above relational equation is satisfied. Such phenomenon is especially noted when an adhesive or the like is used for lamination and an insert material exists between the magnetostrictive material and the elastic material.

In view of such a situation, as a result of intensive study, the present inventors have found that the unevenness in power generation performance is drastically reduced when the value obtained by the following Equation (2-1) for the magnetostrictive material and the elastic material used in the magnetostrictive element is 1.1 or more.

$$\frac{Es \times ts^2}{Em \times tm^2} \tag{2-1}$$

(In the equation, Em is the Young's modulus [GPa] of the magnetostrictive material, tm is the sheet thickness [mm] of the magnetostrictive material, Es is the Young's modulus [GPa] of the elastic material, ts is the sheet thickness [mm] of the elastic material.)

When the value obtained by the above Equation (2-1) is 1.1 or more, the variations in power generation performance decreases drastically. The value determined by the above Equation (2-1) is preferably 1.1 or more, more preferably 2.8 or more. Such preference is considered to result from the fact that, as the value obtained by the above Equation (2-1) is increased, position of the neutral surface is more apart from the magnetostrictive part, and the magnetostrictive part is under a state where more uniform strain is applied thereto.

Further, when the value obtained by the Equation (2-1) is 1.1 or more, the difference in voltage can be reduced even when the bonding part between the magnetostrictive material and the elastic material is uneven (for example, even when the thickness of the insert material, such as an adhesive, is uneven). When the value obtained by Equation (2-1) is less than 1.1, the neutral surface is located near the boundary between the magnetostrictive material and the elastic material, and the transmission of stress from the elastic material to the magnetostrictive material is considered to be greatly affected by the non-uniform bonding part (for example, variations in the thickness of the adhesive used for bonding). However, when the value obtained by Equation (2-1) becomes 1.1 or more, the transition of stress from the elastic material to the magnetostrictive material is considered to be less affected by the non-uniform bonding part and, as a result, difference in generated voltage becomes reduced.

Further, the value obtained by Equation (2-1) is preferably 100 or less, more preferably 50 or less, and still more preferably 30 or less. The value of Equation (2-1) being 100 or less is advantageous for reducing the suppression of vibration by the stress control part.

There is no particular limitation on the Young's modulus Em of the magnetostrictive material as long as the relationships of the Equations (1) and (2) are satisfied simultaneously. In general, the Young's modulus Em of the magnetostrictive material is 70 GPa or more and 200 GPa or less, preferably 70 GPa or more and 170 GPa or less.

There is no particular limitation on the Young's modulus Es of the elastic material as long as the relationships of the Equations (1) and (2) are satisfied simultaneously. In general, the Young's modulus Es of the elastic material is 100 GPa or more and 700 GPa or less, and preferably 190 GPa or more and 550 GPa or less.

There is no particular limitation on the on the sheet thickness of the magnetostrictive material as long as the relationship of the above Equation (2) is satisfied. In general, the thickness is 0.2 mm or more and 0.5 mm or less. The sheet thickness of the magnetostrictive material being 0.2 mm or more is advantageous for increasing the change in magnetic flux, thereby increasing the generated voltage; and the sheet thickness being 0.5 mm or less is advantageous for facilitating a design of rigidity suitable for vibration.

There is no particular limitation on the sheet thickness of the elastic material as long as the relationship of the above Equation (2) is satisfied. In general, the thickness is 0.1 mm or more and 2.0 mm or less, preferably 0.2 mm or more and 1.0 mm or less, and more preferably 0.2 mm or more and 0.5 mm or less. The sheet thickness of the elastic material being 0.1 mm or more is advantageous for applying only one of the compressive stress or tensile stress to the entire magnetostrictive part; and the thickness being 2.0 mm or less enables suppression of the prevention of vibration of the magnetostrictive element. Further, reduction of the sheet thickness of the elastic material enables the increase in number of turns of the detection coil and, thus, improvement in the power generation performance becomes possible.

There is no particular limitation with respect to the dimensions of the stress control part, but from the viewpoint of applying either one of the compressive stress and the tensile stress to the entire magnetostrictive part, the dimensions of the stress control part are preferably the same as or larger than the dimensions of the magnetostrictive part. There is also no particular limitation with respect to the thickness of the elastic material forming the stress control part, but is generally 0.1 mm or more and 2.0 mm or less, preferably 0.2 mm or more and 1.0 mm or less, more preferably 0.2 mm or more and 0.5 mm or less. The thickness of the stress control part being 0.1 mm or more is advantageous for applying either one of the compressive stress and the tensile stress to the entire magnetostrictive part, and the thickness being 2.0 mm or less is advantageous for suppressing the prevention of the vibration of the magnetostrictive element.

Magnetic flux density change $\Delta B$ caused by the application of an external stress to the magnetostrictive element can be used as an index for evaluating the performance of the magnetostrictive element. $\Delta B$ (unit: mT or T) can be obtained by the following method.

A magnetostrictive element having cross-sectional area S is inserted into a coil with winding number N, and external stress is applied thereto. In this instance, when the magnetic flux density change $\Delta B$ occurs during time $\Delta t$, voltage of $V=-N(S \cdot \Delta B / \Delta t)$ is generated in the coil. Therefore, $\Delta B$ can be determined as a time integral value of the voltage signal generated in the coil. The performance index of the magnetostrictive vibration power generation element can be evaluated as the total voltage generated during $\Delta t$. That is, the performance can be evaluated as the magnetic flux density change $\Delta B$ which is a time integral value of the voltage. The measurement of $\Delta B$ can be made by connecting the voltage generated in the coil to a flux meter. The detailed measurement method and the measurement device of $\Delta B$ (unit: mT or T) will be described in the following Examples.

2. Magnetostrictive Power Generation Device

A embodiment 2 of the present invention relates to a magnetostrictive power generation device equipped with a magnetostrictive element for power generation which includes a magnetostrictive part formed of an electrical steel sheet.

With respect to the magnetostrictive power generation device of the embodiment 2 of the present invention, there is not particularly limitation to the structure of the device as long as a material forming the magnetostrictive part included in the magnetostrictive element is an electrical steel sheet. Therefore, the structure of the device can be the same as that of a power generator using a conventional magnetostrictive material (a FeGa alloy, a FeCo alloy, a FeAl alloy, etc.) as the magnetostrictive part and using the reverse magnetostrictive effect.

The magnetostrictive element for power generation equipped in the magnetostrictive power generation device of the embodiment 2 of the present invention is preferably the magnetostrictive element for power generation of the present invention described above. Therefore, the type and dimensions of the electromagnetic steel sheet forming the magnetostrictive part, the type and dimensions of the elastic material forming the stress control part, and the like are as described above.

Furthermore, the magnetostrictive power generating device of the embodiment 2 of the present invention (hereinafter, frequently abbreviated as "power generating device") preferably has a frame. In the present invention, the "frame" of the magnetostrictive power generation device is a part which is bonded to each of the magnetostrictive element, an anchor, and a magnet, and which constitute the main body of the magnetostrictive power generation device.

Figure 3:
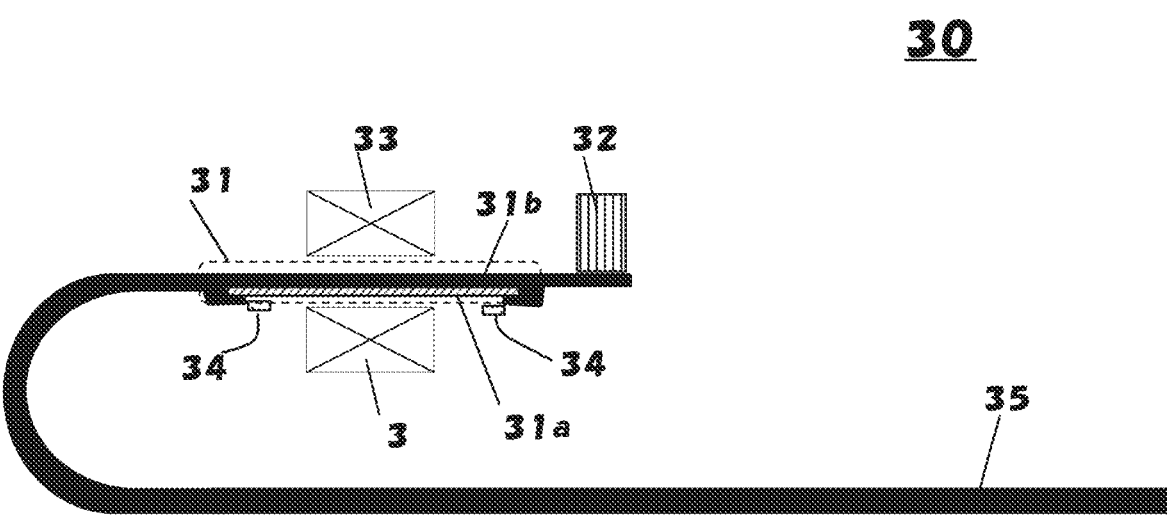
FIG. 3 is a schematic diagram showing the structure of a magnetostrictive vibration apparatus for evaluating a magnetostrictive element which is used in the Examples.

As an example of the magnetostrictive power generation device of the embodiment 2 of the present invention, there can be mentioned the device shown in FIG. 3. In this device, the magnetostrictive element has a magnetostrictive part and a stress control part. A coil is wound around the magnetostrictive element and the device further includes a magnet, a frame (support), and an anchor attached to the frame. In such device, magnetic line of the magnet passes through the magnetostrictive element and applies a bias magnetic field to the magnetostrictive part. The vibration of the anchor causes the frame to vibrate and applies a tensile force and a compressive force to the magnetostrictive element. In this instance, the direction of the strain applied to the magnetostrictive part and the direction of the bias magnetic field applied to the magnetostrictive part are in a parallel relationship, and by changing the magnetization of the magnetostrictive element by the reverse magnetostrictive effect, induced current (or induced voltage) can be generated in the coil.

There can be also mentioned a power generation device that applies uniaxial strain to the magnetostrictive part. In such the device, a coil is wound around the magnetostrictive element, and the apparatus includes a magnet, a frame, and a clamping tool clamping the magnetostrictive element from both sides. Like the measurement unit shown in FIG. 2, this apparatus is capable of applying uniaxial strain to the magnetostrictive element by either compressing or pulling the magnetostrictive element by the clamping tool, thereby changing the magnetization of the magnetostrictive element by the reverse magnetostrictive effect, and generating induced current (or induced voltage) in the coil. As the magnetostrictive element used in such an apparatus, a magnetostrictive element consisting of only the magnetostrictive part (i.e., not including the stress control part) is preferred. Although a magnetostrictive element including a magnetostrictive part and a stress control part can also be used, extra force is required to also cause the warpage of the stress control part during the application of the uniaxial strain.

Further, when the power generating device is equipped with a magnetostrictive element having a magnetostrictive part formed of an electromagnetic steel sheet and a stress control part formed of an elastic material, more preferred is a power generating device further equipped with a frame continuous with the magnetostrictive element for power generation, in which at least a part of the frame is composed of a laminate containing the electrical steel sheet extending from the magnetostrictive part and the elastic material extending from the stress control part. This means that at least a part of the frame (part close to the coil, but without winding of the coil) adjacent to the magnetostrictive element is formed integrally with the magnetostrictive element, and the whole of the frame is not necessarily formed integrally with the magnetostrictive element.

In such an integrally formed frame, from each end of the magnetostrictive element, there is a region (protruding from the coil) which is composed of a laminate containing an electromagnetic steel sheet extending from the magnetostrictive part and an elastic material extending from the stress control part. The length of this region is not less than 50% of the length equivalent to the coil length, preferably not less than the length equivalent to the coil length. In such a magnetostrictive power generation device, since the junction between the magnetostrictive element for power generation and the frame is not present inside the magnetostrictive element or in the vicinity of the magnetostrictive element, stress concentration at the junction is less likely to occur during the application of continuous bending strain to the magnetostrictive element for power generation. Accordingly, the durability of the device becomes improved. Further, the laminate containing the electromagnetic steel sheet and elastic material extending from the magnetostrictive element is preferably extending to the position where the anchor for applying the bending strain to the magnetostrictive part is being bonded. Such configuration is preferred because the bending strain caused by the vibration of the anchor is transmitted efficiently to the magnetostrictive element section.

The part of the frame composed of the laminate containing the electrical steel sheet extending from the magnetostrictive part and the elastic material extending from the stress control part is preferably 20% or more, more preferably 40% or more of the total length of the frame. When more than 20% of the total length of the frame is composed of the laminate, the adhesive surface between the magnetostrictive part formed of an electromagnetic steel sheet and the stress control part formed of an elastic material can be widened. As a result, continuity in the member constituting the magnetic circuit becomes increased, and the adjustment of the bias magnetic field by the magnet becomes easy due to reduction in magnetic gap generation, and the voltage becomes stabilized.

When only a part of the frame is composed of a laminate containing the electrical steel sheet extending from the magnetostrictive part and the elastic material extending from the stress control part, there is no particular limitation with respect to the material constituting the remaining part of the frame. The frame can be completed by bonding other steel sheet, elastic material or the like. However, from the viewpoint of durability and ease of manufacturing the device, an entire frame formed integrally with the electromagnetic steel sheet extending from the magnetostrictive part and/or the elastic material extending from the stress control part is preferred. Specifically, preferred is a configuration in which the electrical steel sheet forming the magnetostrictive part exists in the part corresponding to the magnetostrictive element and in the entire frame, and the elastic material forming the stress control part exists in a part of the frame and in the part corresponding to the magnetostrictive element; or a configuration in which the elastic material forming the stress control part exists in the part corresponding to the magnetostrictive element and in the entire frame, and the electrical steel sheet forming the magnetostrictive part exists in a part of the frame and in the part corresponding to the magnetostrictive element. In such a configuration where the electromagnetic steel sheet or elastic material constituting the magnetostrictive element extends throughout the entire frame, both the magnetostrictive element and the frame can be manufactured by producing a laminate containing the electrical steel sheet and the elastic material. Therefore, the manufacturing process can be simplified. Such a configuration is especially preferred because, when at least a portion of the electromagnetic steel sheet and the elastic material constituting the magnetostrictive element are extended to the fixation part for fixing the magnetostrictive power generation device to the vibration source or the like, the vibration from the vibration source or the like can be transmitted efficiently to the magnetostrictive element section.

Further, the entire frame may be composed of a laminate including an electromagnetic steel sheet extending from the magnetostrictive part and an elastic material extending from the stress control part. In such a configuration, the laminate containing the electromagnetic steel sheet and the elastic material continuously forms both the magnetostrictive element and the frame, and there is absolutely no joint portion between the magnetostrictive element and the frame. Therefore, this configuration is preferred in view of durability. In addition, since the continuity in the member constituting the magnetic circuit increases, generation of magnetic gap becomes reduced and enables easy adjustment of the bias magnetic field by the magnet, thereby further stabilizing the voltage.

There is no particular limitation with respect to the dimensions of the frame including the magnetostrictive element, but in general, the length of the frame including the magnetostrictive element is 30 mm or more and 700 mm or less, preferably 60 mm or more and 500 mm or less, more preferably 120 mm or more and 300 mm or less. The width of a typical frame is 4 mm or more and 70 mm or less, preferably 6 mm or more and 50 mm or less, more preferably 8 mm or more and 30 mm or less. The dimensions of the frame may be reflected in the design according to the magnitude of electrical power required for operating the equipment.

There is no particular limitation with respect to the shape of the frame, and the frame may have a sheet shape or a shape having at least one bent portion, such as a channel shape, a U shape, a U shape, or a V shape. In the embodiment 2 of the present invention, since the electromagnetic steel sheet having high toughness is used in the magnetostrictive part, not only a sheet-shaped frame, but also a U-shaped frame and the like with a bent portion can be produced by the magnetostrictive material forming the magnetostrictive part.

When the frame has a shape with at least one bent portion (e.g., U-shape), the frame and the magnetostrictive element may take a configuration where the electrical steel sheet is positioned at an inner side of the device and the elastic material is positioned at an outer side of the device, or a configuration where the elastic material is positioned at an inner side of the device and the electrical steel sheet is positioned at an outer side of the device. For example, in a U-shaped frame, when the electromagnetic steel sheet is positioned at an inner side of the device and the elastic material is positioned at an outer side of the device, the magnet can be positioned directly on the electrical steel sheet (i.e., magnetostrictive material). As a result, the magnetic gap becomes reduced, and the adjustment of the bias magnetic field becomes easy.

Further, in a device equipped with a fame having a shape with at least one bent portion, such as a U-shape, during the vibration of the anchor, a large stress may be applied to the U-shaped bent portion. At this portion, compressive stress is applied to the material positioned at the inner side of the U-shaped bent portion and a force acts to peel off the material positioned at the inner side from the material positioned at the outer side. In a configuration where the electromagnetic steel sheet is positioned at the outer side of the device and the elastic material is positioned at the inner side of the device, a relatively tough elastic material can be used for the stress control part, and occurrence of the peeling off of the elastic material from the electrical steel sheet can be prevented by the inner stress control part receiving the compressive stress. Further, in the device having such a configuration, when the magnetic flux density is increased by the magnetostriction effect caused by the tensile strain acting on the electromagnetic steel sheet, the electrical steel sheet is brought closer to the magnet, and, as a result, the magnetic flux density of the electrical steel sheet changes in increasing manner. The power generation output increases because magnetic flux density change by the magnetic field of the magnet is added to the magnetic flux density change by magnetostriction.

With respect to the dimensions of the magnetostrictive element for power generation in the magnetostrictive power generation device of the embodiment 2 of the present invention, larger voltage can be obtained by using larger magnetostrictive element and increasing the number of turns of the coil in the power generation device. Therefore, there is no particular limitations with respect to the dimensions (the length of the region for winding the coil) of the magnetostrictive element, but in general, the length is 5 mm or more and 150 mm or less, preferably 10 mm or more and 100 mm or less, more preferably 20 mm or more and 70 mm or less.

There is no particular limitation with respect to the thickness of the electromagnetic steel sheet forming the magnetostrictive part of the magnetostrictive element and the thickness of the frame, but in general, the thickness is 0.2 mm or more and 0.5 mm or less. The magnetostrictive part with thickness of 0.2 mm or more is capable of increasing the change in the magnetic flux and is, thus, advantageous for increasing the generated voltage, and the thickness of 0.5 mm or less is advantageous for facilitating the design of rigidity suitable for vibration. The thickness of the electrical steel sheet in the magnetostrictive part of the magnetostrictive element and that in the laminate constituting the frame may be the same or different.

There is no particular limitation with respect to the thickness of the elastic material forming the stress control part of the magnetostrictive element and the thickness of the frame, but in general, the thickness is 0.1 mm or more and 2.0 mm or less, preferably 0.2 mm or more and 1.0 mm or less, more preferably 0.2 mm or more and 0.5 mm or less. The stress control part with a thickness of 0.1 mm or more is advantageous for applying either one of the compression stress and tensile stress to the entire magnetostrictive part, and the thickness of 2.0 mm or less is advantageous for suppressing the prevention of the vibration of the magnetostrictive element. The thickness of the elastic material in the magnetostrictive part of the magnetostrictive element and that in the laminate constituting the frame may be the same or different.

There is no particular limitation with respect to the other configuration of the magnetostrictive power generation device of the embodiment 2 of the present invention, and the device can be configured similarly to the conventional magnetostrictive power generation device. Specifically, in the device, a coil is wound around the magnetostrictive element and the device further includes a magnet, a frame (support), and an anchor attached to the frame. In such device, magnetic line of the magnet passes through the magnetostrictive element and applies a bias magnetic field to the magnetostrictive part. The vibration of the anchor causes the frame to vibrate and applies a tensile force and a compressive force to the magnetostrictive element. In this instance, the direction of the strain applied to the magnetostrictive part and the direction of the bias magnetic field applied to the magnetostrictive part are in a parallel relationship, and by changing the magnetization of the magnetostrictive element by the reverse magnetostrictive effect, induced current (or induced voltage) can be generated in the coil.

When the magnetostrictive part is formed of a grain-oriented electrical steel sheet, applying the bias magnetic field in <100> direction of the grain-oriented electrical steel sheet is preferred for obtaining a larger voltage.

In the magnetostrictive power generation device, a permanent magnet is preferably used for the bias magnetic field generation. Permanent magnet can be miniaturized and control of its bias magnetic field is easy. Further, as the permanent magnet, NdFeB magnet capable of generating a larger bias magnetic field is preferred.

Next, the basic configurations of the magnetostrictive power generating device of the embodiment 2 of the present invention will be described with reference to the devices produced in the Examples and shown in the drawings, but the device of the embodiment 2 of the present invention is not limited to such devices. Each of FIGS. 6 to 10, 12 and 13 illustrates a device in which the electromagnetic steel sheet is positioned at the inner side and the elastic material is positioned at the outer side of the frame having a bent portion, and each of FIGS. 15 to 24 illustrates a device in which the elastic material is positioned at the inner side and the electromagnetic steel sheet is positioned at the outer side of the frame having a bent portion.

Figure 6:
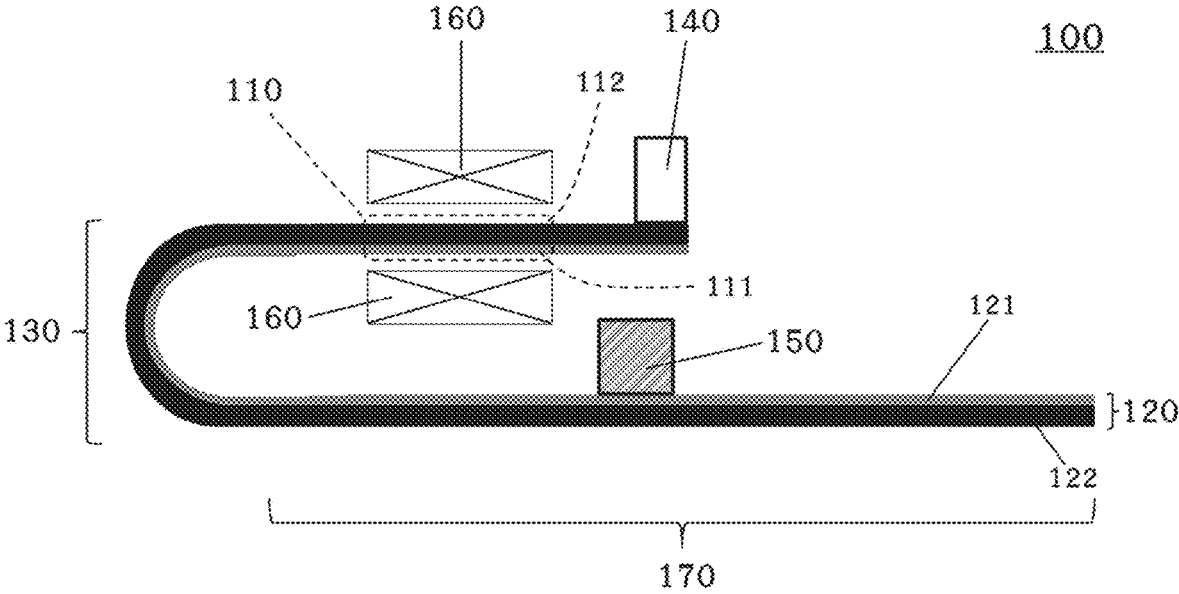
FIG. 6 is a schematic diagram showing the structure of the magnetostrictive power generation device of the present invention.

FIG. 6 is a schematic diagram of magnetostrictive power generation device 100 in which the entire U-shaped frame is formed integrally with the magnetostrictive element. In magnetostrictive power generation device 100, magneto-strictive element 110 has magnetostrictive part 111 and stress control part 112, and detection coil 160 is loaded around the element. In this device, electrical steel sheet 121 in laminate 120 constituting frame 130 is positioned at the inner side of the device and elastic material 122 is positioned at the outer side of the device (in magnetostrictive element 110, magnetostrictive part 111 is positioned at the inner side and stress control part 112 is positioned at the outer side). The thickness of electrical steel sheet 121 and the thickness of elastic material 122 are the same as that of magnetostric-tive part 111 and that of stress control part 112, respectively. Further, the device has anchor 140 for applying a bending strain to the magnetostrictive part and magnet 150 for applying a bias magnetic field, and the device can be fixed on a vibration source at fixation part 170.

The magnetostrictive power generating device can be fixed using an adhesive or a bolt. When a bolt is used for fixation, for example, a hole for bolting may be provided in the area at the right of magnet 150 and the device may be fixed on the vibration source with a bolt. (The same applies to the devices of other configurations.)

Figure 7:
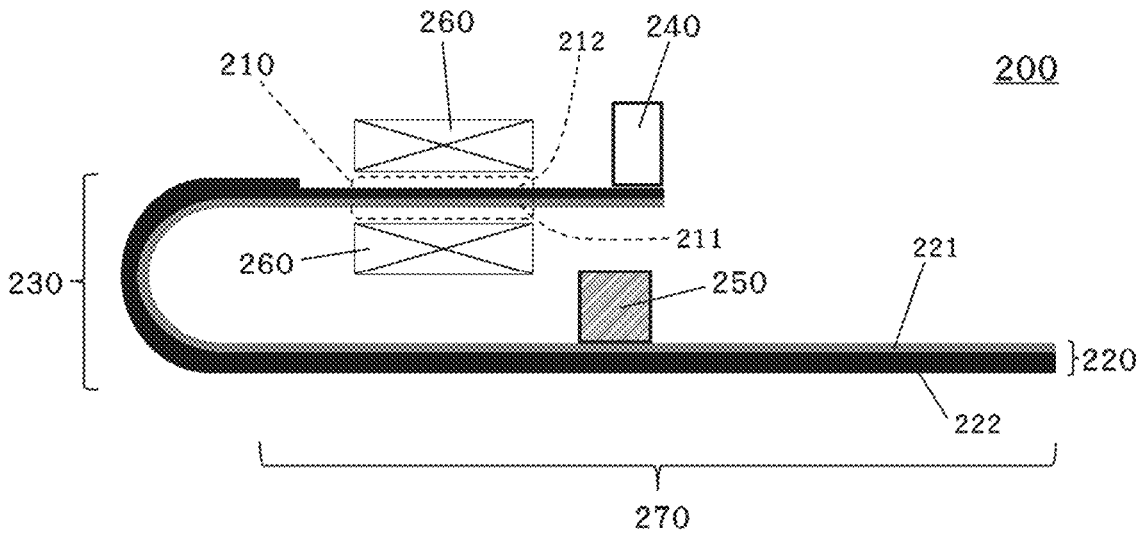
FIG. 7 is another schematic diagram showing the structure of the magnetostrictive power generation device of the present invention.

FIG. 7 is a schematic diagram of magnetostrictive power generation device 200 in which the entire U-shaped frame is formed integrally with the magnetostrictive element. In magnetostrictive power generation device 200, magneto-strictive element 210 has magnetostrictive part 211 and stress control part 212, and detection coil 260 is loaded around the element. In this device, electrical steel sheet 221 in laminate 220 constituting frame 230 is positioned at the inner side of the device and elastic material 222 is positioned at the outer side of the device (in magnetostrictive element 210, magnetostrictive part 211 is positioned at the inner side and stress control part 212 is positioned at the outer side). Further, the thickness of electromagnetic steel sheet 221 is the same as that of magnetostrictive part 211, but the thickness of stress control part 212 is made thinner than the thickness of elastic material 222 in laminate 220, thereby facilitating the vibration of the magnetostrictive element. Device 200 further includes anchor 240 for applying a bending strain to the magnetostrictive part and magnet 250 for applying a bias magnetic field, and the device can be fixed on a vibration source at fixation part 270.

Figure 8:
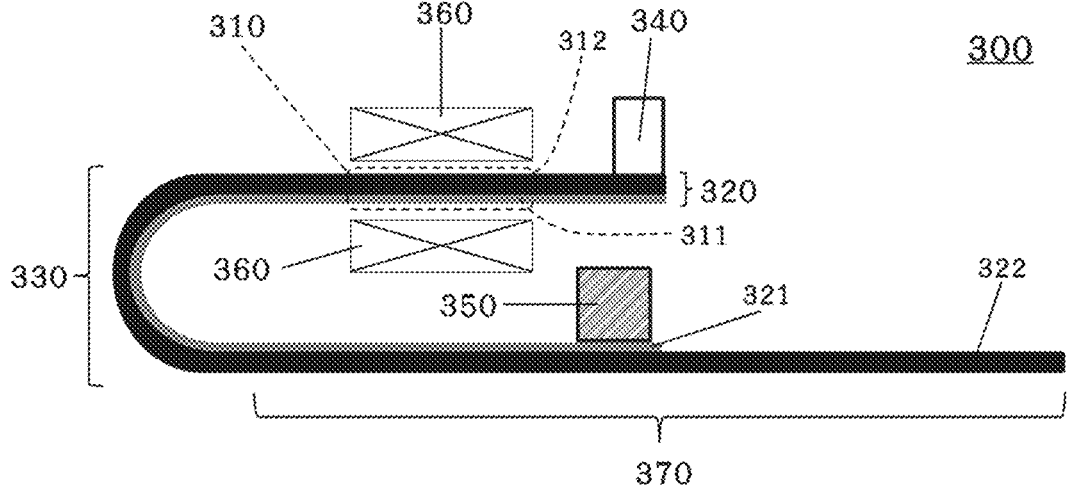
FIG. 8 is still another schematic diagram showing the structure of the magnetostrictive power generation device of the present invention.

FIG. 8 is a schematic diagram of magnetostrictive power generation device 300 in which the entire U-shaped frame is formed integrally with an elastic material extending from the stress control part. In magnetostrictive power generation device 300, magnetostrictive element 310 has magnetostric-tive part 311 and stress control part 312, and detection coil 360 is loaded around the element. In this device, whole of frame 330 is formed integrally with elastic material 322 extending from stress control part 312, and a part (about 70%) of the frame is made of laminate 320 containing electrical steel sheet 321 and elastic material 322. In the part composed of laminate 320, electrical steel sheet 321 is positioned at the inner side of the device and elastic material 322 is positioned at the outer side of the device (in magne-tostrictive element 310, magnetostrictive part 311 is posi-tioned at the inner side and stress control part 312 is positioned at the outer side). Device 300 further includes anchor 340 for applying a bending strain to the magneto-strictive part and magnet 350 for applying a bias magnetic field, and the device can be fixed on a vibration source at fixation part 370.

Figure 9:
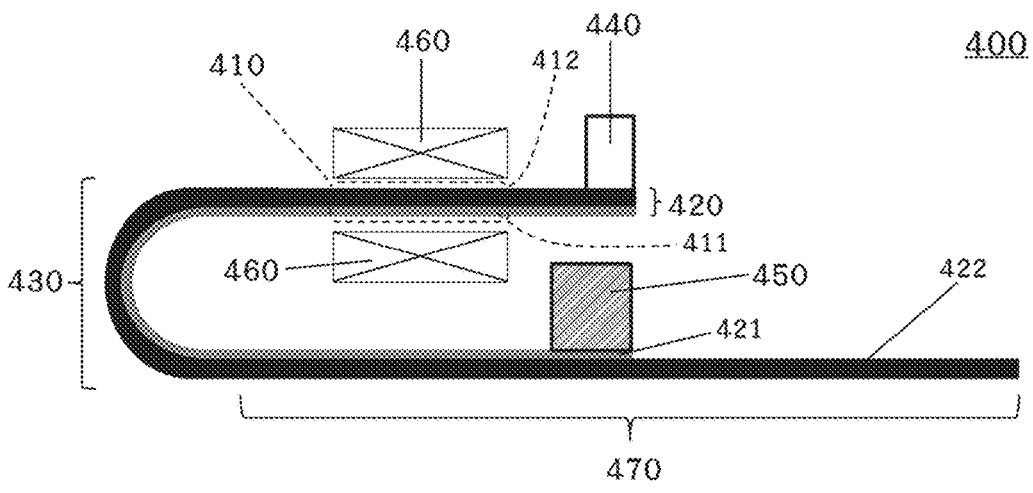
FIG. 9 is still another schematic diagram showing the structure of the magnetostrictive power generation device of the present invention.

FIG. 9 is a schematic diagram of magnetostrictive power generation device 400 in which the entire U-shaped frame is integrally formed with an elastic material extending from the stress control part. In magnetostrictive power generation device 400, magnetostrictive element 410 has magnetostric-tive part 411 and stress control part 412, and detection coil 460 is loaded around the element. Whole of frame 430 is formed integrally with elastic material 422 extending from stress control part 412, and a part (about 70%) of the frame is made of laminate 420 containing electrical steel sheet 421 and elastic material 422. In the part composed of laminate 420, electrical steel sheet 421 is positioned at the inner side of the device and elastic material 422 is positioned at the outer side of the device (in magnetostrictive element 410, magnetostrictive part 411 is positioned at the inner side and stress control part 412 is positioned at the outer side). Device 400 further includes anchor 440 for applying a bending strain to the magnetostrictive part and magnet 450 for applying a bias magnetic field, and the device can be fixed on a vibration source at fixation part 470. In this device, a large magnet is used as magnet 450 because elastic material 422 forming stress control part 412 is a magnetic material, and magnetic field flows into not only magnetostrictive part 411, but also the stress control part which is a magnetic material.

Figure 10:
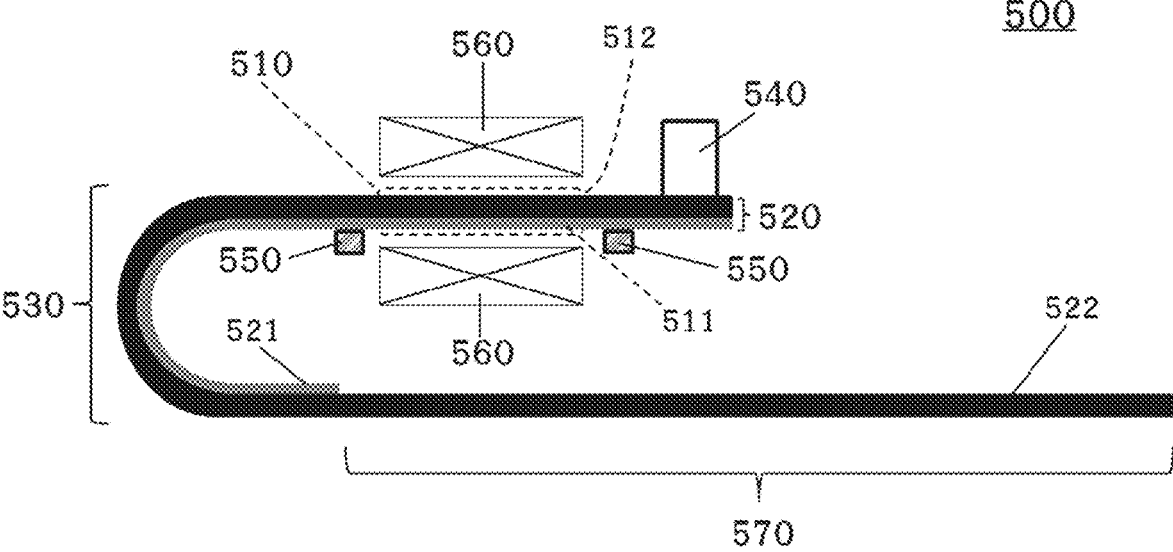
FIG. 10 is still another schematic diagram showing the structure of the magnetostrictive power generation device of the present invention.

FIG. 10 is a schematic diagram of magnetostrictive power generation device 500 in which the entire U-shaped frame is formed integrally with an elastic material extending from the stress control part. In magnetostrictive power generation device 500, magnetostrictive element 510 has magnetostric-tive part 511 and stress control part 512, and detection coil 560 is loaded around the element. Whole of frame 530 is formed integrally with elastic material 522 extending from stress control part 512, and a part (about 50%) of the frame is made of laminate 520 containing electrical steel sheet 521 and elastic material 522. In the part composed of laminate 520, electrical steel sheet 521 is positioned at the inner side of the device and elastic material 522 is positioned at the outer side of the device (in magnetostrictive element 510, magnetostrictive part 511 is positioned at the inner side and stress control part 512 is positioned at the outer side). Device 500 further includes anchor 540 for applying a bending strain to the magnetostrictive part and magnet 550 for applying a bias magnetic field, and the device can be fixed on a vibration source at fixation part 570. In this device, two small magnets are used as magnet 550 because the region composed of laminate 520 is shorter than that of the corresponding region of the device shown in FIG. 8.

Figure 11:
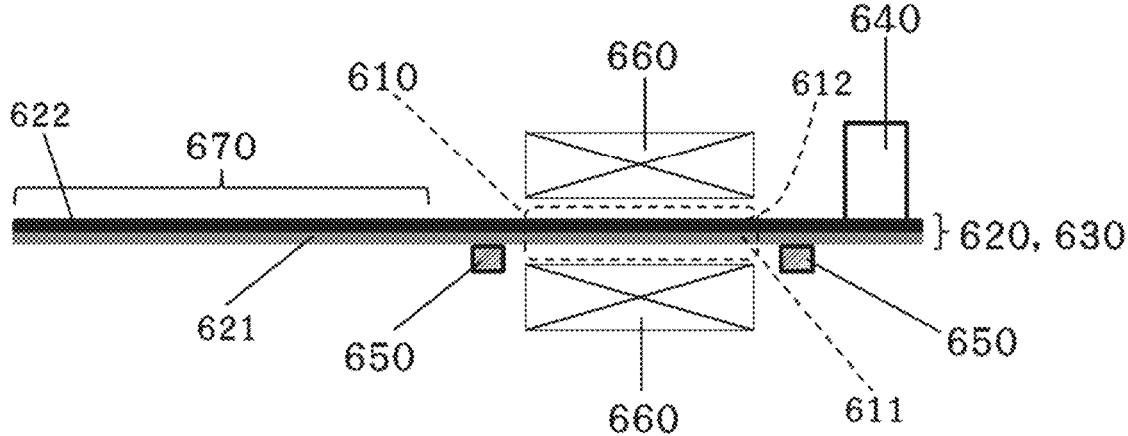
FIG. 11 is still another schematic diagram showing the structure of the magnetostrictive power generation device of the present invention.

FIG. 11 is a schematic diagram of magnetostrictive power generation device 600 in which the entire sheet-shaped frame is formed integrally with the magnetostrictive element. In magnetostrictive power generation device 600, magnetostrictive element 610 has magnetostrictive part 611 and stress control part 612, and detection coil 660 is loaded around the element. In this device, frame 630 is made of laminate 620 containing electrical steel sheet 621 and elastic material 622. Device 600 further includes anchor 640 for applying a bending strain to the magnetostrictive part and magnet 650 for applying a bias magnetic field, and the device can be fixed on a vibration source at fixation part 670.

Figure 12:
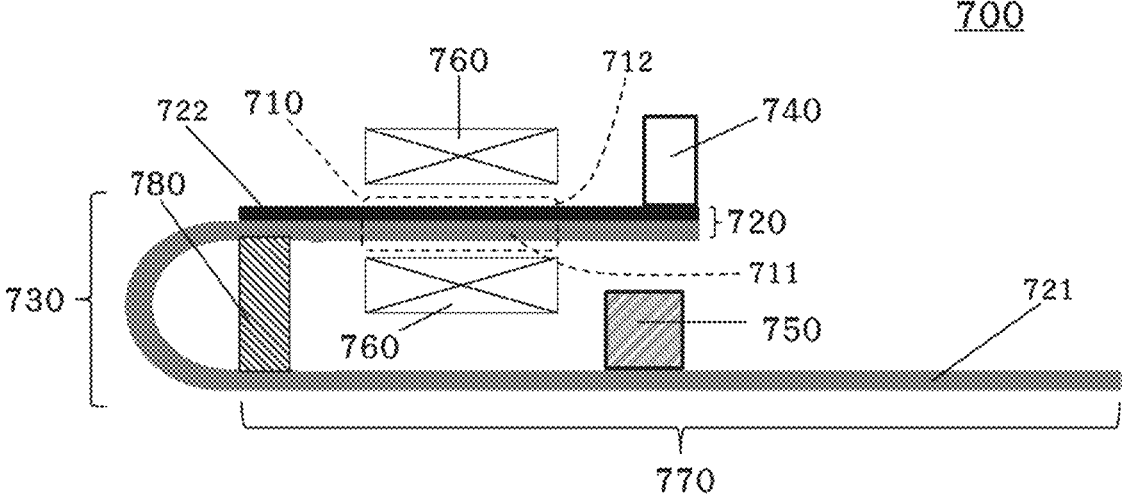
FIG. 12 is still another schematic diagram showing the structure of the magnetostrictive power generation device of the present invention.

FIG. 12 is a schematic diagram of magnetostrictive power generation device 700 in which the entire U-shaped frame is formed integrally with an electrical steel sheet extending from the magnetostrictive part. In magnetostrictive power generation device 700, magnetostrictive element 710 has magnetostrictive part 711 and stress control part 712, and detection coil 760 is loaded around the element. Whole of frame 730 is formed integrally with electrical steel sheet 721 extending from magnetostrictive part 711, and a part (about 27%) of the frame is made of laminate 720 containing electrical steel sheet 721 and elastic material 722. In the part composed of laminate 720, electrical steel sheet 721 is positioned at the inner side of the device and elastic material 722 is positioned at the outer side of the device (in magnetostrictive element 710, magnetostrictive part 711 is positioned at the inner side and stress control part 712 is positioned at the outer side). Device 700 further includes anchor 740 for applying a bending strain to the magnetostrictive part and magnet 750 for applying a bias magnetic field, and the device can be fixed on a vibration source at fixation part 770. For facilitating the vibration of the magnetostrictive element in the detection coil, this device has a structure in which elastic material 722 is shortened and pillar 780 is provided inside the U-shaped portion.

Figure 13:
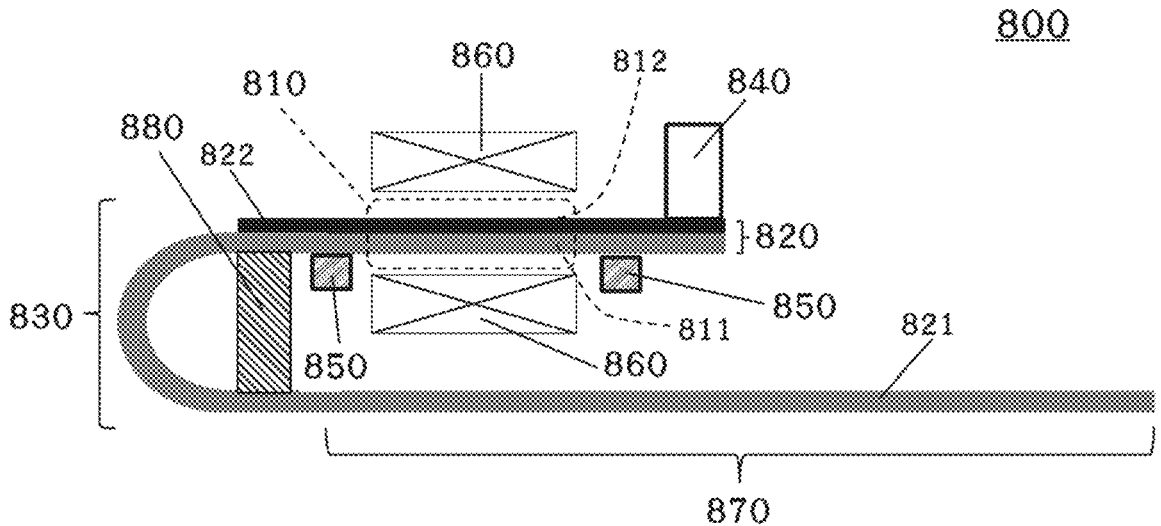
FIG. 13 is still another schematic diagram showing the structure of the magnetostrictive power generation device of the present invention.

FIG. 13 is a schematic diagram of magnetostrictive power generation device 800 in which the entire U-shaped frame is formed integrally with an electrical steel sheet extending from the magnetostrictive part. In magnetostrictive power generation device 800, magnetostrictive element 810 has magnetostrictive part 811 and stress control part 812, and detection coil 860 is loaded around the element. Whole of frame 830 is formed integrally with electrical steel sheet 821 extending from magnetostrictive part 811, and only a part of the frame is made of laminate 820 containing electrical steel sheet 821 and elastic material 822. In the part composed of laminate 820, electrical steel sheet 821 is positioned at the inner side of the device and elastic material 822 is positioned at the outer side of the device (in magnetostrictive element 810, magnetostrictive part 811 is positioned at the inner side and stress control part 812 is positioned at the outer side). Device 800 further includes anchor 840 for applying a bending strain to the magnetostrictive part and magnet 850 for applying a bias magnetic field, and the device can be fixed on a vibration source at fixation part 870. For facilitating the vibration of the magnetostrictive element in the detection coil, this device has a structure in which elastic material 822 is shortened and pillar 880 is provided inside the U-shaped portion, and uses two small magnets as magnet 850.

Figure 15:
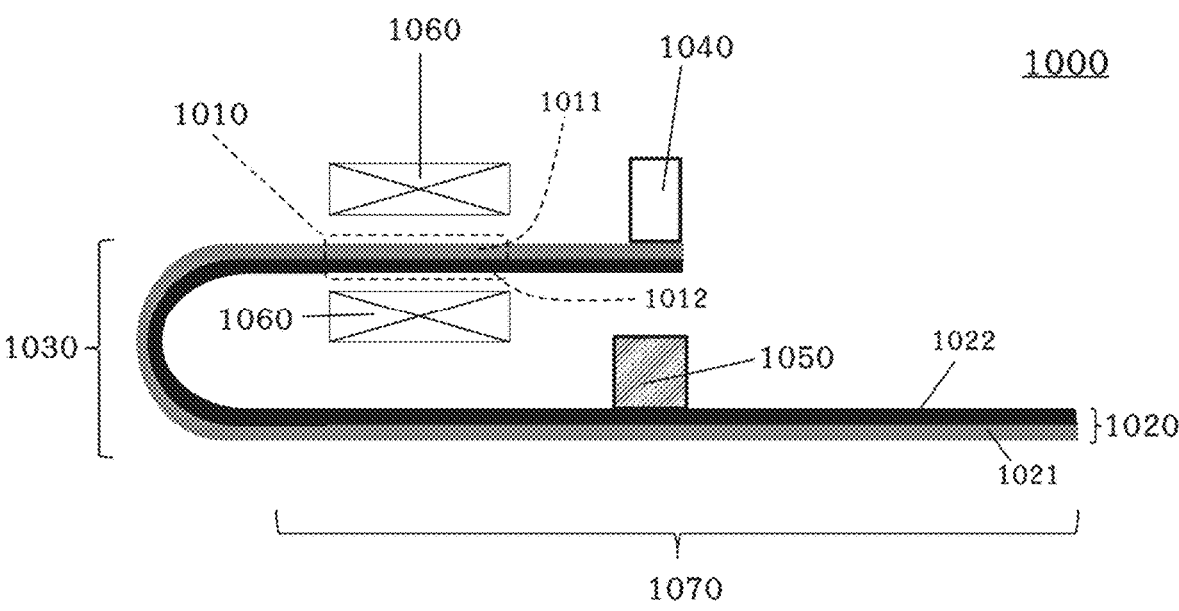
FIG. 15 is still another schematic diagram showing the structure of the magnetostrictive power generation device of the present invention.
Figure 16:
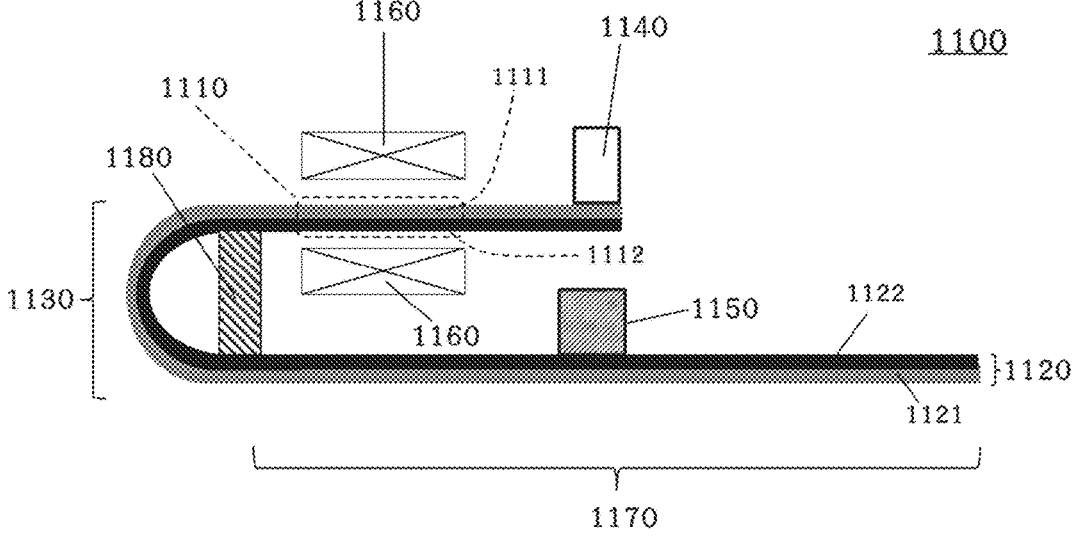
FIG. 16 is still another schematic diagram showing the structure of the magnetostrictive power generation device of the present invention.

FIGS. 15 and 16 are schematic diagrams of magnetostrictive power generation devices 1000 and 1100, respectively, and each device has a structure in which the whole of the U-shaped frame is formed integrally with the magnetostrictive element. In magnetostrictive power generation device 1000, magnetostrictive element 1010 has magnetostrictive part 1011 and stress control part 1012, and detection coil 1060 is loaded around the element. In this device, electrical steel sheet 1021 of laminate 1020 constituting frame 1030 is positioned at the outer side and elastic material 1022 is positioned at the inner side of the device (in magnetostrictive element 1010, magnetostrictive part 1011 is positioned at the outer side, stress control part 1012 is positioned at the inner side). Device 1000 further includes anchor 1040 for applying a bending strain to the magnetostrictive part and magnet 1050 for applying a bias magnetic field, and the device can be fixed on a vibration source at fixation part 1070.

Magnetostrictive power generation device 1100 has substantially the same structure as magnetostrictive power generation device 1000 of FIG. 15, except that pillar 1180 is provided. Specifically, magnetostrictive element 1110 has magnetostrictive part 1111 and stress control part 1112, and detection coil 1160 is loaded around the element. In this device, electrical steel sheet 1121 of laminate 1120 constituting frame 1130 is positioned at the outer side and elastic material 1122 is positioned at the inner side of the device (in magnetostrictive element 1110, magnetostrictive part 1111 is positioned at the outer side, stress control part 1112 is positioned at the inner side). Device 1100 further includes anchor 1140 for applying a bending strain to the magnetostrictive part and magnet 1150 for applying a bias magnetic field, and the device can be fixed on a vibration source at fixation part 1170. Furthermore, for facilitating the vibration of magnetostrictive element 1110 in detection coil 1160, pillar 1180 is provided inside the U-shaped portion. The device may be fixed on a vibration source at fixation part 1170.

Figure 17:
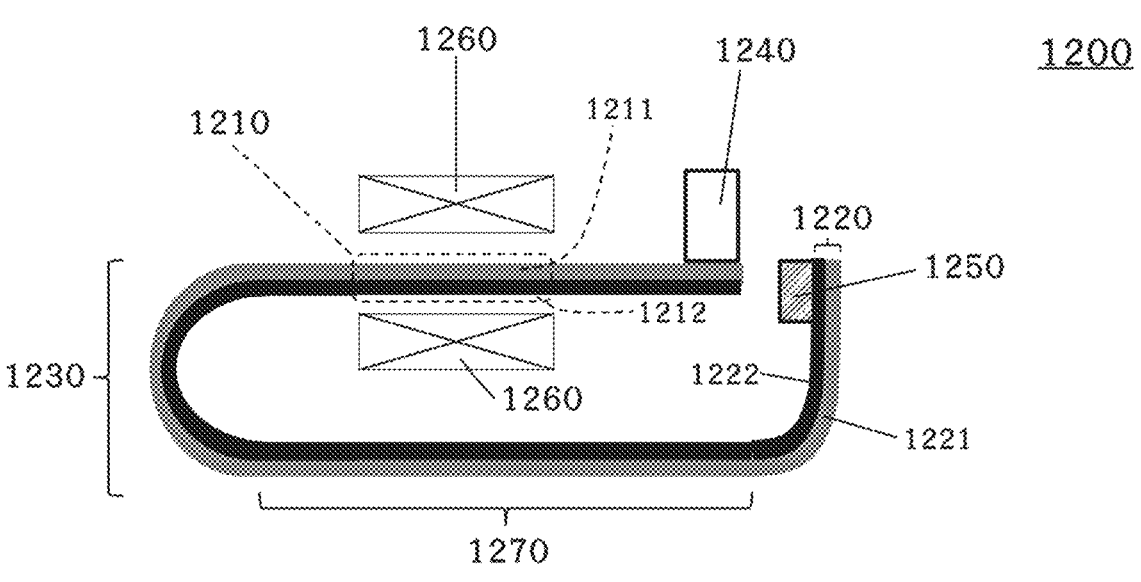
FIG. 17 is still another schematic diagram showing the structure of the magnetostrictive power generation device of the present invention.
Figure 18:
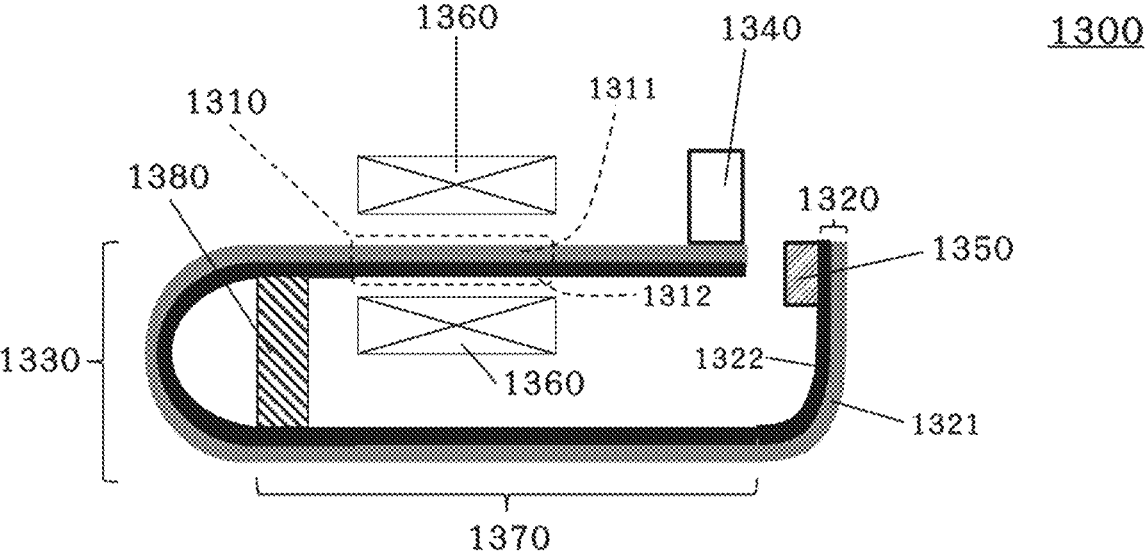
FIG. 18 is still another schematic diagram showing the structure of the magnetostrictive power generation device of the present invention.

FIGS. 17 and 18 are schematic diagrams of magnetostrictive power generation devices 1200 and 1300, respectively, and each device has a structure in which the whole of the frame having one U-shaped portion and one L-shaped portion is formed integrally with the magnetostrictive element. In magnetostrictive power generation device 1200, magnetostrictive element 1210 has magnetostrictive part 1211 and stress control part 1212, and detection coil 1260 is loaded around the element. In this device, electrical steel sheet 1221 of laminate 1220 constituting frame 1230 is positioned at the outer side and elastic material 1222 is positioned at the inner side of the device (in magnetostrictive element 1210, magnetostrictive part 1211 is positioned at the outer side, stress control part 1212 is positioned at the inner side). Device 1200 further includes anchor 1240 for applying a bending strain to the magnetostrictive part and magnet 1250 for applying a bias magnetic field, and magnet 1250 is fixed to the inner side (elastic material 1222 side) of the terminal portion of the frame extending from the portion bent in an L-shape. Additionally, the device may be fixed on a vibration source at fixation part 1270.

Magnetostrictive power generation device 1300 has substantially the same structure as magnetostrictive power generation device 1200 of FIG. 17, except that pillar 1380 is provided. Specifically, magnetostrictive element 1310 has magnetostrictive part 1311 and stress control part 1312, and detection coil 1360 is loaded around the element. In this device, electrical steel sheet 1321 of laminate 1320 constituting frame 1330 is positioned at the outer side of the device and elastic material 1322 is positioned at the inner side of the device (in magnetostrictive element 1310, magnetostrictive part 1311 is positioned at the outer side, stress control part 1312 is positioned at the inner side). Device 1300 further includes anchor 1340 for applying a bending strain to the magnetostrictive part and magnet 1350 for applying a bias magnetic field, and magnet 1350 is fixed to the inner side (elastic material 1322 side) of the terminal portion of the frame extending from the portion bent in an L-shape. Furthermore, for facilitating the vibration of magnetostrictive element 1310 in detection coil 1360, pillar 1380 is provided inside the U-shaped portion. The device may be fixed on a vibration source at fixation part 1370.

Figure 19:
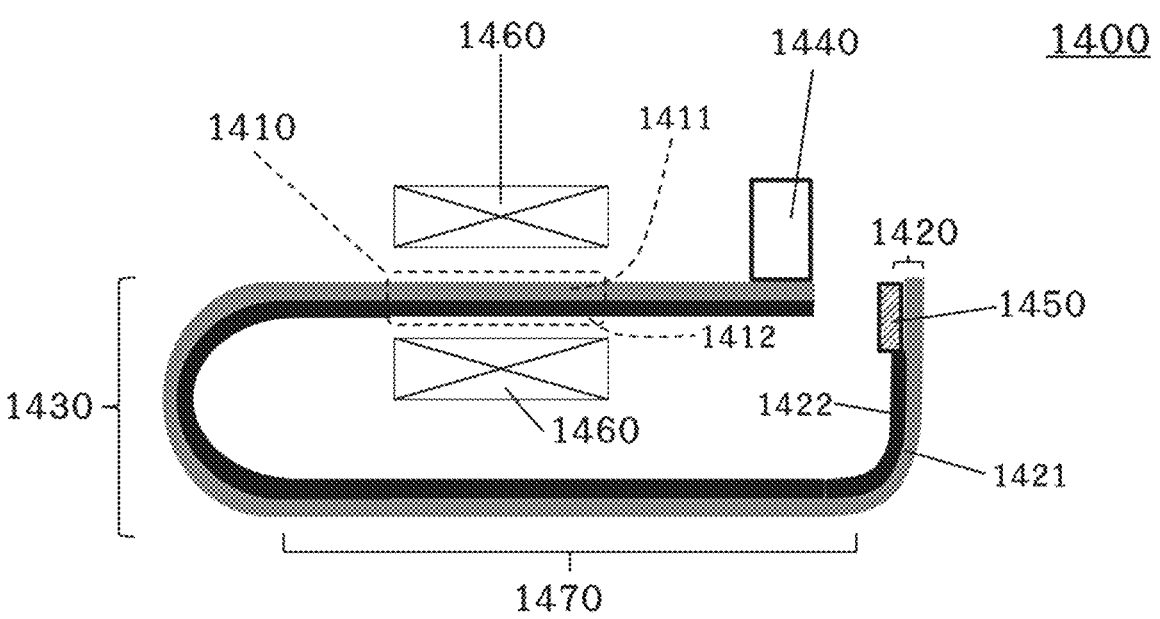
FIG. 19 is still another schematic diagram showing the structure of the magnetostrictive power generation device of the present invention.
Figure 20:
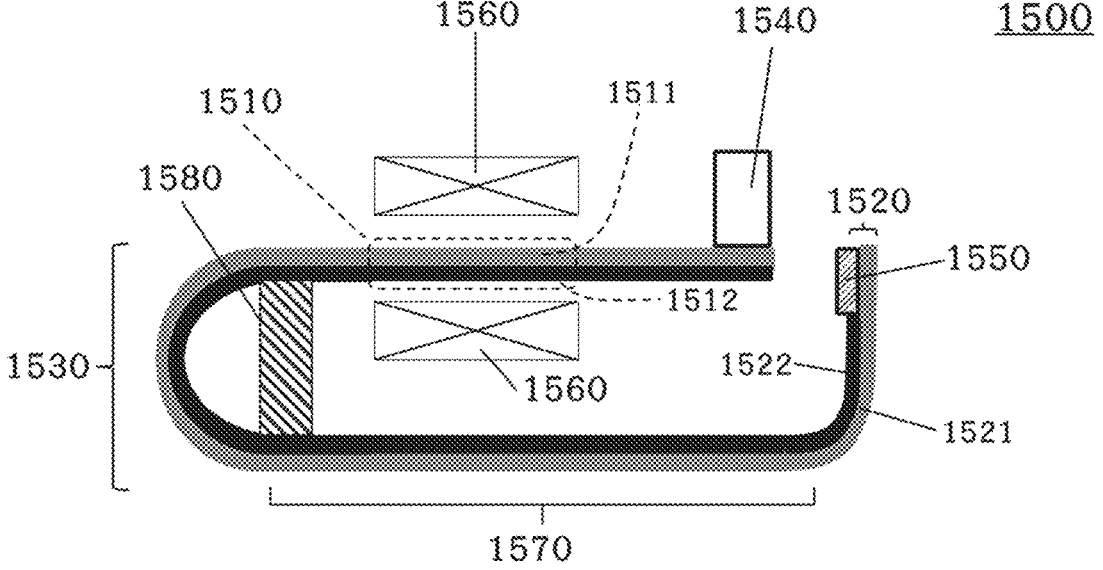
FIG. 20 is still another schematic diagram showing the structure of the magnetostrictive power generation device of the present invention.

FIGS. 19 and 20 are schematic diagrams of magnetostrictive power generation devices 1400 and 1500, respectively, and each device has a structure in which the frame having one U-shaped portion and one L-shaped portion is formed integrally with the magnetostrictive element, and an elastic material is not used at a part for fixing a magnet. In magnetostrictive power generation device 1400, magnetostrictive element 1410 has magnetostrictive part 1411 and stress control part 1412, and detection coil 1460 is loaded around the element. In this device, electrical steel sheet 1421 of laminate 1420 constituting frame 1430 is positioned at the outer side of the device and elastic material 1422 is positioned at the inner side of the device (in magnetostrictive element 1410, magnetostrictive part 1411 is positioned at the outer side, stress control part 1412 is positioned at the inner side). Device 1400 further includes anchor 1440 for applying a bending strain to the magnetostrictive part and magnet 1450 for applying a bias magnetic field, and magnet 1450 is fixed to the inner side of electrical steel sheet 1421 at the terminal portion of the frame extending from the portion bent in an L-shape. In device 1400, there is no elastic material inbetween the magnet and the electrical steel sheet. Since the influence of the magnetic gap is reduced by such configuration, a small magnet can be used. Additionally, the device may be fixed on a vibration source at fixation part 1470.

Magnetostrictive power generation device 1500 has substantially the same structure as magnetostrictive power generation device 1400 of FIG. 19, except that pillar 1580 is provided. Specifically, magnetostrictive element 1510 has magnetostrictive part 1511 and stress control part 1512, and detection coil 1560 is loaded around the element. In this device, electrical steel sheet 1521 of laminate 1520 constituting frame 1530 is positioned at the outer side of the device and elastic material 1522 is positioned at the inner side of the device (in magnetostrictive element 1510, magnetostrictive part 1511 is positioned at the outer side, stress control part 1512 is positioned at the inner side). Device 1500 further includes anchor 1540 for applying a bending strain to the magnetostrictive part and magnet 1550 for applying a bias magnetic field, and magnet 1550 is fixed to the inner side of electrical steel sheet 1521 at the terminal portion of the frame extending from the portion bent in an L-shape. In device 1500, there is no elastic material inbetween the magnet and the electrical steel sheet. Since the influence of the magnetic gap is reduced by such configuration, a small magnet can be used. Furthermore, for facilitating the vibration of magnetostrictive element 1510 in detection coil 1560, pillar 1580 is provided inside the U-shaped portion. The device may be fixed on a vibration source at fixation part 1570.

Figure 21:
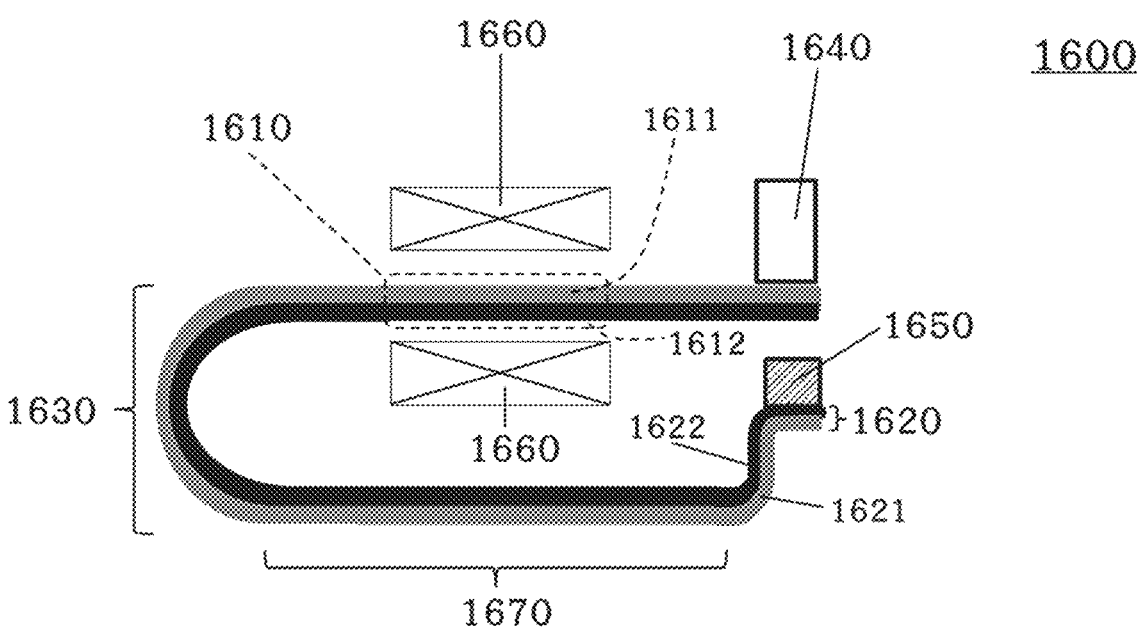
FIG. 21 is still another schematic diagram showing the structure of the magnetostrictive power generation device of the present invention.
Figure 22:
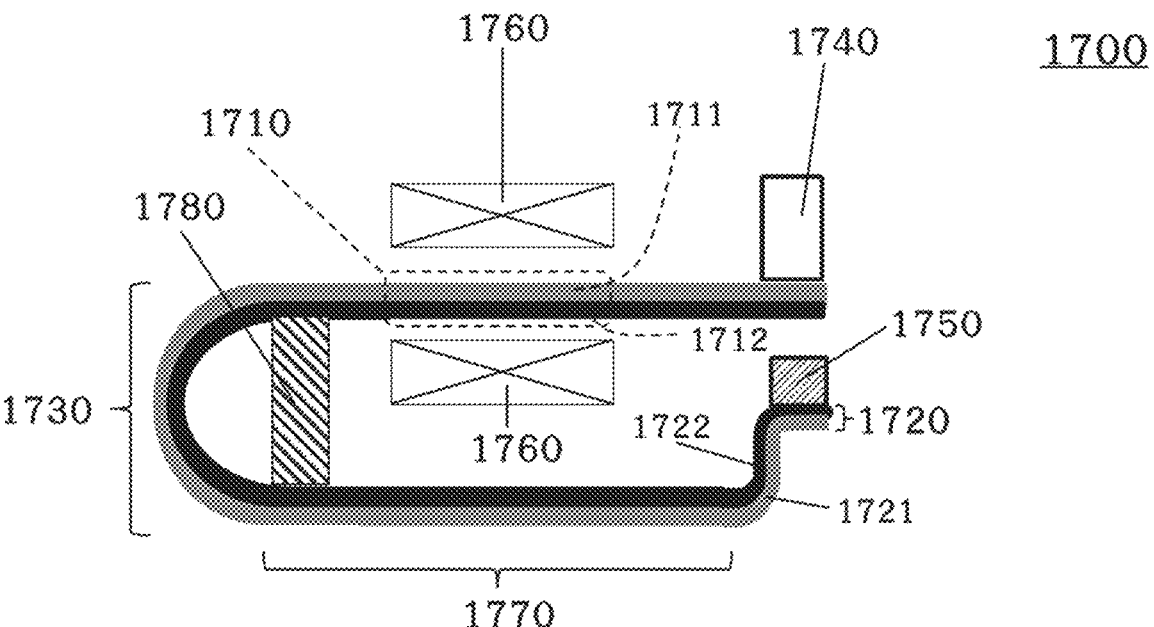
FIG. 22 is still another schematic diagram showing the structure of the magnetostrictive power generation device of the present invention.

FIGS. 21 and 22 are schematic diagrams of magnetostrictive power generation devices 1600 and 1700, respectively, and each device has a structure in which the whole of the frame having one U-shaped portion and one L-shaped portion is formed integrally with the magnetostrictive element. In magnetostrictive power generation device 1600, magnetostrictive element 1610 has magnetostrictive part 1611 and stress control part 1612, and detection coil 1660 is loaded around the element. In this device, electrical steel sheet 1621 of laminate 1620 constituting frame 1630 is positioned at the outer side of the device and elastic material 1622 is positioned at the inner side of the device (in magnetostrictive element 1610, magnetostrictive part 1611 is positioned at the outer side, stress control part 1612 is positioned at the inner side). Device 1600 further includes anchor 1640 for applying a bending strain to the magnetostrictive part and magnet 1650 for applying a bias magnetic field, and magnet 1650 is fixed to the upper side of elastic material 1622 close to the terminus of the L-shaped portion. In device 1600, since the magnetic gap can be narrowed by bringing magnet 1650 and magnetostrictive part 1611 closer to each other, a small sized magnet can be used. Additionally, the device may be fixed on a vibration source at fixation part 1670.

Magnetostrictive power generation device 1700 has substantially the same structure as magnetostrictive power generation device 1600 of FIG. 21, except that pillar 1780 is provided. Specifically, magnetostrictive element 1710 has magnetostrictive part 1711 and stress control part 1712, and detection coil 1760 is loaded around the element. In this device, electrical steel sheet 1721 of laminate 1720 constituting frame 1730 is positioned at the outer side of the device and elastic material 1722 is positioned at the inner side of the device (in magnetostrictive element 1710, magnetostrictive part 1711 is positioned at the outer side, stress control part 1712 is positioned at the inner side). Device 1700 further includes anchor 1740 for applying a bending strain to the magnetostrictive part and magnet 1750 for applying a bias magnetic field, and magnet 1750 is fixed to elastic material 1722 at the upper side of the L-shaped portion close to the terminus. In device 1700, since the magnetic gap can be narrowed by bringing magnet 1750 and magnetostrictive part 1711 closer to each other, a small magnet can be used. Furthermore, for facilitating the vibration of magnetostrictive element 1710 in detection coil 1760, pillar 1780 is provided inside the U-shaped portion. The device may be fixed on a vibration source at fixation part 1770.

Figure 23:
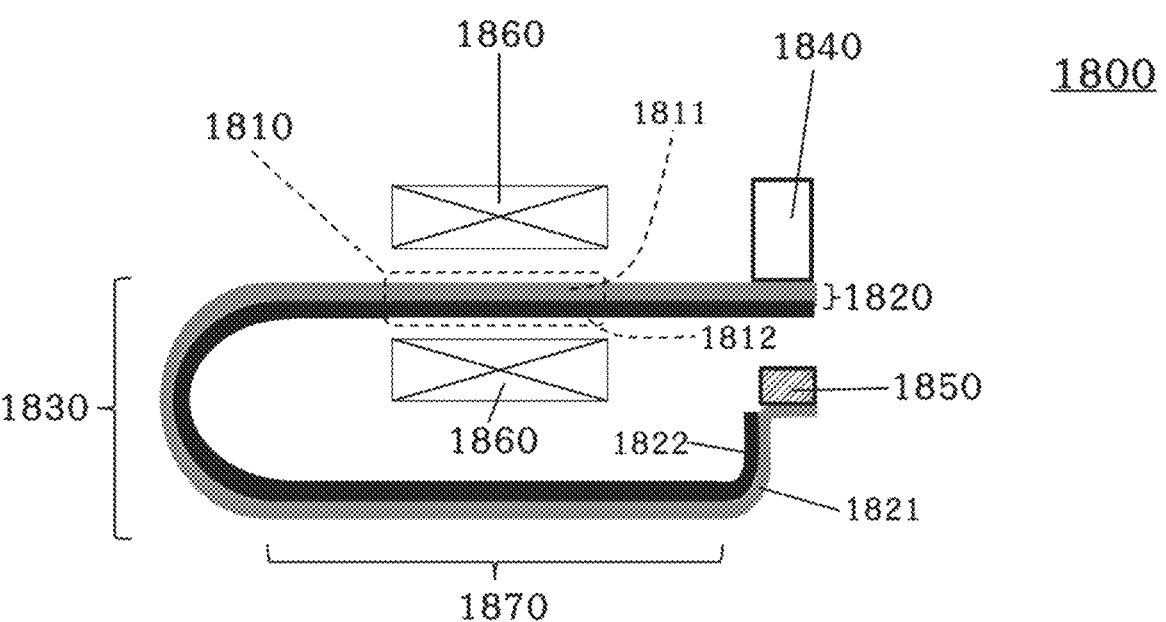
FIG. 23 is still another schematic diagram showing the structure of the magnetostrictive power generation device of the present invention.
Figure 24:
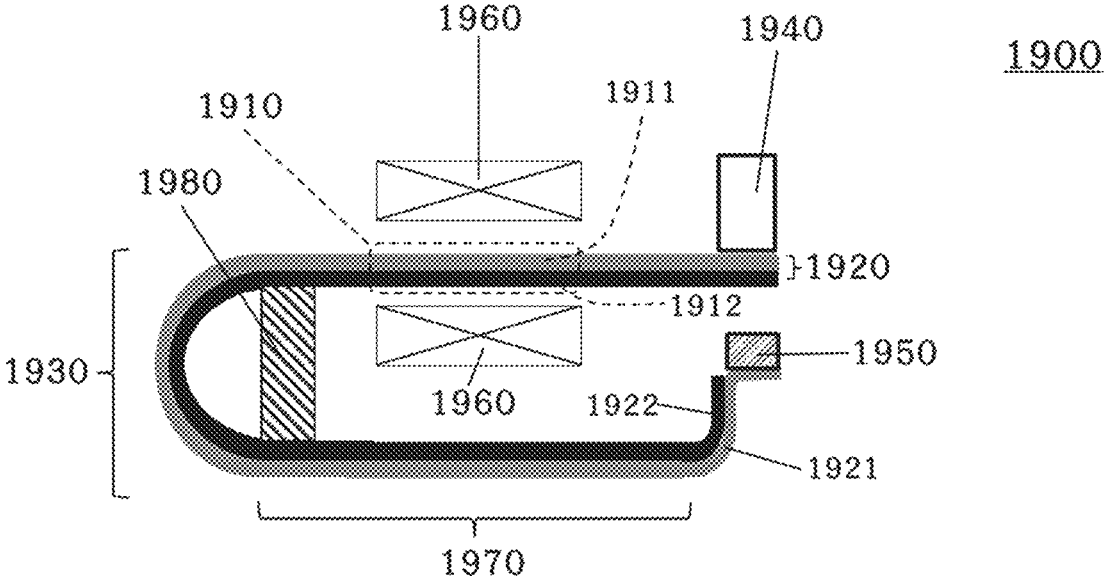
FIG. 24 is still another schematic diagram showing the structure of the magnetostrictive power generation device of the present invention.

FIGS. 23 and 24 are schematic diagrams of magnetostrictive power generation devices 1800 and 1900, respectively, and each device has a structure in which the frame having one U-shaped portion and two L-shaped portions is formed integrally with the magnetostrictive element, and an elastic material is not used at a part for fixing a magnet. In magnetostrictive power generation device 1800, magnetostrictive element 1810 has magnetostrictive part 1811 and stress control part 1812, and detection coil 1860 is loaded around the element. In this device, electrical steel sheet 1821 of laminate 1820 constituting frame 1830 is positioned at the outer side of the device and elastic material 1822 is positioned at the inner side of the device (in magnetostrictive element 1810, magnetostrictive part 1811 is positioned at the outer side, stress control part 1812 is positioned at the inner side). Device 1800 further includes anchor 1840 for applying a bending strain to the magnetostrictive part and magnet 1850 for applying a bias magnetic field, and magnet 1850 is fixed to electrical steel sheet 1821 at the upper side of the L-shaped portion close to the terminus. In device 1800, since the magnetic gap is even smaller due to small distance between magnet 1850 and magnetostrictive part 1811 and also due to lack of elastic material between the magnet and the electrical steel sheet, even smaller magnet can be used. Additionally, the device may be fixed on a vibration source at fixation part 1870.

Magnetostrictive power generation device 1900 has substantially the same structure as magnetostrictive power generation device 1800 of FIG. 23, except that pillar 1980 is provided. Specifically, magnetostrictive element 1910 has magnetostrictive part 1911 and stress control part 1912, and detection coil 1960 is loaded around the element. In this device, electrical steel sheet 1921 of laminate 1920 constituting frame 1930 is positioned at the outer side of the device and elastic material 1922 is positioned at the inner side of the device (in magnetostrictive element 1910, magnetostrictive part 1911 is positioned at the outer side, stress control part 1912 is positioned at the inner side). Device 1900 further includes anchor 1940 for applying a bending strain to the magnetostrictive part and magnet 1950 for applying a bias magnetic field, and magnet 1950 is fixed to electrical steel sheet 1921 at the upper side of the L-shaped portion close to the terminus. In device 1900, since the magnetic gap is even smaller due to small distance between magnet 1950 and magnetostrictive part 1911 and also due to lack of elastic material between the magnet and the electrical steel sheet, even smaller magnet can be used. Furthermore, for facilitating the vibration of magnetostrictive element 1910 in detection coil 1960, pillar 1980 is provided inside the U-shaped portion. The device may be fixed on a vibration source at fixation part 1970.

3. Magnetostrictive Element for Power Generation and Magnetostrictive Power Generation Device which Use a Magnetostrictive Material Other than an Electrical Steel Sheet A embodiment 3 of the present invention relates to a magnetostrictive element for power generation and magnetostrictive power generation device which use a magnetostrictive material other than an electrical steel sheet. Specifically, the present invention relates to a magnetostrictive element for power generation comprising a magnetostrictive part formed of a magnetostrictive material selected from the group consisting of a FeGa-based alloy, a FeCo-based alloy, and a FeAl-based alloy, and a stress control part formed of an elastic material laminated to the magnetostrictive material, wherein the magnetostrictive element simultaneously satisfies the relationships of the following Equations (1) and (2) when the magnetostrictive material has a Young's modulus Em [GPa] and sheet thickness tm [mm], and the elastic material has a Young's modulus Es [GPa] and sheet thickness ts [mm], and magnetostrictive power generation device using the same.

$$Em < Es \tag{1}$$

$$1.1 \le \frac{Es \times ts^2}{Em \times tm^2} \tag{2}$$

(In the equations, Em is the Young's modulus [GPa] of the magnetostrictive material, tm is the sheet thickness [mm] of the magnetostrictive material, Es is the Young's modulus [GPa] of the elastic material, and ts is the sheet thickness [mm] of the elastic material.)

There is no particular limitation with respect to the structure of the magnetostrictive element for power generation according to the embodiment 3 as long as the magnetostrictive part is a material other than the electromagnetic steel sheet (i.e., a FeGa-based alloy, a FeCo-based alloy, or a FeAl-based alloy), the magnetostrictive element has a stress control part formed of an elastic material, and the relationships of the above Equations (1) and (2) are satisfied simultaneously. Therefore, the structure can be the same as that of the magnetostrictive element for power generation of the above-described embodiment 1 which uses an electrical steel sheet as the magnetostrictive part, and simultaneously satisfies the relationships of the above Equations (1) and (2).

The magnetostrictive power generation device of the embodiment 3 is a device equipped with the above-mentioned magnetostrictive element for power generation which contains a material other than the electromagnetic steel sheet and simultaneously satisfies the relationships of the above Equations (1) and (2). Therefore, the parts exclusive of the magnetostrictive element are the same as those of a conventional magnetostrictive power generation device.

Hereinafter, the present invention will be specifically described with reference to Examples, but the Examples should not be construed as limiting the present invention.

EXAMPLES

Example I <Examples Using an Electrical Steel Sheet as a Magnetostrictive Material>

(Evaluation Method)

In the Examples, magnetostrictive elements were evaluated based on the value of the magnetic flux density change $\Delta B$ and the value of the generated voltage.

1. Measurement of the Magnetic Flux Density Change $\Delta B$ of the Magnetostrictive Element For the measurement of the magnetic flux density change $\Delta B$, measurement unit 10 (FIG. 1) which applies a bending strain to the magnetostrictive element or measurement unit 20 (FIG. 2) which applies uniaxial strain was used. Measurement method for each unit will be described.

I-1-1. Measurement Using the Measurement Unit of FIG. 1

A schematic diagram of unit 10 for measuring the magnetic flux density change $\Delta B$ by applying a bending strain to a magnetostrictive element is shown in FIG. 1. FIG. 1 shows, as an example, a unit which fixes a left end portion of magnetostrictive element 11 having magnetostrictive part 11a and stress control part 11b to its fixed support base 15, and which applies a bending strain by pushing downward the right end portion of magnetostrictive element 11.

In unit 10, pressure 17 in a downward direction is applied to the right end portion of magnetostrictive element 11 (i.e., pushed). In this instance, magnetostrictive part 11a (magnetostrictive material) is under a state with added compressive strain, and the longer the distance 17a moved by the pushing of magnetostrictive part 11a, the larger the compressive strain. The pushing was carried out using a cylinder head of a micrometer, and the depth of the push was adjusted by the stroke of the cylinder head.

Further, in the measurement unit of FIG. 1, a Helmholtz-type coil was used as coil 12 for bias magnetic field, and a magnetic field was applied to magnetostrictive element 11 by passing a current through the coil. Magnitude of the magnetic field was adjusted by the magnitude of DC power supply 14, and the magnitude of the magnetic field was calibrated in advance by a gaussmeter. Here, the magnetic field applied to magnetostrictive element 11 was changed from 0 to about 50 Oe, and the evaluation was performed using a magnetic field which maximizes the magnetic flux density change. Flux change of magnetostrictive element 11 was detected as an induced voltage by detection coil 13 (number of turns: 3500 turns), and the induced voltage was measured as a change in magnetic flux with a flux meter 16. Furthermore, based on the above equation I, the magnetic flux density change ΔB was obtained by dividing the change in magnetic flux by the number of turns of the detection coil and the cross-sectional area of the magnetostrictive material.

$$\Delta B = -\frac{1}{(N \times S)} \int V \, dt \qquad \text{Equation I}$$

(In the equation, V is the generated voltage, N is the number of turns of the coil, S is the cross-sectional area of the magnetostrictive part.)

The magnetic flux density change ΔB obtained by this measurement method is a time integral of the voltage change and, therefore, it does not depend on the speed for applying the strain.

I-1-2: Measurement Using the Measurement Unit Shown in FIG. 2

Figure 2:
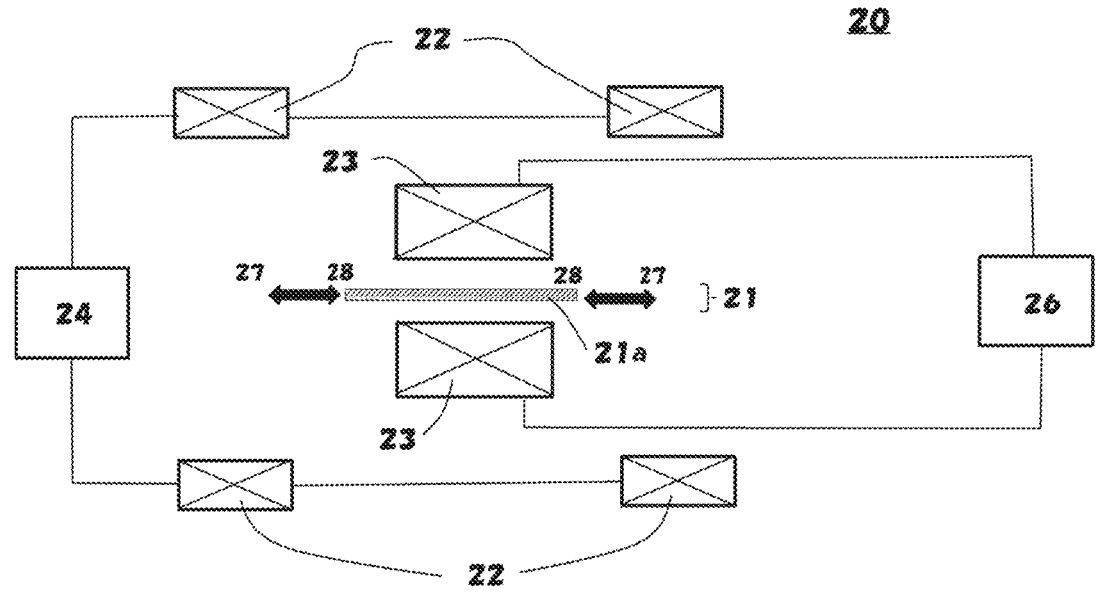
FIG. 2 is a schematic diagram of a unit for measuring the magnetic flux density change ΔB by applying a tensile strain and a compressive strain in an uniaxial direction of a magnetostrictive element.

A schematic diagram of a unit for measuring the magnetic flux density change ΔB by applying tensile strain and compressive strain in an uniaxial direction of a magneto-strictive element is shown in FIG. 2. FIG. 2 shows, as an example, magnetostrictive element 21 having a magneto-strictive part 21*a*. Both end portions of magnetostrictive element 21 was fixed by a clamping tool (not shown) formed of a non-magnetic material and tensile strain 27 and com-pressive strain 28 were applied to magnetostrictive element 21. When applying compressive strain 28, in order to suppress the buckling of the magnetostrictive element, parts of the magnetostrictive element, excluding the clamping tool clamping from both sides of the magnetostrictive element, were sandwiched by 0.5 mm-thick acrylic resin plates.

In measurement unit 20 of FIG. 2, a Helmholtz type coil was used as bias magnetic field coil 22, and magnetic field was applied to magnetostrictive element 21 by passing a current in the coil. Magnitude of the magnetic field was adjusted by the magnitude of DC power supply 24, and the magnitude of the magnetic field was calibrated in advance by a gaussmeter. Here, the magnetic field applied to mag-netostrictive element 21 was changed from 0 to about 50 Oe, and the evaluation was performed using a magnetic field which maximizes the magnetic flux density change. Flux change of magnetostrictive element 21 was detected as an induced voltage by detection coil 23 (number of turns: 3500 turns), and the induced voltage was measured as a change in magnetic flux by flux meter 26. Furthermore, based on the above equation I, the magnetic flux density change ΔB was obtained by dividing the change in magnetic flux by the number of turns of the detection coil and the cross-sectional area of the magnetostrictive material.

I-2. Measurement of Generated Voltage

For the measurement of generated voltage, either the measurement unit shown in FIG. 1 which applies a bending strain to the magnetostrictive element or the magnetostric-tive vibration apparatus shown in FIG. 3 was used. Each measurement method will be described.

I-2-1. Measurement of Generated Voltage at the Time of Application of Dynamic Vibration to Magnetostrictive Ele-ment An aluminum stand having measurement unit 10 of FIG. 1 mounted thereon, was placed on an excitation apparatus and dynamic strain was applied to magnetostrictive element

11. Specifically, a tungsten anchor (not shown) was fixed to each of the fixed end portion and the opposite end portion of magnetostrictive element 11. The excitation apparatus was sinusoidally oscillated at a predetermined acceleration and frequency. In this instance, the AC voltage induced in detection coil 13 was inputted to a digital oscilloscope, and the performance of the element as a magnetostrictive vibra-tion power generation device was evaluated using the peak voltage of the voltage waveform.

I-2-2. Measurement of Voltage Generated by a Device

Magnetostrictive vibration apparatus 30 for evaluation shown in FIG. 3 was used. Magnetostrictive part 31*a* (magnetostrictive material) was bonded to a part of the U-shaped structure (frame 35) made of a non-magnetic material with an adhesive, thereby obtaining magnetostric-tive element section 31. In this instance, for facilitating the vibration of the magnetostrictive element, the thickness of the non-magnetic material at the part for bonding magneto-strictive part 31*a* (magnetostrictive material) was adjusted to a thickness smaller than that of other parts forming the frame. Further, in order to prevent the peeling off of mag-netostrictive part 31*a* from the non-magnetic material, both ends of magnetostrictive part 31*a* were reinforced with the non-magnetic material. The part of frame 35 made of the non-magnetic material where magnetostrictive part 31*a* is bonded thereto became stress control part 31*b*.

Detection coil 33 (number of turns being 4500 turns) was installed in the part of magnetostrictive element section 31. In addition, magnet 34 was bonded to each end of magne-tostrictive element section 31 and a bias magnetic field was applied. In this instance, cancellation of the magnetic fields inside the magnetostrictive element was prevented by bond-ing two magnets in opposite polarity. The magnitude of the bias magnetic field was also adjusted by changing the strength of the magnets.

A tungsten anchor was used as anchor 32 and was fixed to the end of the U-shaped structure (frame 35). The AC voltage induced in detection coil 33 was inputted to a digital oscilloscope, and the performance of the element as a magnetostrictive vibration power generation device was evaluated using the peak voltage of the voltage waveform.

Example I-1

Magnetostrictive Element Containing a Grain-Oriented Electrical Steel Sheet and a Non-Magnetic Material As a magnetostrictive material constituting the magneto-strictive part, a grain-oriented electrical steel sheet 27ZH100 (manufactured by Nippon Steel Corporation) with coating, was used. The thickness of the electrical steel sheet was 0.27 mm and the crystallographic orientation was {110}<100> GOSS texture. The longitudinal direction of the grain-oriented electrical steel sheet was taken as the <100> direction and was cut into 40 mm in length and 6.1 mm in width by shearing. The sheet was annealed at 800° C. for 2 hours under vacuum for removing the strain caused during the cutting, thereby obtaining a grain-oriented electrical steel sheet for magnetostrictive part.

Carbon fiber-reinforced plastic (CFRP) sheet with a thick-ness of 0.5 mm was used as a non-magnetic material constituting the stress control part. The direction of the carbon fibers was taken as the longitudinal direction and the CFRP sheet was cut into 40 mm in length and 6.5 mm in width, thereby obtaining a non-magnetic material for the stress control part.

The above-mentioned grain-oriented electrical steel sheet and the CFRP were bonded together at room temperature using an epoxy-based adhesive to obtain a magnetostrictive element. The obtained magnetostrictive element was integrated into the measurement unit shown in FIG. 1, and the magnetic flux density change $\Delta B$ was measured at the time of application of a bending strain to the magnetostrictive element. Specifically, the magnetostrictive element was fixed at its left end with the magnetostrictive part being the lower side so that compressive strain will be applied to the magnetostrictive part when the right end portion is pushed downward. The applied bias magnetic field was set at 2800 A/m (35 Oe).

The magnetostrictive element before pushing downward the right end portion thereof, i.e., under a state without any bending strain, was used as a reference to measure the depth $\Delta h$ (mm) of the pushed magnetostrictive element and the magnetic flux density change $\Delta B$ in this instance. The results are shown in Table 1.

TABLE 1

| Depth of Push $\Delta h$ (mm) | 0 | 0.5 | 1.0 | 1.5 | 2.0 |
|---|---|---|---|---|---|
| Magnetic Flux Density Change $\Delta B$ (T) | 0 | 0.09 | 0.23 | 0.35 | 0.44 |

As apparent from the results of Table 1, the magnetostrictive element of the present invention obtained by laminating the grain-oriented electrical steel sheet as the magnetostrictive part and the non-magnetic material as the stress control part showed a magnetic flux density change $\Delta B$ that increases with the increase in pushed depth $\Delta h$, that is, excellent performance as a magnetostrictive element for power generation.

Example I-2

Magnetostrictive Element Containing a Grain-Oriented Electrical Steel Sheet and a Non-Magnetic Material As a magnetostrictive material constituting the magnetostrictive part, a grain-oriented electrical steel sheet 27ZH100 (manufactured by Nippon Steel Corporation) with coating, was used. The thickness of the electrical steel sheet was 0.27 mm and the crystallographic orientation was {110}<100> GOSS texture. The longitudinal direction of the grain-oriented electrical steel sheet was taken as the <100> direction and was cut into 40 mm in length and 5.8 mm in width by shearing. The sheet was annealed at 800° C. for 2 hours under vacuum for removing the strain caused during the cutting, thereby obtaining a grain-oriented electrical steel sheet for the magnetostrictive part.

SUS304, a cold-rolled sheet, having a thickness of 0.5 mm was used as a non-magnetic material constituting the stress-control part. The sheet was cut into a length of 40 mm and a width of 6.5 mm, held in a vacuum at 1050° C. for 1 minute, and subjected to a solid solution treatment by gas quenching for removing the influence of cutting strain, thereby obtaining a non-magnetic material for stress control part.

The above-mentioned grain-oriented electrical steel sheet and SUS304 were bonded together at room temperature using an epoxy-based adhesive to obtain a magnetostrictive element. The obtained magnetostrictive element was integrated into the measurement unit shown in FIG. 1, and the magnetic flux density change $\Delta B$ was measured at the time of application of a bending strain to the magnetostrictive element. Specifically, the magnetostrictive element was fixed at its left end with the magnetostrictive part being the lower side so that compressive strain will be applied to the magnetostrictive part when the right end portion is pushed downward. The applied bias magnetic field was set at 2800 A/m (35 Oe).

The magnetostrictive element before pushing downward the right end portion thereof, i.e., under a state without any bending strain, was used as a reference to measure the depth $\Delta h$ (mm) of the pushed magnetostrictive element and the magnetic flux density change $\Delta B$ in this instance. The results are shown in Table 2.

TABLE 2

| Depth of Push $\Delta h$ (mm) | 0 | 0.5 | 1.0 | 1.5 | 2.0 |
|---|---|---|---|---|---|
| Magnetic Flux Density Change $\Delta B$ (T) | 0 | 0.09 | 0.22 | 0.34 | 0.43 |

As apparent from the results of Table 2, the magnetostrictive element of the present invention obtained by laminating the grain-oriented electrical steel sheet as the magnetostrictive part and the non-magnetic material as the stress control part showed a magnetic flux density change $\Delta B$ that increases with the increase in pushed depth $\Delta h$, that is, excellent performance as a magnetostrictive element for power generation.

Example I-3

Magnetostrictive Element Containing a Grain-Oriented Electrical Steel Sheet and a Magnetic Material As a magnetostrictive material constituting the magnetostrictive part, a grain-oriented electrical steel sheet 27ZH100 (manufactured by Nippon Steel Corporation) with coating, was used. The thickness of the electrical steel sheet was 0.27 mm and the crystallographic orientation was {110}<100> GOSS texture. The longitudinal direction of the grain-oriented electrical steel sheet was taken as the <100> direction and was cut into 40 mm in length and 6.1 mm in width by shearing. The sheet was annealed at 800° C. for 2 hours under vacuum for removing the strain caused during the cutting, thereby obtaining a grain-oriented electrical steel sheet for magnetostrictive part.

SS400, an ordinary steel, having a thickness of 0.5 mm was used as a magnetic material constituting the stress-control part. The sheet was cut into a length of 40 mm and a width of 6.5 mm, and held in a vacuum at 800° C. for 30 minutes, followed by cooling of the kiln, for removing the influence of cutting strain.

The above-mentioned grain-oriented electrical steel sheet and SS400 were bonded together at room temperature using an epoxy-based adhesive to obtain a magnetostrictive element. The obtained magnetostrictive element was integrated into the measurement unit shown in FIG. 1, and the magnetic flux density change $\Delta B$ was measured at the time of application of a bending strain to the magnetostrictive element. Specifically, the magnetostrictive element was fixed at its left end with the magnetostrictive part being the lower side so that compressive strain will be applied to the magnetostrictive part when the right end portion is pushed downward. The applied bias magnetic field was set at 4000 A/m (50 Oe).

The magnetostrictive element before pushing downward the right end portion thereof, i.e., under a state without any bending strain, was used as a reference to measure the depth $\Delta h$ (mm) of the pushed magnetostrictive element and the magnetic flux density change $\Delta B$ in this instance. The results are shown in Table 3.

TABLE 3

| Depth of Push Δh (mm) | 0 | 0.5 | 1.0 | 1.5 | 2.0 |
|---|---|---|---|---|---|
| Magnetic Flux Density Change ΔB (T) | 0 | 0.08 | 0.19 | 0.31 | 0.40 |

As apparent from the results of Table 3, the magnetostrictive element of the present invention obtained by laminating the grain-oriented electrical steel sheet as the magnetostrictive part and the magnetic material as the stress control part showed a magnetic flux density change ΔB that increases with the increase in pushed depth Δh, that is, excellent performance as a magnetostrictive element for power generation.

Example I-4

Magnetostrictive Element Containing a Non-Oriented Electrical Steel Sheet and a Non-Magnetic Material As a magnetostrictive material constituting the magnetostrictive part, a non-oriented electrical steel sheet 35H210 (manufactured by Nippon Steel Corporation) with coating, was used. The thickness of the electrical steel sheet was 0.35 mm. The rolling direction of the non-oriented electrical steel sheet was taken as the longitudinal direction and was cut into 40 mm in length and 5.8 mm in width by shearing. The sheet was annealed at 740° C. for 2 hours under vacuum for removing the strain caused during the cutting, thereby obtaining a non-oriented electrical steel sheet for the magnetostrictive part.

CFRP sheet with a thickness of 0.5 mm was used as a non-magnetic material constituting the stress control part. The direction of the carbon fibers was taken as the longitudinal direction and the CFRP sheet was cut into 40 mm in length and 6.5 mm in width, thereby obtaining a non-magnetic material for stress control part.

The above-mentioned non-oriented electrical steel sheet and the CFRP were bonded together at room temperature using an epoxy-based adhesive to obtain a magnetostrictive element. The obtained magnetostrictive element was integrated into the measurement unit shown in FIG. 1, and the magnetic flux density change ΔB was measured at the time of application of a bending strain to the magnetostrictive element. Specifically, the magnetostrictive element was fixed at its left end with the magnetostrictive part being the lower side so that compressive strain will be applied to the magnetostrictive part when the right end portion is pushed downward. The applied bias magnetic field was set at 3200 A/m (40 Oe).

The magnetostrictive element before pushing downward the right end portion thereof, i.e., under a state without any bending strain, was used as a reference to measure the depth Δh (mm) of the pushed magnetostrictive element and the magnetic flux density change ΔB in this instance. The results are shown in Table 4.

TABLE 4

| Depth of Push Δh (mm) | 0 | 0.5 | 1.0 | 1.5 | 2.0 |
|---|---|---|---|---|---|
| Magnetic Flux Density Change ΔB (T) | 0 | 0.08 | 0.15 | 0.21 | 0.23 |

As apparent from the results of Table 4, the magnetostrictive element of the present invention obtained by laminating the non-oriented electrical steel sheet as the magnetostrictive part and the non-magnetic material as the stress control part showed a magnetic flux density change ΔB that increases with the increase in pushed depth Δh. Although the results were lower than the results of the magnetostrictive element with a grain-oriented electrical steel sheet as a magnetostrictive part (Examples I-1 to I-3), this Example also showed excellent performance as a magnetostrictive element for power generation.

Example I-5

Magnetostrictive Element Containing a Non-Oriented Electrical Steel Sheet and a Magnetic Material As a magnetostrictive material constituting the magnetostrictive part, a non-oriented electrical steel sheet 35H210 (manufactured by Nippon Steel Corporation) with coating, was used. The thickness of the electrical steel sheet was 0.35 mm. The rolling direction of the non-oriented electrical steel sheet was taken as the longitudinal direction and was cut into 40 mm in length and 5.8 mm in width by shearing. The sheet was annealed at 740° C. for 2 hours under vacuum for removing the strain caused during the cutting, thereby obtaining a non-oriented electrical steel sheet for the magnetostrictive part.

SS400 having a thickness of 0.6 mm was used as a magnetic material constituting the stress-control part. The sheet was cut into a length of 40 mm and a width of 6.5 mm, and held in a vacuum at 800° C. for 30 minutes, followed by cooling of the kiln, for removing the influence of cutting strain.

The above-mentioned non-oriented electrical steel sheet and SS400 were bonded together at room temperature using an epoxy-based adhesive to obtain a magnetostrictive element. The obtained magnetostrictive element was integrated into the measurement unit shown in FIG. 1, and the magnetic flux density change ΔB was measured at the time of application of a bending strain to the magnetostrictive element. Specifically, the magnetostrictive element was fixed at its left end with the magnetostrictive part being the lower side so that compressive strain will be applied to the magnetostrictive part when the right end portion is pushed downward. The applied bias magnetic field was set at 4400 A/m (55 Oe).

The magnetostrictive element before pushing downward the right end portion thereof, i.e., under a state without any bending strain, was used as a reference to measure the depth Δh (mm) of the pushed magnetostrictive element and the magnetic flux density change ΔB in this instance. The results are shown in Table 5.

TABLE 5

| Depth of Push Δh (mm) | 0 | 0.5 | 1.0 | 1.5 | 2.0 |
|---|---|---|---|---|---|
| Magnetic Flux Density Change ΔB (T) | 0 | 0.07 | 0.13 | 0.19 | 0.21 |

As apparent from the results of Table 5, the magnetostrictive element of the present invention obtained by laminating the non-oriented electrical steel sheet as the magnetostrictive part and the magnetic material as the stress control part showed a magnetic flux density change ΔB that increases with the increase in pushed depth Δh. Although the results were lower than the results of the magnetostrictive element with a grain-oriented electrical steel sheet as a magnetostrictive part, this Example also showed excellent performance as a magnetostrictive element for power generation.

Example I-6

Magnetostrictive Element Consisting Only of Grain-Oriented Electrical Steel Sheet

As a magnetostrictive material constituting the magnetostrictive part, a grain-oriented electrical steel sheet 27ZH100 (manufactured by Nippon Steel Corporation) with coating, was used. The thickness of the electrical steel sheet was 0.27 mm and the crystallographic orientation was {110}<100> GOSS texture. The longitudinal direction of the grain-oriented electrical steel sheet was taken as the <100> direction and was cut into 20 mm in length and 6.0 mm in width by shearing. The sheet was annealed at 800° C. for 2 hours under vacuum for removing the strain caused during the cutting, thereby obtaining a grain-oriented electrical steel sheet for magnetostrictive part.

A compressive strain was applied to the obtained magnetostrictive element by using the measurement unit shown in FIG. 2. Specifically, in order to suppress the buckling of the magnetostrictive element, parts of the magnetostrictive element, excluding the clamping tool clamping from both sides of the magnetostrictive element, was sandwiched by 0.5 mm-thick acrylic resin plates. The magnetic flux density changes $\Delta B$ were measured with the compressive strain of 410 ppm (0.041%) (corresponding to $\Delta h=0.5$ mm) and 830 ppm (0.083%) (corresponding to $\Delta h=1.0$ mm). The applied bias magnetic field was set at 2800 A/m (35 Oe).

The magnetostrictive element under a state without any compressive strain was used as a reference to measure the compressive strain and the magnetic flux density change $\Delta B$ in this instance. Results of measurements are shown in Table 6.

TABLE 6

| Strain (ppm) | 0 | 410 | 830 |
|---|---|---|---|
| Magnetic Flux Density Change $\Delta B$ (T) | 0 | 0.10 | 0.24 |

As apparent from the results of Table 6, when a compressive strain is applied to the magnetostrictive element having the grain-oriented electrical steel sheet as the magnetostrictive part, the magnetic flux density change $\Delta B$ increased with the increase in the compressive strain, and excellent performance as a magnetostrictive element for power generation was observed.

Example I-7

Measurement of Voltage Generated by Applying Dynamic Vibration to Magnetostrictive Element

Voltage generated by each of the magnetostrictive elements prepared in Examples I-1 to I-5 was measured using the measurement unit shown in FIG. 1.

The measurement unit with the magnetostrictive element installed therein and the aluminum frame having the measurement unit mounted thereon were placed on top of an excitation apparatus, and a dynamic strain was applied to the magnetostrictive element. In this instance, a cylinder bead was removed from a micrometer installed at the end opposite to the fixed end of the magnetostrictive element, and a tungsten anchor was fixed thereto.

The distance $\Delta h$ between the position of the anchor before excitation and the lowest position of the anchor after excitation was measured by a laser range finder. The excitation apparatus was vibrated at 10 Hz with an acceleration of 1 G. The AC voltage induced in the detection coil was inputted to a digital oscilloscope, and peak voltage of the voltage waveform was measured. The results of measurements are shown in Table 7. In this Example, regardless of the materials used in the magnetostrictive element, the weight of the anchor was adjusted so that the $\Delta h$ value falls within the range of 1 mm to 2 mm.

TABLE 7

| | Weight of Anchor (g) | $\Delta h$ (mm) | Peak Voltage (mV) |
|---|---|---|---|
| Magnetostrictive Element of Example I-1 | 150 | 1.3 | 69 |
| Magnetostrictive Element of Example I-2 | 100 | 1.5 | 75 |
| Magnetostrictive Element of Example I-3 | 100 | 1.6 | 77 |
| Magnetostrictive Element of Example I-4 | 150 | 1.1 | 47 |
| Magnetostrictive Element of Example I-5 | 120 | 1.4 | 50 |

As apparent from the results of Table 7, the magnetostrictive element of the present invention vibrated in a bending mode in response to the external vibration, and showed a power generation performance of 50 mV or more.

Example I-8

Measurement of Voltage Generated by Magnetostrictive Power Generation Device

Voltage generated by each of the magnetostrictive parts prepared in Examples I-1 and I-4 was measured using the magnetostrictive power generation device shown in FIG. 3.

The magnetostrictive element was installed into the magnetostrictive vibration apparatus 30 of FIG. 3, and a lower portion of the U-shaped frame 35 was fixed on the excitation apparatus used in Example I-7. A 2 mm-thick CFRP was used for the U-shaped frame of FIG. 3. Paste the magnetostrictive elements, the thickness of CFRP of the portion corresponding to the stress control part was 0.5 mm.

Each of the magnetostrictive parts produced in Example I-1 and Example I-4 was used as the magnetostrictive element section 31. Although the widths were the same as those of Examples I-1 and I-4, respectively, the length was changed to 30 mm.

The magnetostrictive part 31*a* was fixed to a 0.5 mm-thick portion corresponding to the stress control part 31*b* of the frame 35 by an adhesive to form the magnetostrictive element section 31. Both ends of the magnetostrictive element section 31 was reinforced by bonding L-shaped CFRP. Subsequently, 7 g of tungsten anchor 32 was fixed next to the magnetostrictive element section 31.

NdFeB magnets 34 were fixed at two positions in the magnetostrictive part for applying bias magnetic field. The excitation apparatus was excited at 0.5 G, and peak-voltage at resonant frequency was measured by an oscilloscope. The resonant frequency ranged from 150 to 250 Hz. The results are shown in Table 8.

TABLE 8

| | Peak Voltage (mV) |
|---|---|
| Magnetostrictive Element of Example I-1 | 710 |
| Magnetostrictive Element of Example I-4 | 510 |

As apparent from the results of Table 8, the device using the magnetostrictive element of the present invention showed a power generation performance of 500 mV or more in response to the external vibration. Further, the magnetostrictive element of Example I-1 which uses a grain-oriented electrical steel sheet as the magnetostrictive part achieved a higher peak voltage than the magnetostrictive element of Example I-4 which uses a non-oriented electrical steel sheet as the magnetostrictive part.

Example I-9

Power Generation Using a Switch-Type Power Supply

Lighting test of LED bulbs was carried out using the magnetostrictive element produced in Example I-1. Copper wire was directly connected to the LED bulb from the detection coil of the measurement unit shown in FIG. 1. The LED bulbs used were thirty white LED bulbs arranged in series in a ring shape on a substrate with an outer diameter of 60 mm and an inner diameter of 50 mm, and the rated power was 2.4 W. After pushing down the free end of the magnetostrictive element for about 2 mm with a finger while applying a bias magnetic field of 2800 A/m (35 Oe), the finger was removed so that the magnetostrictive element instantaneously returns to its original position by an elastic force. No anchor was attached. The lighting of the LED bulbs by the above operation was visually confirmed.

Figure 4:
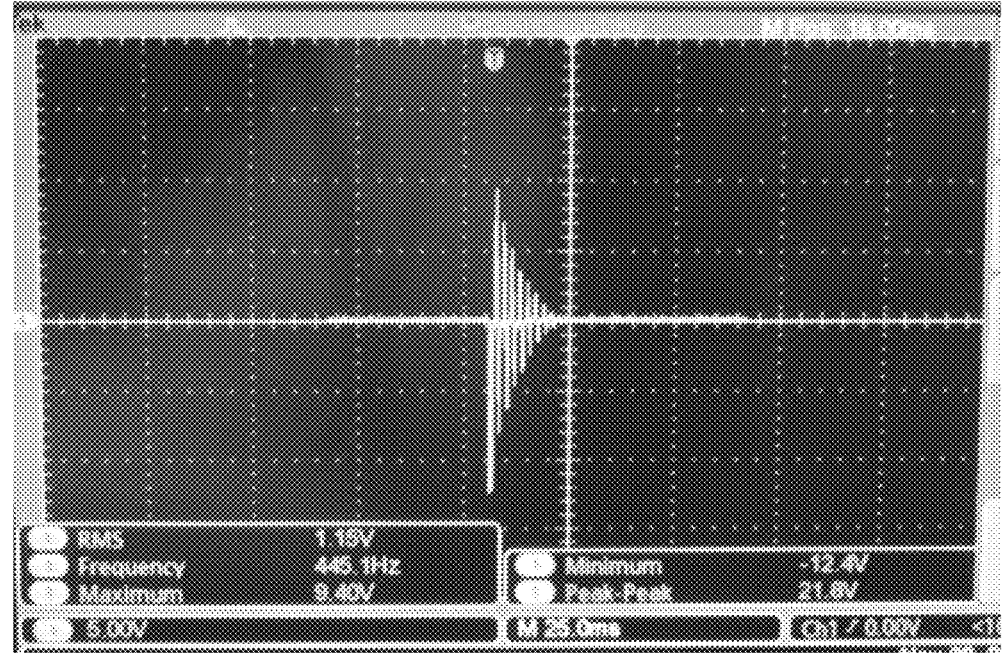
FIG. 4 is a voltage attenuation waveform for the experiment in Example I-9 where vibration was performed in a single switching manner.

In addition, by connecting the copper wire from the detection coil directly to the oscilloscope, the attenuation waveform of the voltage was measured. The measured waveform is shown in FIG. 4. The difference between the maximum voltage and the minimum voltage (P-P voltage) determined from the attenuation waveform of FIG. 4 was 21.8V. This result confirmed that the magnetostrictive element of Example I-1 can be used in a switch-type power supply.

Reference Example I-1

Conventional Magnetostrictive Element Using a FeCo Alloy as Magnetostrictive Material A button ingot with a composition Fe-69.5 mol % Co was prepared from a 99.9% pure electrolytic iron and a 99.9% pure granular cobalt by using an arc-melting furnace. The produced button ingot weighed 200 g.

Next, the button ingot was cut to obtain a sample for rolling having a height of 12 mm, a width of 10 mm, and a length of about 60 mm. The cut-out sample for rolling was kept at 1100° C. for 1 hour, then at 800° C. for 3 hours, and then water-cooled. The sample was then cold rolled to a height of 0.52 mm. Using the rolling direction of the cold-rolled material as a longitudinal direction, a specimen having a length of 40 mm, width of 6.0 mm, and a thickness of 0.52 mm was cut out for evaluation. The test specimen was subjected to heat treatment at 800° C. for 3 hours under vacuum to change the cold-rolled texture into recrystallized texture.

Figure 5:
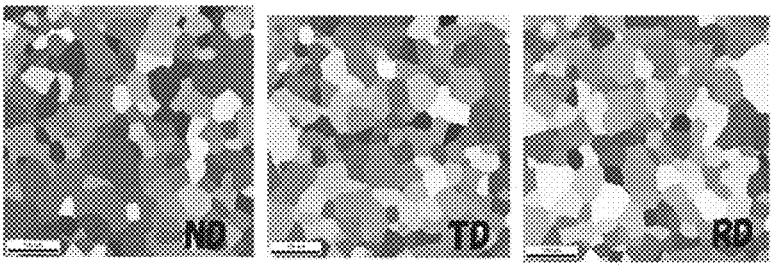
FIG. 5 is a result of observation of a crystallographic orientation of a FeCo alloy produced in Reference Example.
Figure 5:
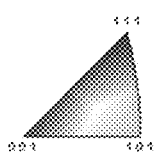

FIG. 5 shows the crystallographic orientation of the recrystallized test specimen which is the results of observation using EBSD. The results show that the <100> orientation is the preferred orientation in the rolling direction (RD), direction perpendicular to the rolling plane (ND), and the width direction (TD). When saturation magnetostriction was measured by attaching a strain gauge to the test specimen, the saturation magnetostriction was 96 ppm.

A magnetostrictive element was produced using the above-prepared FeCo alloy as a magnetostrictive material. A CFRP having a thickness of 0.5 mm, which is a non-magnetic material, was used as an elastic material constituting the stress control part. The direction of the carbon fibers was taken as the longitudinal direction and the CFRP sheet was cut into 40 mm in length and 6.5 mm in width, thereby obtaining a stress control part.

Next, the FeCo alloy and the CFRP were bonded together at room temperature using an epoxy-based adhesive to obtain a magnetostrictive element. The obtained magnetostrictive element was integrated into the measurement unit shown in FIG. 1, and the magnetic flux density change $\Delta B$ was measured in the same manner as in Example I-1. Specifically, the magnetostrictive element was fixed at its left end with the magnetostrictive part being the lower side so that compressive strain will be applied to the magnetostrictive part when the right end portion is pushed downward. The applied bias magnetic field was set at 3200 A/m (40 Oe).

The magnetostrictive element before pushing downward the right end portion thereof, i.e., under a state without any bending strain, was used as a reference to measure the depth $\Delta h$ (mm) of the pushed magnetostrictive element and the magnetic flux density change $\Delta B$ in this instance. The results are shown in Table 9.

TABLE 9

| Depth of Push $\Delta h$ (mm) | 0 | 0.5 | 1.0 | 1.5 | 2.0 |
|---|---|---|---|---|---|
| Magnetic Flux Density Change $\Delta B$ (T) | 0 | 0.05 | 0.10 | 0.15 | 0.16 |

As apparent from the results of Table 9, the magnetostrictive element of the Reference Example obtained by laminating the FeCo alloy as the magnetostrictive part and the non-magnetic material as the stress control part showed a magnetic flux density change $\Delta B$ that increases with the increase in pushed depth $\Delta h$. The magnitude of $\Delta B$ was smaller than that of the electrical steel sheet used in Example I-1 although the saturation magnetostriction of the FeCo alloy was 96 ppm, which is approximately 10 times larger than the saturation magnetostriction of the electrical steel sheet.

Example II <Examples Using Materials with Specific Young's Modulus and Sheet Thickness>

II-1. Evaluation of Materials
II-1-1. Young's Modulus
Young's modulus of each of the magnetostrictive materials and the elastic materials used in the magnetostrictive elements was measured by the following method. Stress-strain curve was measured by a tensile test, and Young's modulus was determined from the slope of the elastic region.

II-1-2. Sheet Thickness

Sheet thickness of each of the magnetostrictive materials and the elastic materials used in the magnetostrictive elements was measured by the following method. The sheet thickness was measured using a micrometer with a tip having a planar shape.

II-1-3. Relationship Between Equation (1) and Equation (2)

Whether or not the Young's modulus and sheet thickness of each of the magnetostrictive materials and the elastic materials used in the magnetostrictive elements satisfy the relationships represented by the following Equation (1) and Equation (2) was determined. Regarding the relationship of Equation (2), the value of Equation (2-1) below was calculated.

$$Em < Es \tag{1}$$

$$1.1 \leq \frac{Es \times ts^2}{Em \times tm^2} \tag{2}$$

$$\frac{Es \times ts^2}{Em \times tm^2} \tag{2-1}$$

(In the equation, $Em$ is the Young's modulus [GPa] of the magnetostrictive material, $tm$ is the sheet thickness [mm] of the magnetostrictive material, $Es$ is the Young's modulus [GPa] of the elastic material, $ts$ is the sheet thickness [mm] of the elastic material.)

II-2. Evaluation of Magnetostrictive Element for Power Generation

Magnetostrictive elements were evaluated based on the value of the magnetic flux density change $\Delta B$ and the value of the generated voltage.

II-2-1. Measurement of the Magnetic Flux Density Change $\Delta B$ of the Magnetostrictive Element The magnetic flux density change $\Delta B$ was measured in the same manner as "I-1-1. Measurement using the measurement unit of FIG. 1" of Example I by using the measurement unit 10 shown in FIG. 1.

II-2-2. Measurement of Generated Voltage

The generated voltage was measured in the same manner as "I-2-1. Measurement of generated voltage at the time of application of dynamic vibration to magnetostrictive element" of Example I by using the measurement unit shown in FIG. 1 which applies a bending strain to the magnetostrictive element.

Examples II A-1 to A-11 and Examples II B-1 to B-3

Magnetostrictive Elements Containing a Grain-Oriented Electrical Steel Sheet and a Non-Magnetic material As a magnetostrictive material constituting the magnetostrictive part, a grain-oriented electrical steel sheet 27ZH100 (manufactured by Nippon Steel Corporation) with coating, was used. The thickness of the electrical steel sheet was 0.27 mm and the crystallographic orientation was {110}<100> GOSS texture. The longitudinal direction of the grain-oriented electrical steel sheet was taken as the <100> direction and was cut into 40 mm in length and 6.1 mm in width by shearing. The sheet was annealed at 800° C. for 2 hours under vacuum for removing the strain caused during the cutting, thereby obtaining a grain-oriented electrical steel sheet for magnetostrictive part.

As an elastic material constituting the stress control part, carbon fiber-reinforced plastic (CFRP) sheets, which are non-magnetic materials, having a thickness of 0.1 to 1.1 mm were individually used. The direction of the carbon fibers was taken as the longitudinal direction and each CFRP sheet was cut into 40 mm in length and 6.5 mm in width, thereby obtaining a non-magnetic material for the stress control part.

The above-mentioned grain-oriented electrical steel sheet and the CFRP were bonded together at room temperature using an epoxy-based adhesive to obtain a magnetostrictive element. In this instance, the adhesive was applied so that the thickness of the adhesive was in the range of 35 to 40 μm. The thickness of the adhesive was controlled by making the weight of the applied adhesive to a constant value based on the change in weight after the application of the adhesive. The volume of the adhesive was calculated as adhesive area×thickness, and applied weight was obtained by multiplying the specific gravity to volume.

The obtained magnetostrictive element was integrated into the measurement unit shown in FIG. 1, and the magnetic flux density change $\Delta B$ was measured at the time of application of a bending strain to the magnetostrictive element. Specifically, the magnetostrictive element was fixed at its left end with the magnetostrictive part being the lower side so that compressive strain will be applied to the magnetostrictive part when the right end portion is pushed downward. The applied bias magnetic field was set at 2800 A/m (35 Oe).

The magnetostrictive element before pushing downward the right end portion thereof, i.e., under a state without any bending strain, was used as a reference to set the depth $\Delta h$ (mm) of the pushed magnetostrictive element to 2 mm, and the magnetic flux density change $\Delta B$ in this instance was measured. In addition, the increase in $\Delta B$ was calculated using the value of $\Delta B$ for the element with the 0.10 mm-thick CFRP (Example II B-1) as a reference. The results are shown in Table 10.

TABLE 10

| | Elastic Material (CFRP) | | Magnetostrictive Material (Grain-Oriented Electrical Steel Sheet) | | | Equation | | | |
|---|---|---|---|---|---|---|---|---|---|
| | Sheet Thickness | Young's Modulus | Sheet Thickness | Young's Modulus | Equation | Equation (2-1) | (2) $1.1 \leq$ | $\Delta B$ (T) | Increase |
| No. | ts (mm) | Es (GPa) | tm (mm) | Em (GPa) | (1) $Em < Es$ | $\frac{Es \times ts^2}{Em \times tm^2}$ | $\frac{Es \times ts^2}{Em \times tm^2}$ | ($\Delta h = 2$ mm) | in $\Delta B$ (%) |
| Example IIB-1 | 0.10 | 540 | 0.27 | 126 | yes | 0.6 | no | 0.23 | 0 |
| Example IIB-2 | 0.12 | 540 | 0.27 | 126 | yes | 0.8 | no | 0.25 | 8.7 |
| Example IIB-3 | 0.13 | 540 | 0.27 | 126 | yes | 1.0 | no | 0.27 | 17.4 |
| Example IIA-1 | 0.14 | 540 | 0.27 | 126 | yes | 1.2 | yes | 0.35 | 52.2 |

TABLE 10-continued

| No. | Elastic Material (CFRP) | | Magnetostrictive Material (Grain-Oriented Electrical Steel Sheet) | | Equation | | | | |
| | Sheet Thickness ts (mm) | Young's Modulus Es (GPa) | Sheet Thickness tm (mm) | Young's Modulus Em (GPa) | Equation (1) Em < Es | Equation (2-1) $\frac{Es \times ts^2}{Em \times tm^2}$ | Equation (2) $1.1 \leq \frac{Es \times ts^2}{Em \times tm^2}$ | ΔB (T) (Δh = 2 mm) | Increase in ΔB (%) |
|---|---|---|---|---|---|---|---|---|---|
| Example IIA-2 | 0.16 | 540 | 0.27 | 126 | yes | 1.5 | yes | 0.37 | 60.9 |
| Example IIA-3 | 0.18 | 540 | 0.27 | 126 | yes | 1.9 | yes | 0.38 | 65.2 |
| Example IIA-4 | 0.20 | 540 | 0.27 | 126 | yes | 2.4 | yes | 0.40 | 73.9 |
| Example IIA-5 | 0.22 | 540 | 0.27 | 126 | yes | 2.8 | yes | 0.44 | 91.3 |
| Example IIA-6 | 0.30 | 540 | 0.27 | 126 | yes | 5.3 | yes | 0.44 | 91.3 |
| Example IIA-7 | 0.40 | 540 | 0.27 | 126 | yes | 9.4 | yes | 0.44 | 91.3 |
| Example IIA-8 | 0.50 | 540 | 0.27 | 126 | yes | 14.7 | yes | 0.44 | 91.3 |
| Example IIA-9 | 0.70 | 540 | 0.27 | 126 | yes | 28.8 | yes | 0.45 | 95.7 |
| Example IIA-10 | 0.90 | 540 | 0.27 | 126 | yes | 47.6 | yes | 0.45 | 95.7 |
| Example IIA-11 | 1.10 | 540 | 0.27 | 126 | yes | 71.1 | yes | 0.45 | 95.7 |

As apparent from Table 10, when the value obtained by Equation (2-1) is 1.1 or more, ΔB increased by 50% or more as compared to the case where the value obtained by Equation (2-1) is less than 1.1. Further, when the value obtained by the Equation (2-1) becomes 2.8 or more, the increase in ΔB became even larger to 90% or more. Since the position of the neutral surface moves further away from the magnetostrictive part as the value represented by Equation (2) increases, more uniform strain is applied to the magnetostrictive part and such condition is considered to contribute to the above-mentioned results.

Examples II A-12 and A-13 and Example II B-4

Each of the magnetostrictive elements of the above Example II B-3, Example II A-3, and Example II A-8 was produced in decuplicate. Here, application of an epoxy-based adhesive was performed with a spatula, and the thickness of the adhesive was confirmed only by visual observation, and procedures for equalizing the thickness was omitted.

In each Example or Comparative Example, voltage generated by each of the ten magnetostrictive elements was measured using the measurement unit shown in FIG. 1.

The measurement unit with the magnetostrictive element installed therein and the aluminum frame having the measurement unit mounted thereon were placed on top of an excitation apparatus, and a dynamic strain was applied to the magnetostrictive element. Here, a cylinder head was removed from a micrometer installed at the end opposite to the fixed end of the magnetostrictive element, and a tungsten anchor was fixed thereto. The weight of the anchor was adjusted so that vibration amplitude will be about 1.3 mm.

The excitation apparatus was vibrated at 10 Hz with an acceleration of 1 G, and voltage (mV) was individually measured for each of the ten magnetostrictive elements. Regarding the measured voltage values, the minimum value, maximum value, average value of the ten magnetostrictive elements, and the difference between the maximum value and the minimum value were determined. These values are summarized in Table 11 along with the value determined by Equation (2-1).

TABLE 11

| No. | Magnetostrictive Element | Weight of Anchor (g) | Maximum Voltage (mV) | Minimum Voltage (mV) | Average Voltage (mV) | Difference between Maximum and Minimum (mV) | Equation (2-1) $\frac{Es \times ts^2}{Em \times tm^2}$ |
|---|---|---|---|---|---|---|---|
| Example II B-4 | Magnetostrictive Element of Example II B-3 | 47 | 42 | 29 | 35 | 13 | 1.0 |
| Example II A-12 | Magnetostrictive Element of Example II A-3 | 72 | 60 | 55 | 57 | 5 | 1.9 |
| Example II A-13 | Magnetostrictive Element of Example II A-8 | 150 | 69 | 67 | 68 | 2 | 14.7 |

As apparent from Table 11, in Example II A-12 where the value obtained by Equation (2-1) is 1.1 or more, the variation in voltage among ten magnetostrictive elements was as small as 5 mV even when the thickness of the adhesive was not controlled strictly. Furthermore, in Example II A-13 where the value obtained by Equation (2-1) is 2.8 or more, the variation in voltage among ten magnetostrictive elements was even smaller, namely 2 mV. On the other hand, in Example II B-4 where the value obtained by Equation (2-1) is less than 1.1, the variation in voltage among ten magnetostrictive elements was 13 mV.

The reason for such a result is considered as follows. When the value obtained by Equation (2-1) is less than 1.1, the neutral surface is located near the boundary between the magnetostrictive material and the elastic material, and the transmission of stress from the elastic material to the magnetostrictive material is greatly affected by the variations in the thickness of the adhesive used for bonding. When the value obtained by Equation (2-1) becomes 1.1 or more, the transmission of stress from the elastic material to the magnetostrictive material is less affected by the variations in the thickness of the adhesive, and as a result, the variation in the generated voltage is considered to be reduced. This effect is more remarkable when the value obtained by the Equation (2-1) becomes 2.8 or more.

Examples II A-14 to A-26 and Examples II B-5 to B-7

Magnetostrictive Element Containing a Grain-Oriented Electrical Steel Sheet and a Non-Magnetic Material As a magnetostrictive material constituting the magnetostrictive part, a grain-oriented electrical steel sheet 27ZH100 (manufactured by Nippon Steel Corporation) with coating, was used. The thickness of the electrical steel sheet was 0.27 epoxy-based adhesive to obtain a magnetostrictive element. In this instance, the adhesive was applied so that the thickness of the adhesive was in the range of 35 to 40 µm.

The obtained magnetostrictive element was integrated into the measurement unit shown in FIG. 1, and the magnetic flux density change ΔB was measured at the time of application of a bending strain to the magnetostrictive element. Specifically, the magnetostrictive element was fixed at its left end with the magnetostrictive part being the lower side so that compressive strain will be applied to the magnetostrictive part when the right end portion is pushed downward. The applied bias magnetic field was set at 2800 A/m (35 Oe).

The magnetostrictive element before pushing downward the right end portion thereof, i.e., under a state without any bending strain, was used as a reference to set the depth Δh (mm) of the pushed magnetostrictive element to 2 mm, and the magnetic flux density change ΔB in this instance was measured. In addition, the increase in ΔB was calculated using the value of ΔB for the element with the 0.17 mm-thick SUS304 (Example II B-5) as a reference. The results are shown in Table 12.

TABLE 12

| | Elastic Material (SUS304) | | Magnetostrictive Material (Grain-Oriented Electrical Steel Sheet) | | | | | | |
|---|---|---|---|---|---|---|---|---|---|
| No. | Sheet Thickness ts (mm) | Young's Modulus Es (GPa) | Sheet Thickness tm (mm) | Young's Modulus Em (GPa) | Equation (1) Em < Es | Equation (2-1) $\frac{Es \times ts^2}{Em \times tm^2}$ | $1.1 \leq$ $\frac{Es \times ts^2}{Em \times tm^2}$ | ΔB (T) (Δh = 2 mm) | Increase in ΔB (%) |
| Example II B-5 | 0.17 | 197 | 0.27 | 126 | yes | 0.6 | no | 0.22 | 0 |
| Example II B-6 | 0.19 | 197 | 0.27 | 126 | yes | 0.8 | no | 0.24 | 9.1 |
| Example II B-7 | 0.22 | 197 | 0.27 | 126 | yes | 1.0 | no | 0.26 | 18.2 |
| Example II A-14 | 0.23 | 197 | 0.27 | 126 | yes | 1.1 | yes | 0.34 | 54.5 |
| Example II A-15 | 0.26 | 197 | 0.27 | 126 | yes | 1.4 | yes | 0.36 | 63.6 |
| Example II A-16 | 0.29 | 197 | 0.27 | 126 | yes | 1.8 | yes | 0.37 | 68.2 |
| Example II A-17 | 0.34 | 197 | 0.27 | 126 | yes | 2.5 | yes | 0.39 | 77.3 |
| Example II A-18 | 0.36 | 197 | 0.27 | 126 | yes | 2.8 | yes | 0.42 | 90.9 |
| Example II A-19 | 0.40 | 197 | 0.27 | 126 | yes | 3.4 | yes | 0.43 | 95.5 |
| Example II A-20 | 0.50 | 197 | 0.27 | 126 | yes | 5.4 | yes | 0.43 | 95.5 |
| Example II A-21 | 0.70 | 197 | 0.27 | 126 | yes | 10.5 | yes | 0.43 | 95.5 |
| Example II A-22 | 0.90 | 197 | 0.27 | 126 | yes | 17.4 | yes | 0.43 | 95.5 |
| Example II A-23 | 1.20 | 197 | 0.27 | 126 | yes | 30.9 | yes | 0.44 | 100.0 |
| Example II A-24 | 1.50 | 197 | 0.27 | 126 | yes | 48.3 | yes | 0.44 | 100.0 |
| Example II A-25 | 1.90 | 197 | 0.27 | 126 | yes | 77.4 | yes | 0.45 | 104.5 |
| Example II A-26 | 2.10 | 197 | 0.27 | 126 | yes | 94.6 | yes | 0.45 | 104.5 | mm and the crystallographic orientation was {110}<100> GOSS texture. The longitudinal direction of the grain-oriented electrical steel sheet was taken as the <100> direction and was cut into 40 mm in length and 5.8 mm in width by shearing. The sheet was annealed at 800° C. for 2 hours under vacuum for removing the strain caused during the cutting, thereby obtaining a grain-oriented electrical steel sheet for magnetostrictive part.

As a non-magnetic material constituting the stress-control part, SUS304, cold-rolled sheets having a thickness of 0.17 to 2.1 mm were individually used. Each sheet was cut into a length of 40 mm and a width of 6.5 mm, held in a vacuum at 1050° C. for 1 minute, and subjected to a solid solution treatment by gas quenching for removing the influence of cutting strain, thereby obtaining a non-magnetic material for stress control part.

The above-mentioned oriented electrical steel sheet and SUS304 were bonded together at room temperature using an As apparent from Table 10, when the value obtained by Equation (2-1) is 1.1 or more, ΔB increased by 50% or more as compared to the case where the value obtained by Equation (2-1) is less than 1.1. Further, when the value obtained by the Equation (2-1) becomes 2.8 or more, the increase in ΔB became even larger to 90% or more. Since the position of the neutral surface moves further away from the magnetostrictive part as the value represented by Equation (2-1) increases, more uniform strain is applied to the magnetostrictive part and such condition is considered to contribute to the above-mentioned results.

Examples II A-27 and A-28 and Example II B-8

Each of the magnetostrictive elements of the above Example II B-7, Example II A-16, and Example II A-20 was produced in decuplicate. Here, application of an epoxy-based adhesive was performed with a spatula, and the thickness of the adhesive was confirmed only by visual observation, and procedures for equalizing the thickness was omitted.

In each Example or Comparative Example, voltage generated by each of the ten magnetostrictive elements was measured using the measurement unit shown in FIG. 1.

The measurement unit with the magnetostrictive element installed therein and the aluminum frame having the measurement unit mounted thereon were placed on top of an excitation apparatus, and a dynamic strain was applied to the magnetostrictive element. Here, a cylinder head was removed from a micrometer installed at the end opposite to the fixed end of the magnetostrictive element, and a tungsten anchor was fixed thereto. The weight of the anchor was adjusted so that vibration amplitude will be about 1.5 mm.

The excitation apparatus was vibrated at 10 Hz with an acceleration of 1 G, and voltage (mV) was individually measured for each of the ten magnetostrictive elements. Regarding the measured voltage values, the minimum value, maximum value, average value of the ten magnetostrictive elements, and the difference between the maximum value and the minimum value were determined. These values are summarized in Table 13 along with the value determined by Equation (2-1).

generated voltage is considered to be reduced. This effect is more remarkable when the value obtained by the Equation (2-1) becomes 2.8 or more.

Examples II A-29 to II A-37 and Comparative Examples II-1 to II-4

Magnetostrictive Element Containing a Single-Crystal FeGa Alloy and a Non-Magnetic Material As a magnetostrictive material constituting the magnetostrictive part, a commercially available single-crystal FeGa alloy was used. The FeGa alloy had a thickness of 0.5 mm and was cut into a length of 40 mm and a width of 6 mm. For removing the strain caused during the cutting, the sheet was held at 800° C. for 2 hours and, then cooled by blowing Ar gas thereto.

As an elastic material constituting the stress control part, carbon fiber-reinforced plastic (CFRP) sheets, which are non-magnetic materials, having a thickness of 0.1 to 1.1 mm were individually used. The direction of the carbon fibers was taken as the longitudinal direction and each CFRP sheet was cut into 40 mm in length and 6.5 mm in width, thereby obtaining a non-magnetic material for the stress control part.

The above-mentioned FeGa alloy and the CFRP were bonded together at room temperature using an epoxy-based

TABLE 13

| No. | Magnetostrictive Element | Weight of Anchor (g) | Maximum Voltage (mV) | Minimum Voltage (mV) | Average Voltage (mV) | Difference between Maximum and Minimum (mV) | Equation $\dfrac{Es \times ts^2}{Em \times tm^2}$ |
|---|---|---|---|---|---|---|---|
| Example II B-8 | Magnetostrictive Element of Comparative ExampleII-7 | 40 | 43 | 31 | 37 | 12 | 1.0 |
| Example II A-27 | Magnetostrictive Element of Example II-16 | 57 | 64 | 58 | 61 | 6 | 1.8 |
| Example II A-28 | Magnetostrictive Element of Example II-20 | 100 | 75 | 72 | 74 | 3 | 5.4 |

As apparent from Table 13, in Example II A-27 where the value obtained by Equation (2-1) is 1.1 or more, the variation in voltage among ten magnetostrictive elements was as small as 6 mV even when the thickness of the adhesive was not controlled strictly. Furthermore, in Example II A-28 where the value obtained by Equation (2-1) is 2.8 or more, the variation in voltage among ten magnetostrictive elements was even smaller, namely 3 mV. On the other hand, in Example II B-8 where the value obtained by Equation (2-1) is less than 1.1, the variation in voltage among ten magnetostrictive elements was 12 mV.

The reason for such a result is considered as follows. When the value obtained by Equation (2-1) is less than 1.1, the neutral surface is located near the boundary between the magnetostrictive material and the elastic material, and the transmission of stress from the elastic material to the magnetostrictive material is greatly affected by the variations in the thickness of the adhesive used for bonding. When the value obtained by Equation (2-1) becomes 1.1 or more, the transmission of stress from the elastic material to the magnetostrictive material is less affected by the variations in the thickness of the adhesive, and as a result, the variation in the adhesive to obtain a magnetostrictive element. In this instance, the adhesive was applied so that the thickness of the adhesive was in the range of 35 to 40 μm.

The obtained magnetostrictive element was integrated into the measurement unit shown in FIG. 1, and the magnetic flux density change ΔB was measured at the time of application of a bending strain to the magnetostrictive element. Specifically, the magnetostrictive element was fixed at its left end with the magnetostrictive part being the lower side so that compressive strain will be applied to the magnetostrictive part when the right end portion is pushed downward. The applied bias magnetic field was set at 3200 A/m (40 Oe).

The magnetostrictive element before pushing downward the right end portion thereof, i.e., under a state without any bending strain, was used as a reference to set the depth Δh (mm) of the pushed magnetostrictive element to 2 mm, and the magnetic flux density change ΔB in this instance was measured. In addition, the increase in ΔB was calculated using the value of ΔB for the element with the 0.10 mm-thick CFRP (Comparative Example II-1) as a reference. The results are shown in Table 14.

TABLE 14

| No. | Elastic Material (CFRP) | | Magnetostrictive Material (FeGa Alloy) | | Equation (1) Em < Es | Equation (2-1) $\dfrac{Es \times ts^2}{Em \times tm^2}$ | Equation (2) $1.1 \leq \dfrac{Es \times ts^2}{Em \times tm^2}$ | ΔB (T) (Δh = 2 mm) | Increase in ΔB (%) |
|---|---|---|---|---|---|---|---|---|---|
| | Sheet Thickness ts (mm) | Young's Modulus Es (GPa) | Sheet Thickness tm (mm) | Young's Modulus Em (GPa) | | | | | |
| Comparative Example II-1 | 0.10 | 540 | 0.50 | 77 | yes | 0.3 | no | 0.21 | 0 |
| Comparative Example II-2 | 0.13 | 540 | 0.50 | 77 | yes | 0.5 | no | 0.23 | 9.5 |
| Comparative Example II-3 | 0.16 | 540 | 0.50 | 77 | yes | 0.7 | no | 0.24 | 14.3 |
| Comparative Example II-4 | 0.18 | 540 | 0.50 | 77 | yes | 0.9 | no | 0.25 | 19.0 |
| Example IIA-29 | 0.20 | 540 | 0.50 | 77 | yes | 1.1 | yes | 0.32 | 52.4 |
| Example IIA-30 | 0.22 | 540 | 0.50 | 77 | yes | 1.4 | yes | 0.35 | 66.7 |
| Example IIA-31 | 0.25 | 540 | 0.50 | 77 | yes | 1.8 | yes | 0.36 | 71.4 |
| Example IIA-32 | 0.30 | 540 | 0.50 | 77 | yes | 2.5 | yes | 0.37 | 76.2 |
| Example IIA-33 | 0.32 | 540 | 0.50 | 77 | yes | 2.9 | yes | 0.40 | 90.5 |
| Example IIA-34 | 0.50 | 540 | 0.50 | 77 | yes | 7.0 | yes | 0.40 | 90.5 |
| Example IIA-35 | 0.70 | 540 | 0.50 | 77 | yes | 13.7 | yes | 0.40 | 90.5 |
| Example IIA-36 | 0.90 | 540 | 0.50 | 77 | yes | 22.7 | yes | 0.40 | 90.5 |
| Example IIA-37 | 1.10 | 540 | 0.50 | 77 | yes | 33.9 | yes | 0.41 | 95.2 |

As apparent from Table 14, when the value obtained by Equation (2-1) is 1.1 or more, AB increased by 50% or more as compared to the case where the value obtained by Equation (2-1) is less than 1.1. Further, when the value obtained by the Equation (2-1) becomes 2.8 or more, the increase in ΔB became even larger to 90% or more. Since the position of the neutral surface moves further away from the magnetostrictive part as the value represented by Equation (2-1) increases, more uniform strain is applied to the magnetostrictive part and such condition is considered to contribute to the above-mentioned results.

Examples II A-38 to A-39 and Comparative Example II-5

Each of the magnetostrictive elements of the above Comparative Example II-3, Example II A-31 and Example II A-35 using the FeGa alloy as the magnetostrictive material was produced in decuplicate. Here, application of an epoxy-based adhesive was performed with a spatula, and the thickness of the adhesive was confirmed only by visual observation, and procedures for equalizing the thickness was omitted.

In each Example or Comparative Example, voltage generated by each of the ten magnetostrictive elements was measured using the measurement unit shown in FIG. 1.

The measurement unit with the magnetostrictive element installed therein and the aluminum frame having the measurement unit mounted thereon were placed on top of an excitation apparatus, and a dynamic strain was applied to the magnetostrictive element. Here, a cylinder head was removed from a micrometer installed at the end opposite to the fixed end of the magnetostrictive element, and a tungsten anchor was fixed thereto. The weight of the anchor was adjusted so that vibration amplitude will be about 1.3 mm.

The excitation apparatus was vibrated at 10 Hz with an acceleration of 1 G, and voltage (mV) was individually measured for each of the ten magnetostrictive elements. Regarding the measured voltage values, the minimum value, maximum value, average value of the ten magnetostrictive elements, and the difference between the maximum value and the minimum value were determined. These values are summarized in Table 15 along with the value determined by Equation (2-1).

TABLE 15

| No. | Magnetostrictive Element | Weight of Anchor (g) | Maximum Voltage (mV) | Minimum Voltage (mV) | Average Voltage (mV) | Difference between Maximum and Minimum (mV) | Equation $\dfrac{Es \times ts^2}{Em \times tm^2}$ |
|---|---|---|---|---|---|---|---|
| Comparative Example II-5 | Magnetostrictive Element of Comparative Example II-3 | 52 | 37 | 23 | 30 | 14 | 0.7 |
| Example II A-38 | Magnetostrictive Element of Example II A-31 | 78 | 55 | 49 | 52 | 6 | 1.8 |
| Example II A-39 | Magnetostrictive Element of Example II A-35 | 190 | 63 | 60 | 62 | 3 | 13.7 |

As apparent from Table 15, in Example II A-38 where the value obtained by Equation (2-1) is 1.1 or more, the variation in voltage among ten magnetostrictive elements was as small as 6 mV even when the thickness of the adhesive was not controlled strictly. Furthermore, in Example II A-39 where the value obtained by Equation (2-1) is 2.8 or more, the variation in voltage among ten magnetostrictive elements was even smaller, namely 3 mV. On the other hand, in Comparative Example II-5 where the value obtained by Equation (2-1) is less than 1.1, the variation in voltage among ten magnetostrictive elements was 14 mV.

The reason for such a result is considered as follows. When the value obtained by Equation (2-1) is less than 1.1, the neutral surface is located near the boundary between the magnetostrictive material and the elastic material, and the transmission of stress from the elastic material to the magnetostrictive material is greatly affected by the variations in the thickness of the adhesive used for bonding. When the value obtained by Equation (2-1) becomes 1.1 or more, the transmission of stress from the elastic material to the magnetostrictive material is less affected by the variations in the thickness of the adhesive, and as a result, the variation in the generated voltage is considered to be reduced. This effect is more remarkable when the value obtained by the Equation (2-1) becomes 2.8 or more.

Examples II A-40 to A-48 and Comparative Examples II-6 to II-8

Magnetostrictive Element Containing a Single-Crystal FeCo Alloy and a Non-Magnetic Material A FeCo alloy was produced as a magnetostrictive material for constituting a magnetostrictive part. A button ingot with a composition Fe-69.5 mol % Co was prepared from a 99.9% pure electrolytic iron and a 99.9% pure granular cobalt by using an arc-melting furnace. The produced button ingot weighed 200 g.

Next, the button ingot was cut to obtain a sample for rolling having a height of 12 mm, a width of 10 mm, and a length of about 60 mm. The cut-out sample for rolling was kept at 1100° C. for 1 hour, then at 800° C. for 3 hours, and then water-cooled. The sample was then cold rolled to a height of 0.52 mm. Using the rolling direction of the cold-rolled material as a longitudinal direction, a specimen having a length of 40 mm, a width of 6.0 mm, and a thickness of 0.52 mm was cut out for evaluation.

The test specimen was kept under vacuum at 1100° C. for 10 minutes and, then the temperature was elevated to 800° C. and kept at 800° C. for 3 hours to change the cold-rolled texture into recrystallized texture. Crystallographic orientation of the recrystallized test specimen was observed using EBSD, and no specific preferred crystallographic orientation was observed. In addition, when saturation magnetostriction was measured by attaching a strain gauge to the test specimen, the saturation magnetostriction was 94 ppm.

The above-prepared FeCo alloy was used as a magnetostrictive material.

As an elastic material constituting the stress control part, carbon fiber-reinforced plastic (CFRP) sheets, which are non-magnetic materials, having a thickness of 0.1 to 1.1 mm were individually used. The direction of the carbon fibers was taken as the longitudinal direction and each CFRP sheet was cut into 40 mm in length and 6.5 mm in width, thereby obtaining a non-magnetic material for the stress control part.

The above-mentioned FeCo alloy and the CFRP were bonded together at room temperature using an epoxy-based adhesive to obtain a magnetostrictive element. In this instance, the adhesive was applied so that the thickness of the adhesive was in the range of 35 to 40 μm.

The obtained magnetostrictive element was integrated into the measurement unit shown in FIG. 1, and the magnetic flux density change ΔB was measured at the time of application of a bending strain to the magnetostrictive element. Specifically, the magnetostrictive element was fixed at its left end with the magnetostrictive part being the lower side so that compressive strain will be applied to the magnetostrictive part when the right end portion is pushed downward. The applied bias magnetic field was set at 3200 A/m (40 Oe).

The magnetostrictive element before pushing downward the right end portion thereof, i.e., under a state without any bending strain, was used as a reference to set the depth Δh (mm) of the pushed magnetostrictive element to 2 mm, and the magnetic flux density change ΔB in this instance was measured. In addition, the increase in ΔB was calculated using the value of ΔB for the element with the 0.10 mm-thick CFRP (Comparative Example II-8) as a reference. The results are shown in Table 16.

TABLE 16

| No. | Elastic Material (CFRP) | | Magnetostrictive Material (FeCo Alloy) | | Equation (1) $Em < Es$ | Equation (2-1) $\dfrac{Es \times ts^2}{Em \times tm^2}$ | $1.1 \leq \dfrac{Es \times ts^2}{Em \times tm^2}$ | ΔB (T) (Δh = 2 mm) | Increase in ΔB (%) |
|---|---|---|---|---|---|---|---|---|---|
| | Sheet Thickness ts (mm) | Young's Modulus Es (GPa) | Sheet Thickness tm (mm) | Young's Modulus Em (GPa) | | | | | |
| Comparative Example II-6 | 0.10 | 540 | 0.52 | 150 | yes | 0.1 | no | 0.04 | 0 |
| Comparative Example II-7 | 0.20 | 540 | 0.52 | 150 | yes | 0.5 | no | 0.05 | 25.0 |
| Comparative Example II-8 | 0.25 | 540 | 0.52 | 150 | yes | 0.8 | no | 0.05 | 25.0 |
| Example II A-40 | 0.29 | 540 | 0.52 | 150 | yes | 1.1 | yes | 0.07 | 75.0 |
| Example II A-41 | 0.38 | 540 | 0.52 | 150 | yes | 1.9 | yes | 0.07 | 75.0 |
| Example II A-42 | 0.4 | 540 | 0.52 | 150 | yes | 2.1 | yes | 0.08 | 100.0 |
| Example II A-43 | 0.42 | 540 | 0.52 | 150 | yes | 2.3 | yes | 0.10 | 150.0 |
| Example II A-44 | 0.46 | 540 | 0.52 | 150 | yes | 2.8 | yes | 0.14 | 250.0 |
| Example II A-45 | 0.65 | 540 | 0.52 | 150 | yes | 5.6 | yes | 0.14 | 250.0 |

TABLE 16-continued

| No. | Elastic Material (CFRP) Sheet Thickness ts (mm) | Young's Modulus Es (GPa) | Magnetostrictive Material (FeCo Alloy) Sheet Thickness tm (mm) | Young's Modulus Em (GPa) | Equation (1) $Em < Es$ | Equation (2-1) $\dfrac{Es \times ts^2}{Em \times tm^2}$ | $1.1 \leq \dfrac{Es \times ts^2}{Em \times tm^2}$ | ΔB (T) (Δh = 2 mm) | Increase in ΔB (%) |
|---|---|---|---|---|---|---|---|---|---|
| Example II A-46 | 0.75 | 540 | 0.52 | 150 | yes | 7.5 | yes | 0.14 | 250.0 |
| Example II A-47 | 0.90 | 540 | 0.52 | 150 | yes | 10.8 | yes | 0.14 | 250.0 |
| Example II A-48 | 1.10 | 540 | 0.52 | 150 | yes | 16.1 | yes | 0.14 | 250.0 |

As apparent from Table 16, when the value obtained by Equation (2-1) is 1.1 or more, ΔB increased by 50% or more as compared to the case where the value obtained by Equation (2-1) is less than 1.1. Further, when the value obtained by the Equation (2-1) becomes 2.8 or more, the increase in ΔB became even larger up to 250%. Since the position of the neutral surface moves further away from the magnetostrictive part as the value represented by Equation (2-1) increases, more uniform strain is applied to the magnetostrictive part and such condition is considered to contribute to the above-mentioned results.

Examples II A-49 and A-50 and Comparative
Example II-9

Each of the magnetostrictive elements of the above Comparative Example II-7, Example II A-42 and Example II A-46 using the FeCo alloy as the magnetostrictive material was produced in decuplicate. Here, application of an epoxy-based adhesive was performed with a spatula, and the thickness of the adhesive was confirmed only by visual observation, and procedures for equalizing the thickness was omitted.

In each Example or Comparative Example, voltage generated by each of the ten magnetostrictive elements was measured using the measurement unit shown in FIG. 1.

The measurement unit with the magnetostrictive element installed therein and the aluminum frame having the measurement unit mounted thereon were placed on top of an excitation apparatus, and a dynamic strain was applied to the magnetostrictive element. Here, a cylinder head was removed from a micrometer installed at the end opposite to the fixed end of the magnetostrictive element, and a tungsten anchor was fixed thereto. The weight of the anchor was adjusted so that vibration amplitude will be about 1.3 mm.

The excitation apparatus was vibrated at 10 Hz with an acceleration of 1 G, and voltage (mV) was individually measured for each of the ten magnetostrictive elements. Regarding the measured voltage values, the minimum value, maximum value, average value of the ten magnetostrictive elements, and the difference between the maximum value and the minimum value were determined. These values are summarized in Table 17 along with the value determined by Equation (2-1).

TABLE 17

| No. | Magnetostrictive Element | Weight of Anchor (g) | Maximum Voltage (mV) | Minimum Voltage (mV) | Average Voltage (mV) | Difference between Maximum and Minimum (mV) | Equation (2-1) $\dfrac{Es \times ts^2}{Em \times tm^2}$ |
|---|---|---|---|---|---|---|---|
| Comparative Example II-9 | Magnetostrictive Element of Comparative Example II-7 | 68 | 7 | 1 | 4 | 6 | 0.5 |
| Example II A-49 | Magnetostrictive Element of Example II A-42 | 126 | 12 | 8 | 10 | 4 | 2.1 |
| Example II A-50 | Magnetostrictive Element of Example II A-46 | 230 | 22 | 20 | 21 | 2 | 7.5 |

As apparent from Table 17, in Example II A-49 where the value obtained by Equation (2-1) is 1.1 or more, the variation in voltage among ten magnetostrictive elements was as small as 4 mV even when the thickness of the adhesive was not controlled strictly. Furthermore, in Example II A-50 where the value obtained by Equation (2-1) is 2.8 or more, the variation in voltage among ten magnetostrictive elements was even smaller, namely 2 mV. On the other hand, in Comparative Example II-9 where the value obtained by Equation (2-1) is less than 1.1, the variation in voltage among ten magnetostrictive elements was 6 mV, but the average voltage was 4 mV which is smaller than the variation.

The reason for such a result is considered as follows. When the value obtained by Equation (2-1) is less than 1.1, the neutral surface is located near the boundary between the magnetostrictive material and the elastic material, and the transmission of stress from the elastic material to the magnetostrictive material is greatly affected by the variations in the thickness of the adhesive used for bonding. When the value obtained by Equation (2-1) becomes 1.1 or more, the transmission of stress from the elastic material to the magnetostrictive material is less affected by the variations in the thickness of the adhesive, and as a result, the variation in the generated voltage is considered to be reduced. This effect is more remarkable when the value obtained by the Equation (2-1) becomes 2.8 or more.

Examples II A-51 to II A-59 and Comparative Examples II-10 to II-12

Magnetostrictive Element Containing a FeAl Alloy and a Non-Magnetic Material

FeAl alloy was produced as a magnetostrictive material for constituting a magnetostrictive part. A button ingot with a composition Fe-13 mass % Al was prepared from a 99.9% pure electrolytic iron and a 99.9% pure metal aluminum by using an arc-melting furnace. Dimensions of the button ingot was 60 mm in diameter and about 10 mm in thickness. The button ingot was cut in the thicknesswise direction into further cut out from the plate. A plurality of cut-out specimens were subjected to a heat treatment which includes heating under vacuum to 1000° C. at a rate of 20° C./minute, keeping at 1000° C. for 3 hours, and cooling to room temperature at a rate of 20° C./minute. Saturation magnetostriction value λs was measured by a strain gauge attached to the thus obtained specimen, and it was 40 ppm.

The FeAl alloy prepared above was used as a magnetostrictive material.

As an elastic material constituting the stress control part, carbon fiber-reinforced plastic (CFRP) sheets, which are non-magnetic materials, having a thickness of 0.1 to 1.1 mm were individually used. The direction of the carbon fibers was taken as the longitudinal direction and each CFRP sheet was cut into 40 mm in length and 6.5 mm in width, thereby obtaining a non-magnetic material for the stress control part.

The above-mentioned FeAl alloy and the CFRP were bonded together at room temperature using an epoxy-based adhesive to obtain a magnetostrictive element. In this instance, the adhesive was applied so that the thickness of the adhesive was in the range of 35 to 40 μm.

The obtained magnetostrictive element was integrated into the measurement unit shown in FIG. 1, and the magnetic flux density change ΔB was measured at the time of application of a bending strain to the magnetostrictive element. Specifically, the magnetostrictive element was fixed at its left end with the magnetostrictive part being the lower side so that compressive strain will be applied to the magnetostrictive part when the right end portion is pushed downward. The applied bias magnetic field was set at 3200 A/m (40 Oe).

The magnetostrictive element before pushing downward the right end portion thereof, i.e., under a state without any bending strain, was used as a reference to set the depth Δh (mm) of the pushed magnetostrictive element to 2 mm, and the magnetic flux density change ΔB in this instance was measured. In addition, the increase in ΔB was calculated using the value of ΔB for the element with the 0.10 mm-thick CFRP (Comparative Example II-10) as a reference. The results are shown in Table 18.

TABLE 18

| No. | Elastic Material (CFRP) Sheet Thickness ts (mm) | Young's Modulus Es (GPa) | Magnetostrictive Material (FeAl Alloy) Sheet Thickness tm (mm) | Young's Modulus Em (GPa) | Equation (1) Em < Es | Equation (2-1) $\frac{Es \times ts^2}{Em \times tm^2}$ | $1.1 \leq \frac{Es \times ts^2}{Em \times tm^2}$ | ΔB (T) (Δh = 2 mm) | Increase in ΔB (%) |
|---|---|---|---|---|---|---|---|---|---|
| Comparative Example II-10 | 0.10 | 540 | 0.50 | 125 | yes | 0.2 | no | 0.03 | 0 |
| Comparative Example II-11 | 0.18 | 540 | 0.50 | 125 | yes | 0.6 | no | 0.03 | 0.0 |
| Comparative Example II-12 | 0.22 | 540 | 0.50 | 125 | yes | 0.8 | no | 0.04 | 33.3 |
| Example II A-51 | 0.25 | 540 | 0.50 | 125 | yes | 1.1 | yes | 0.06 | 100.0 |
| Example II A-52 | 0.3 | 540 | 0.50 | 125 | yes | 1.6 | yes | 0.07 | 133.3 |
| Example II A-54 | 0.37 | 540 | 0.50 | 125 | yes | 2.4 | yes | 0.08 | 166.7 |
| Example II A-55 | 0.4 | 540 | 0.50 | 125 | yes | 2.8 | yes | 0.12 | 300.0 |
| Example II A-56 | 0.50 | 540 | 0.50 | 125 | yes | 4.3 | yes | 0.12 | 300.0 |
| Example II A-57 | 0.75 | 540 | 0.50 | 125 | yes | 9.7 | yes | 0.12 | 300.0 |
| Example II A-58 | 0.90 | 540 | 0.50 | 125 | yes | 14.0 | yes | 0.12 | 300.0 |
| Example II A-59 | 1.10 | 540 | 0.50 | 125 | yes | 20.9 | yes | 0.12 | 300.0 | a plate shape with a length of about 60 mm, a width of about 10 mm, and a thickness of 0.5 mm. A specimen with a length of 40 mm, a width of 6.0 mm, and a thickness of 0.5 mm was As apparent from Table 18, when the value obtained by Equation (2-1) is 1.1 or more, ΔB increased by 50% or more as compared to the case where the value obtained by Equation (2-1) is less than 1.1. Further, when the value obtained by the Equation (2-1) becomes 2.8 or more, the increase in ΔB became even larger up to 300%. Since the position of the neutral surface moves further away from the magnetostrictive part as the value represented by Equation (2-1) increases, more uniform strain is applied to the magnetostrictive part and such condition is considered to contribute to the above-mentioned results.

Examples II A-60 and II A-61 and Comparative Example II-13

Each of the magnetostrictive elements of the above Comparative Example II-11, Example II A-52 and Example II A-57 using the FeAl alloy as the magnetostrictive material was produced in decuplicate. Here, application of an epoxy-based adhesive was performed with a spatula, and the thickness of the adhesive was confirmed only by visual observation, and procedures for equalizing the thickness was omitted.

In each Example or Comparative Example, voltage generated by each of the ten magnetostrictive elements was measured using the measurement unit shown in FIG. 1.

The measurement unit with the magnetostrictive element installed therein and the aluminum frame having the measurement unit mounted thereon were placed on top of an excitation apparatus, and a dynamic strain was applied to the magnetostrictive element. Here, a cylinder head was removed from a micrometer installed at the end opposite to the fixed end of the magnetostrictive element, and a tungsten anchor was fixed thereto. The weight of the anchor was adjusted so that vibration amplitude will be about 1.3 mm.

The excitation apparatus was vibrated at 10 Hz with an acceleration of 1 G, and voltage (mV) was individually measured for each of the ten magnetostrictive elements. Regarding the measured voltage values, the minimum value, maximum value, average value of the ten magnetostrictive elements, and the difference between the maximum value and the minimum value were determined. These values are summarized in Table 19 along with the value determined by Equation (2-1).

the variation in voltage among ten magnetostrictive elements was even smaller, namely 2 mV. On the other hand, in Comparative Example II-13 where the value obtained by Equation (2-1) is less than 1.1, the variation in voltage among ten magnetostrictive elements was 4 mV, but the average voltage was 3 mV which is smaller than the variation.

The reason for such a result is considered as follows. When the value obtained by Equation (2-1) is less than 1.1, the neutral surface is located near the boundary between the magnetostrictive material and the elastic material, and the transmission of stress from the elastic material to the magnetostrictive material is greatly affected by the variations in the thickness of the adhesive used for bonding. When the value obtained by Equation (2-1) becomes 1.1 or more, the transmission of stress from the elastic material to the magnetostrictive material is less affected by the variations in the thickness of the adhesive, and as a result, the variation in the generated voltage is considered to be reduced. This effect is more remarkable when the value obtained by the Equation (2-1) becomes 2.8 or more.

Comparative Examples II-14 to II-22

Magnetostrictive Element that does not Satisfy the Relationship of Equation (1)

FeCo alloy which is same as that used in Example II A-40 was used as a magnetostrictive material for forming a magnetostrictive part. Specifically, a FeCo alloy having a length of 40 mm, a width of 6.0 mm, a thickness of 0.52 mm, and a Young's modulus of 150 Gpa was used.

As an elastic material constituting the stress control part, a commercially available thin sheet of 7-3 brass having a thickness of 2 mm was used. The thin sheets of brass was cut into a piece which is 40 mm in length and 6 mm in width and, then, surface was ground with a surface grinder to adjust the sheet thickness to 0.40 to 1.50 mm. Heat treatment after cutting and grinding was not carried out. The Young's modulus was 110 GPa.

Using a thin sheet of the above FeCo alloy and the of thin sheet of brass, a magnetostrictive element was produced in

TABLE 19

| No. | Magnetostrictive Element | Weight of Anchor (g) | Maximum Voltage (mV) | Minimum Voltage (mV) | Average Voltage (mV) | Difference between Maximum and Minimum (mV) | Equation (2-1) $\dfrac{Es \times ts^2}{Em \times tm^2}$ |
|---|---|---|---|---|---|---|---|
| Comparative Example II-13 | Magnetostrictive Element of Comparative Example II-11 | 57 | 5 | 1 | 3 | 4 | 0.6 |
| Example II A-60 | Magnetostrictive Element of Example II A-52 | 112 | 11 | 8 | 9 | 3 | 1.6 |
| Example II A-61 | Magnetostrictive Element of Example II A-57 | 210 | 18 | 16 | 17 | 2 | 9.7 |

As apparent from Table 19, in Example II A-60 where the value obtained by Equation (2-1) is 1.1 or more, the variation in voltage among ten magnetostrictive elements was as small as 3 mV even when the thickness of the adhesive was not controlled strictly. Furthermore, in Example II A-61 where the value obtained by Equation (2-1) is 2.8 or more, the same manner as in Example II A-40 and the magnetic flux density change ΔB was measured. In addition, the increase in ΔB was calculated using the value of ΔB for the element with the 0.40 mm-thick brass (Comparative Example II-14) as a reference. The results are shown in Table 20.

TABLE 20

| No. | Elastic Material (Brass) | | Magnetostrictive Material (FeCo Alloy) | | Equation (1) Em < Es | Equation (2-1) $\dfrac{Es \times ts^2}{Em \times tm^2}$ | $1.1 \leq$ $\dfrac{Es \times ts^2}{Em \times tm^2}$ | ΔB (T) (Δh = 2 mm) | Increase in ΔB (%) |
|---|---|---|---|---|---|---|---|---|---|
| | Sheet Thickness ts (mm) | Young's Modulus Es (GPa) | Sheet Thickness tm (mm) | Young's Modulus Em (GPa) | | | | | |
| Comparative Example II-14 | 0.40 | 110 | 0.52 | 150 | no | 0.4 | no | 0.01 | 0.0 |
| Comparative Example II-15 | 0.42 | 110 | 0.52 | 150 | no | 0.5 | no | 0.01 | 0.0 |
| Comparative Example II-16 | 0.46 | 110 | 0.52 | 150 | no | 0.6 | no | 0.02 | 100.0 |
| Comparative Example II-17 | 0.65 | 110 | 0.52 | 150 | no | 1.1 | yes | 0.04 | 300.0 |
| Comparative Example II-18 | 0.75 | 110 | 0.52 | 150 | no | 1.5 | yes | 0.06 | 500.0 |
| Comparative Example II-19 | 1.02 | 110 | 0.52 | 150 | no | 2.8 | yes | 0.08 | 700.0 |
| Comparative Example II-20 | 1.10 | 110 | 0.52 | 150 | no | 3.3 | yes | 0.08 | 700.0 |
| Comparative Example II-21 | 1.50 | 110 | 0.52 | 150 | no | 6.1 | yes | 0.08 | 700.0 |
| Comparative Example II-22 | 2.00 | 110 | 0.52 | 150 | no | 10.8 | yes | 0.08 | 700.0 |

Each of Comparative Examples II-17 to II-22 does not satisfy the relationship of Equation (1), but satisfies the relationship of Equation (2). Further, the values obtained by Equation (2-1) are equivalent to those of Examples II A-40 to A-47 shown in Table 16. However, the ΔB values of the Comparative Examples decreased to 60% or less of the ΔB values of the Examples having equivalent values for Equation (2-1). Further, in Comparative Examples II-14 to II-16 which do not satisfy the relationships of Equations (1) and (2), the ΔB values decreased to about 20 to 40% of the ΔB values of Comparative Examples II-6 to II-8 which satisfy the relationship of Equation (1), and do not satisfy the relationship of Equation (2).

Comparative Examples II-23 and II-24

Each of the magnetostrictive elements of the above Comparative Example II-16 and II-21 was produced in decuplicate. Here, application of an epoxy-based adhesive was performed with a spatula, and the thickness of the adhesive was confirmed only by visual observation, and procedures for equalizing the thickness was omitted.

In each Comparative Example, voltage generated by each of the ten magnetostrictive elements was measured using the measurement unit shown in FIG. 1.

The measurement unit with the magnetostrictive element installed therein and the aluminum frame having the measurement unit mounted thereon were placed on top of an excitation apparatus, and a dynamic strain was applied to the magnetostrictive element. Here, a cylinder head was removed from a micrometer installed at the end opposite to the fixed end of the magnetostrictive element, and a tungsten anchor was fixed thereto. The weight of the anchor was adjusted so that vibration amplitude will be about 1.3 mm.

The excitation apparatus was vibrated at 10 Hz with an acceleration of 1 G, and voltage (mV) was individually measured for each of the ten magnetostrictive elements. Regarding the measured voltage values, the minimum value, maximum value, average value of the ten magnetostrictive elements, and the difference between the maximum value and the minimum value were determined. These values are summarized in Table 21 along with the values determined by Equation (2-1).

TABLE 21

| No. | Magnetostrictive Element | Weight of Anchor (g) | Maximum Voltage (mV) | Minimum Voltage (mV) | Average Voltage (mV) | Difference between Maximum and Minimum (mV) | Equation (2-1) $\dfrac{Es \times ts^2}{Em \times tm^2}$ |
|---|---|---|---|---|---|---|---|
| Comparative Example II-23 | Magnetostrictive Element of Comparative Example II-16 | 13 | 2 | 0 (not detectable) | — | — | 0.6 |
| Comparative Example II-24 | Magnetostrictive Element of Comparative Example II-21 | 45 | 11 | 8 | 9 | 3 | 6.1 |

In Comparative Example II-24 which satisfies the relationship of Equation (2), but does not satisfy the relationship of Equation (1), the average voltage was 9 mV which is less than half of the average voltage of Example II A-50 which satisfies the relationships of both Equations (1) and (2). Further, in Comparative Example II-23 which does not satisfy the relations of both Equations (1) and (2), the voltages decreased to an undetectable level.

Example III <Examples of Devices with a Frame>

(Methods for Evaluation)

In the following Examples III and Comparative Examples III, voltage was measured by imputing ΔC voltage induced in the detection coil of the produced magnetostrictive power generation device to a digital oscilloscope. The performance of the magnetostrictive power generation device was evaluated by the peak voltage of the measured voltage waveform.

Example III-1

In Example III-1, magnetostrictive power generation device 100 having the structure shown in FIG. 6 was produced using a grain-oriented electrical steel sheet and a non-oriented electrical steel sheet as electrical steel sheet 121 (magnetostrictive material), and CFRP (which is a non-magnetic material) as elastic material 122.

As the grain-oriented electrical steel sheet, grain-oriented electrical steel sheet 27ZH100 (manufactured by Nippon Steel Corporation) with coating, was used. The thickness of the electrical steel sheet was 0.27 mm and the crystallographic orientation was {110}<100> GOSS texture. The longitudinal direction of the grain-oriented electrical steel sheet was taken as the <100> direction and was cut into 140 mm in length and 6 mm in width by shearing. The cut-out sheet was shaped by bending into a U-shape as shown in FIG. 6. The length of a lower portion corresponding to fixation part 170 was about 80 mm, and the length of an upper portion for providing detection coil 160 and anchor 140 was about 40 mm. After bending the grain-oriented electrical steel sheet in a U-shape, the shaped sheet was annealed at 800° C. for 2 hours under vacuum for removing the strain.

As the non-oriented electrical steel sheet, non-oriented electrical steel sheet 35H210 (manufactured by Nippon Steel Corporation) with coating, was used. The thickness of the electrical steel sheet was 0.35 mm. Non-oriented electrical steel sheet was cut into 140 mm in length and 6 mm in width by shearing. The cut-out sheet was shaped by bending into a U-shape as shown in FIG. 6. The length of a lower portion corresponding to fixation part 170 was about 80 mm, and the length of an upper portion for providing detection coil 160 and anchor 140 was about 40 mm. After bending the non-oriented electrical steel sheet in a U-shape, the shaped sheet was annealed at 740° C. for 2 hours under vacuum for removing the strain.

As elastic material 122, CFRP which is a non-magnetic material and having a thickness of 0.5 mm and a width of 6 mm was used. The direction of the carbon fibers was taken as the longitudinal direction and the CFRP was cut into a size which is a little longer than 140 mm so as to enable integration with the U-shaped electrical steel sheet. The cut-out sheet was shaped into a U-shape by heat press.

Either the grain-oriented or non-oriented electrical steel sheet 121 bent in a U-shape and the CFRP (elastic material 122) bent in a U-shape were bonded together at room temperature by an epoxy-based adhesive to form laminate

120, thereby obtaining an integral structure of the magnetostrictive element section corresponding to magnetostrictive element 110 and the whole (i.e., 100%) of frame 130. 5000 turns of detection coil 160 was loaded at a portion corresponding to the magnetostrictive element of the obtained integral structure. The length of the coil was 15 mm. Subsequently, 7 g of tungsten anchor 140 was fixed by an adhesive next to magnetostrictive element 110. NdFeB magnet 150 was attached to fixation part 170 at the lower part of the U-shape on the side of electrical steel sheet 121, thereby obtaining magnetostrictive power generation device 100 in which the whole of frame 130 is formed integrally with magnetostrictive element 110.

Fixation part 170 at the lower portion of the U-shape of the obtained magnetostrictive power generating device was fixed on an excitation apparatus with an adhesive. Subsequently, a bias magnetic field was applied by NdFeB magnet 150. The magnet was selected by measuring the peak voltage while changing the magnitude (size) of the magnet, and a magnet which achieved a maximum peak voltage was used. The strength of the magnetic field applied to the magnetostrictive element was estimated to be about 2800 A/m (35 Oe) for the grain-oriented electrical steel sheet and about 3200 A/m (40 Oe) for the non-oriented electrical steel sheet. The excitation apparatus was excited at 0.5 G, and peak-voltage at resonant frequency was measured by an oscilloscope.

The resonant frequency of the device using a grain-oriented electrical steel sheet as the magnetostrictive material was 215 Hz, and that of the device using a non-oriented electrical steel sheet as the magnetostrictive material was 227 Hz. The peak voltages are shown in Table 22.

TABLE 22

|  | Peak Voltage (mV) |
| --- | --- |
| Grain-Oriented Electrical Steel Sheet/CFRP | 805 |
| Non-oriented Electrical Steel Sheet/CFRP | 595 |

As apparent from the results shown in Table 22, the device of the present invention showed a power generation performance of 500 mV or more in response to the external vibration.

Example III-2

In Example III-2, magnetostrictive power generation device 200 having the structure shown in FIG. 7 was produced using a grain-oriented electrical steel sheet as electrical steel sheet 221 (magnetostrictive material), and CFRP (which is a non-magnetic material) as elastic material 222.

Magnetostrictive power generation device was assembled in the same manner as in Example III-1, except that the thickness of CFRP (which is an elastic material) was reduced to 0.3 mm in the magnetostrictive element section corresponding to magnetostrictive element 210, and the thickness of CFRP in portions excluding the magnetostrictive element section was 0.5 mm, thereby obtaining an integral structure of the magnetostrictive element section corresponding to magnetostrictive element 210 and the whole (i.e., 100%) of frame 230. In this device, vibration of the magnetostrictive element section was facilitated by reducing the thickness of stress control part 212.

When magnetostrictive power generating device 200 was evaluated in the same manner as in Example III-1, the resonant frequency was 155 Hz. The peak voltage is shown in Table 23.

TABLE 23

| | Peak Voltage (mV) |
| --- | --- |
| Grain-Oriented Electrical Steel Sheet/CFRP | 935 |

As apparent from the results shown in Table 23, the device of the present invention showed a power generation performance of 500 mV or more in response to the external vibration. Since the thickness of stress control part 212 was thinner than that of Example III-1, the resonant frequency was lower, but the peak value of the generated voltage was improved by the increased vibration amplitude of the magnetostrictive element section.

Example III-3

In Example III-3, magnetostrictive power generation device 300 having the structure shown in FIG. 8 was produced using a grain-oriented electrical steel sheet as electrical steel sheet 321 (magnetostrictive material), and SUS304 which is a non-magnetic material as elastic material 322.

As grain-oriented electrical steel sheet 321, grain-oriented electrical steel sheet 27ZH100 (manufactured by Nippon Steel Corporation) with coating, was used. The thickness of the electrical steel sheet was 0.27 mm and the crystallographic orientation was {110}<100> GOSS texture. The longitudinal direction of the grain-oriented electrical steel sheet was taken as the <100> direction and was cut into 100 mm in length and 6 mm in width by shearing. The cut-out sheet was shaped by bending into a U-shape as shown in FIG. 8. The length of a lower portion corresponding to fixation part 370 was about 40 mm, and the length of an upper portion for providing detection coil 360 and anchor 340 was about 40 mm. After bending the grain-oriented electrical steel sheet in a U-shape, the shaped sheet was annealed at 800° C. for 2 hours under vacuum for removing the strain.

As elastic material 322, SUS304 which is a non-magnetic material and having a thickness of 0.5 mm and a width of 6 mm was used. SUS304 was cut into a size which is a little longer than 140 mm so as to enable integration with the U-shaped electrical steel sheet. The cut-out sheet was shaped into a U-shape. The U-shaped SUS304 was held under vacuum at 1050° C. for 1 minute, and subjected to a solid solution treatment by gas quenching for removing the influence of cutting strain.

Grain-oriented electrical steel sheet 321 bent in a U-shape and the SUS304 (elastic material 322) bent in a U-shape were bonded together at room temperature by an epoxy-based adhesive to form laminate 320. Apart (i.e., 100 mm/140 mm=about 71%) of the frame was composed of the above laminate, and an integral structure of elastic material 322 extending from stress control part 312 of magnetostrictive element 310 and the whole of frame 330 was obtained.

Magnetostrictive power generation device 300 was produced in the same manner as in Example III-1 by using the obtained integral structure.

When magnetostrictive power generating device 300 was evaluated in the same manner as in Example III-1, the resonant frequency was 98 Hz. The peak voltage is shown in Table 24.

TABLE 24

| | Peak Voltage (mV) |
| --- | --- |
| Grain-Oriented Electrical Steel Sheet/SUS304 | 975 |

As apparent from the results shown in Table 24, the device of the present invention showed a power generation performance of 500 mV or more in response to the external vibration.

Example III-4

In Example III-4, magnetostrictive power generation device 400 having the structure shown in FIG. 9 was produced using a grain-oriented electrical steel sheet as electrical steel sheet 421 (magnetostrictive material), and SS400 which is a magnetic material as elastic material 422.

The grain-oriented electrical steel sheet which is the same as that used in Example III-3 was used as electrical steel sheet 421, and the sheet was shaped into a U-shape.

As elastic material 422, SS400 which is a magnetic material and having a thickness of 0.5 mm and a width of 6 mm was used. SS400 was cut into a size which is a little longer than 140 mm so as to enable integration with the U-shaped electrical steel sheet. The cut-out sheet was shaped into a U-shape. The U-shaped SS400 was held under vacuum at 800° C. for 30 minutes and, then cooled for removing the influence of cutting strain.

The grain-oriented electrical steel sheet bent in a U-shape and the SS400 bent in a U-shape were bonded together at room temperature by an epoxy-based adhesive to form laminate 420. Apart (i.e., 100 mm/140 mm=about 71%) of the frame was composed of the above laminate, and an integral structure of elastic material 422 extending from stress control part 412 of magnetostrictive element 410 and the whole of frame 430 was obtained. Magnetostrictive power generation device 400 was produced in the same manner as in Example III-1 by using the obtained integral structure. The magnet was selected by measuring the peak voltage while changing the strength (size) of the magnet, and a magnet which achieved a maximum peak voltage was used. The strength of the magnetic field applied to the magnetostrictive element was estimated to be about 4000 A/m (50 Oe).

When magnetostrictive power generating device 400 was evaluated in the same manner as in Example III-1, the resonant frequency was 104 Hz. The peak voltage is shown in Table 25.

TABLE 25

| | Peak Voltage (mV) |
|---|---|
| Grain-Oriented Electrical Steel Sheet/SS400 | 915 |

As apparent from the results shown in Table 25, the device of the present invention showed a power generation performance of 500 mV or more in response to the external vibration. In this device, since the elastic material forming stress control part 412 is a magnetic material (SS400), the bias magnetic field also flows into stress control part 412. Therefore, a magnet which is larger and stronger than that used in Example III-3 was used. Compared to Example III-3 which uses a non-magnetic material as elastic material 322 forming stress control part 312, control of the bias magnetic field was not easy in Example III-4, and there was a slight decrease in the peak voltage as compared with Example III-3.

Example III-5

In Example III-5, magnetostrictive power generation device 500 having the structure shown in FIG. 10 was produced using a grain-oriented electrical steel sheet as electrical steel sheet 521 (magnetostrictive material), and SUS304 which is a magnetic material as elastic material 522.

Magnetostrictive power generation device 500 was produced in the same manner as in Example III-3, except that the length of the electrical steel sheet was 70 mm and magnets were fixed to both sides of magnetostrictive element 510. Apart (i.e., 70 mm/140 mm=50%) of the frame was composed of a laminate, and the remainder of the frame had an integral structure with elastic material 522 extending from stress control part 512 of magnetostrictive element 510. Two magnets were used, and the two magnets were bonded in opposite polarity so as to prevent the cancellation of the magnetic fields inside the magnetostrictive element. The magnet was selected by measuring the peak voltage while changing the magnitude (size) of the magnet, and a magnet which achieved a maximum peak voltage was used. The strength of the magnetic field applied to the magnetostrictive element was estimated to be about 2800 A/m (35 Oe).

When magnetostrictive power generating device 500 was evaluated in the same manner as in Example III-1, the resonant frequency was 108 Hz. The peak voltage is shown in Table 26.

TABLE 26

| | Peak Voltage (mV) |
|---|---|
| Grain-Oriented Electrical Steel Sheet/SUS304 | 955 |

As apparent from the results shown in Table 26, the device of the present invention showed a power generation performance of 500 mV or more in response to the external vibration.

Example III-6

In Example III-6, magnetostrictive power generation device 600 having the structure shown in FIG. 11 was produced using a grain-oriented electrical steel sheet as electrical steel sheet 621 (magnetostrictive material), and CFRP (which is a non-magnetic material) as elastic material 622.

The grain-oriented electrical steel sheet and CFRP, which are the same as those used in Example III-1, were cut into a length of 80 mm. The cut-out sheets in the plate form, without bending into a U-shape, were bonded together at room temperature by an epoxy-based adhesive to form laminate 620, thereby obtaining an integral structure of the magnetostrictive element section corresponding to magnetostrictive element 610 and the whole (i.e., 100%) of frame 630. Magnetostrictive power generation device 600 was produced in the same manner as in Example III-1 by using the obtained integral structure.

When magnetostrictive power generating device 600 was evaluated in the same manner as in Example III-1, the resonant frequency was 248 Hz. The peak voltage is shown in Table 27.

TABLE 27

| | Peak Voltage (mV) |
|---|---|
| Grain-Oriented Electrical Steel Sheet/CFRP | 716 |

As apparent from the results shown in Table 27, the device of the present invention showed a power generation performance of 500 mV or more in response to the external vibration.

Example III-7

In Example III-7, magnetostrictive power generation device 700 having the structure shown in FIG. 12 was produced using a grain-oriented electrical steel sheet as electrical steel sheet 721 (magnetostrictive material), and CFRP (which is a non-magnetic material) as elastic material 722.

As the grain-oriented electrical steel sheet, grain-oriented electrical steel sheet 27ZH100 (manufactured by Nippon Steel Corporation) with coating, was used. The thickness of the electrical steel sheet was 0.27 mm and the crystallographic orientation was {110}<100> GOSS texture. The longitudinal direction of the grain-oriented electrical steel sheet was taken as the <100> direction and was cut into 140 mm in length and 6 mm in width by shearing. The cut-out sheet was shaped by bending into a U-shape as shown in FIG. 12. The length of a lower portion corresponding to fixation part 770 was about 80 mm, and the length of an upper portion for providing detection coil 760 and anchor 740 was about 40 mm. After bending the grain-oriented electrical steel sheet in a U-shape, the shaped sheet was annealed at 800° C. for 2 hours under vacuum for removing the strain.

As elastic material 722, CFRP which is a non-magnetic material and having a thickness of 0.3 mm and a width of 6 mm was used. The direction of the carbon fibers was taken as the longitudinal direction and the CFRP was cut into a length of 40 mm.

As shown in FIG. 12, the cut-out CFRP was bonded to the U-shaped grain-oriented electrical steel sheet at room temperature by an epoxy-based adhesive to form laminate 720. Apart (i.e., 40 mm/140 mm=about 29%) of the frame was composed of the above laminate, and an integral structure of the electrical sheet extending from the magnetostrictive part 711 of the magnetostrictive element 710 and the whole of frame 730 was obtained. Further, an SUS304 block as pillar 780 was attached to the grain-oriented electrical steel sheet by using an epoxy-based adhesive. Magnetostrictive power generation device 700 was produced in the same manner as in Example III-1 by using the obtained integral structure.

When the magnetostrictive power generating device 700 was evaluated in the same manner as in Example III-1, the resonant frequency was 165 Hz. The peak voltage is shown in Table 28.

TABLE 28

| | Peak Voltage (mV) |
|---|---|
| Grain-Oriented Electrical Steel Sheet/CFRP | 920 |

As apparent from the results shown in Table 28, the device of the present invention showed a power generation performance of 500 mV or more in response to the external vibration. Further, the peak voltage was improved as compared to the device of Experiment III-1 having a similar configuration because vibration was more easily generated in this device.

Example III-8

Magnetostrictive power generation device 800 having the structure shown in FIG. 13 was produced in the same manner as in Example III-7, except that the magnet was changed to two magnets 850. The magnet was selected by measuring the peak voltage while changing the magnitude (size) of the magnet, and a magnet which achieved a maximum peak voltage was used. The strength of the magnetic field applied to the magnetostrictive element was estimated to be about 2800 A/m (35 Oe).

When magnetostrictive power generating device 800 was evaluated in the same manner as in Example III-1, the resonant frequency was 157 Hz. The peak voltage is shown in Table 29.

TABLE 29

| | Peak Voltage (mV) |
|---|---|
| Grain-Oriented Electrical Steel Sheet/CFRP | 895 |

As apparent from the results shown in Table 29, the device of the present invention showed a power generation performance of 500 mV or more in response to the external vibration.

Reference Example III-1

Figure 14:
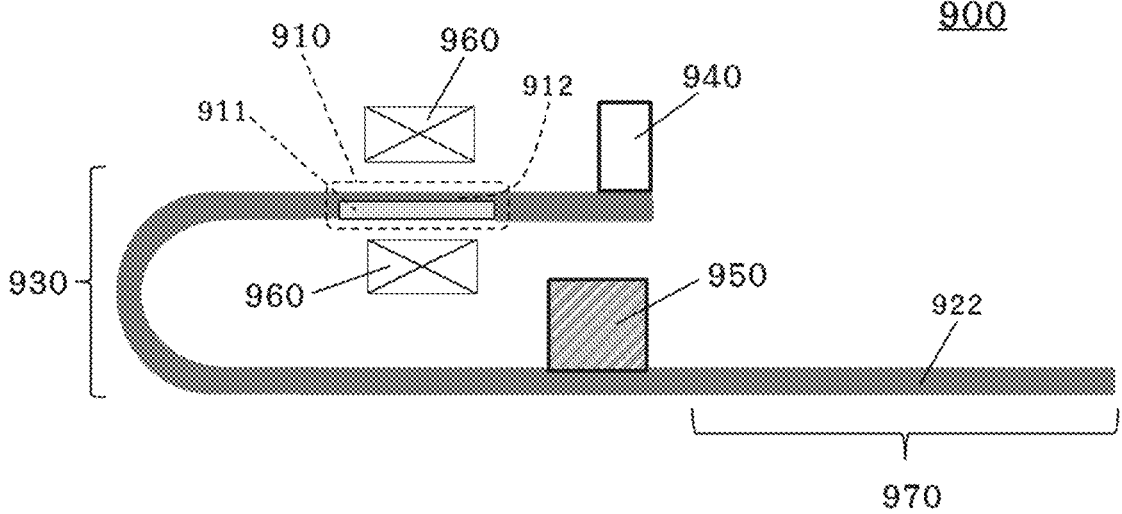
FIG. 14 is a schematic diagram showing the structure of the magnetostrictive power generation device of Reference Example.

In Reference Example III-1, magnetostrictive power generation device 900 having the structure shown in FIG. 14 was produced using a grain-oriented electrical steel sheet as magnetostrictive part 911, and SS400 which is a magnetic material as elastic material 922.

As the grain-oriented electrical steel sheet, grain-oriented electrical steel sheet 27ZH100 (manufactured by Nippon Steel Corporation) with coating, was used. The thickness of the electrical steel sheet was 0.27 mm and the crystallographic orientation was {110}<100> GOSS texture. The grain-oriented electrical steel sheet was cut into 20 mm in length and 6 mm in width by shearing. Subsequently, the sheet was annealed at 800° C. for 2 hours under vacuum for removing the strain.

As elastic material 922, SUS304 having a width of 6 mm and length of 140 mm was used. The thickness of the SUS304 sheet was adjusted so that the part for bonding the above-mentioned magnetostrictive part 911 (the part corresponding to stress control part 912) was 0.5 mm, and the remainder was 0.8 mm. The sheet was shaped by bending into a U-shape as shown in FIG. 14. The length of a lower portion corresponding to fixation part 970 was about 80 mm, and the length of an upper portion for providing detection coil 960 and anchor 940 was about 40 mm. The U-shaped SS400 was held under vacuum at 800° C. for 30 minutes and, then cooled for removing the influence of cutting strain.

Magnetostrictive part 911 was bonded at room temperature by an epoxy-based adhesive to the part corresponding to stress control part 912 of the elastic material bent into a U-shape, thereby forming a part corresponding to magnetostrictive element 910. An integral structure of elastic material 922 extending from stress control part 912 of magnetostrictive element 910 and the whole of frame 930 was obtained. In this integral structure, the frame does not have a portion composed of a laminate containing an electrical steel sheet extending from a magnetostrictive part and an elastic material extending from a stress control part. Magnetostrictive power generation device 900 was produced in the same manner as in Example III-1 by using the obtained integral structure. Magnetostrictive power generation device 900 was also equipped with anchor 940 for providing bending strain to the magnetostrictive part and magnet 950 for applying bias magnetic field, and was capable of fixing to the excitation apparatus at fixation part 970.

When magnetostrictive power generating device 900 was evaluated in the same manner as in Example III-1, the resonant frequency was 118 Hz. The peak voltage is shown in Table 30.

TABLE 30

| | Peak Voltage (mV) |
|---|---|
| Grain-Oriented Electrical Steel Sheet/SS400 | 815 |

As apparent from the results shown in Table 30, the device of Reference Example III-1 showed a power generation performance of 500 mV or more in response to the external vibration. However, the bias magnetic field also flowed into SS400 which is the elastic material. Further, since the device does not have a portion composed of a laminate containing an electrical steel sheet extending from a magnetostrictive part and an elastic material extending from a stress control part, adhesion of both ends of the magnetostrictive part to the stress control part was not easy. This caused a magnetic gap and control of the bias magnetic field by the magnet became difficult. As a result, the peak voltage was lower than that of the device of Example III-4 having a similar configuration.

Example III-10

Continuous vibration was applied to each of the devices prepared in Examples III-1 to III-8 by an excitation apparatus.

As a result, each of the devices of Examples III-1 to III-8, in which at least a part of the frame is composed of a laminate containing an electrical steel sheet extending from a magnetostrictive part and an elastic material extending from a stress control part, worked satisfactorily even after 24 hours of vibration.

Example III-11

In Example III-11, magnetostrictive power generation device 1000 having the structure shown in FIG. 15 was produced using either a grain-oriented electrical steel sheet or a non-oriented electrical steel sheet as electrical steel sheet 1021 (magnetostrictive material), and CFRP (which is a non-magnetic material) as elastic material 1022.

As the grain-oriented electrical steel sheet, grain-oriented electrical steel sheet 27ZH100 (manufactured by Nippon Steel Corporation) with coating, was used. The thickness of the electrical steel sheet was 0.27 mm and the crystallographic orientation was {110}<100> GOSS texture. The longitudinal direction of the grain-oriented electrical steel sheet was taken as the <100> direction and was cut into 140 mm in length and 6 mm in width by shearing. The cut-out sheet was shaped by bending into a U-shape as shown in FIG. 15. The length of a lower portion corresponding to fixation part 1070 was about 80 mm, and the length of an upper portion for providing detection coil 1060 and anchor 1040 was about 40 mm. After bending the grain-oriented electrical steel sheet in a U-shape, the shaped sheet was annealed at 800° C. for 2 hours under vacuum for removing the strain.

As the non-oriented electrical steel sheet, non-oriented electrical steel sheet 35H210 (manufactured by Nippon Steel Corporation) with coating, was used. The thickness of the electrical steel sheet was 0.35 mm. Non-oriented electrical steel sheet was cut into 140 mm in length and 6 mm in width by shearing. The cut-out sheet was shaped by bending into a U-shape as shown in FIG. 15. The length of a lower portion corresponding to fixation part 1070 was about 80 mm, and the length of an upper portion for providing detection coil 1060 and anchor 1040 was about 40 mm. After bending the non-oriented electrical steel sheet in a U-shape, the shaped sheet was annealed at 740° C. for 2 hours under vacuum for removing the strain.

As elastic material 1022, CFRP which is a non-magnetic material and having a thickness of 0.5 mm and a width of 6 mm was used. The direction of the carbon fibers was taken as the longitudinal direction and the CFRP was cut into a size which is a little shorter than 140 mm so as to enable integration with the U-shaped electrical steel sheet. The cut-out sheet was shaped into a U-shape by heat press.

Either grain-oriented or non-oriented electrical steel sheet 1021 bent in a U-shape and the CFRP (elastic material 1022) bent in a U-shape were bonded together at room temperature by an epoxy-based adhesive to form laminate 1020, thereby obtaining an integral structure of the magnetostrictive element section corresponding to magnetostrictive element 1010 and the whole (i.e., 100%) of frame 1030. 5000 turns of detection coil 160 was loaded at a portion corresponding to the magnetostrictive element of the obtained integral structure. The length of the coil was 15 mm. Subsequently, 7 g of tungsten anchor 1040 was fixed by an adhesive next to magnetostrictive element 1010. NdFeB magnet 1050 was attached to fixation part 1070 at the lower part of the U-shape on the side of elastic material 1022, thereby obtaining magnetostrictive power generation device 1000 in which whole of frame 130 is formed integrally with magnetostrictive element 1010.

Fixation part 1070 at the lower portion of the U-shape of the obtained magnetostrictive power generating device was fixed on an excitation apparatus with an adhesive. Subsequently, a bias magnetic field was applied by NdFeB magnet 1050. The magnet was selected by measuring the peak voltage while changing the magnitude (size) of the magnet, and a magnet which achieved a maximum peak voltage was used. The strength of the magnetic field applied to the magnetostrictive element was estimated to be about 2800 A/m (35 Oe) for the grain-oriented electrical steel sheet and about 3200 A/m (40 Oe) for the non-oriented electrical steel sheet. The excitation apparatus was excited at 0.5 G, and peak-voltage at resonant frequency was measured by an oscilloscope.

The resonant frequency of the device using a grain-oriented electrical steel sheet as the magnetostrictive material was 226 Hz, and that of the device using a non-oriented electrical steel sheet as the magnetostrictive material was 239 Hz. The peak voltages are shown in Table 31.

TABLE 31

| | Peak Voltage (mV) |
|---|---|
| Grain-Oriented Electrical Steel Sheet/CFRP | 829 |
| Non-oriented Electrical Steel Sheet/CFRP | 610 |

As apparent from the results shown in Table 31, the device of the present invention showed a power generation performance of 500 mV or more in response to the external vibration.

Example III-12

In Example III-12, magnetostrictive power generation device 1100 having the structure shown in FIG. 16 was produced using a grain-oriented electrical steel sheet as electrical steel sheet 1121 (magnetostrictive material), CFRP (which is a non-magnetic material) as elastic material 1122, and an SUS304 block as pillar 1180.

The device of FIG. 16 was produced in substantially the same manner as in Example III-11, except that, after forming frame 1130, an SUS304 block as pillar 1180 was attached to elastic material 1122 (CFRP) using an epoxy-based adhesive.

When magnetostrictive power generating device 1100 was evaluated in the same manner as in Example III-1, the resonant frequency was 384 Hz. The peak voltage is shown in Table 32.

TABLE 32

| | Peak Voltage (mV) |
|---|---|
| Grain-Oriented Electrical Steel Sheet/CFRP | 746 |

As apparent from the results shown in Table 32, the device of the present invention showed a power generation performance of 500 mV or more in response to the external vibration. In this Example, the length of the laminate to be vibrated was shortened by attaching a block of SUS304 as a pillar to the CFRP using an epoxy-based adhesive. As a result, the resonant frequency became increased to 384 Hz, as compared to that of the device shown in FIG. 15 which was 226 Hz. In addition, vibration amplitude became smaller by the increase in the resonance frequency and caused the peak value of the generated voltage to be 746 mV, which is smaller than 829 mV of the grain-oriented electrical steel sheet shown in Table 31. However, the power generation performance of the device was 500 mV or more.

In device 1100, since the laminate at the right of the pillar vibrates, control of the resonant frequency becomes possible by adjusting the length of the laminate to be vibrated by changing the position for attaching the pillar.

Example III-13

In Example III-13, magnetostrictive power generation device 1200 having the structure shown in FIG. 17 was produced using a grain-oriented electrical steel sheet as electrical steel sheet 1221 (magnetostrictive material), and SUS304 which is a non-magnetic material as elastic material 1222.

As the grain-oriented electrical steel sheet, grain-oriented electrical steel sheet 27ZH100 (manufactured by Nippon Steel Corporation) with coating, was used. The thickness of the electrical steel sheet was 0.27 mm and the crystallographic orientation was {110}<100> GOSS texture. The longitudinal direction of the grain-oriented electrical steel sheet was taken as the <100> direction and was cut into 130 mm in length and 6 mm in width by shearing. The sheet was shaped by bending into a shape with a U-shaped portion and a L-shaped portion as shown in FIG. 17. The length of a lower portion corresponding to fixation part 1270 was about 40 mm, and the length of an upper portion for providing detection coil 1260 and anchor 1240 was about 40 mm. After bending the sheet into a shape with a U-shaped portion and a L-shaped portion, the shaped sheet was annealed at 800° C. for 2 hours under vacuum for removing the strain.

As elastic material 1222, SUS304 which is a non-magnetic material and having a thickness of 0.5 mm and a width of 6 mm was used. The SUS304 was cut into a size which is a little shorter than 130 mm so as to enable integration with the electrical steel sheet having a U-shaped portion and a L-shaped portion. The cut-out sheet was shaped into a shape with a U-shaped portion and a L-shaped portion. The SUS304 shaped into a shape with a U-shaped portion and a L-shaped portion was held under vacuum at 1050° C. for 1 minute, and subjected to a solid solution treatment by gas quenching for removing the influence of cutting strain.

The shaped grain-oriented electrical steel sheet and SUS304 were bonded together at room temperature by an epoxy-based adhesive to form laminate 1220, thereby obtaining an integral structure of the magnetostrictive element section corresponding to magnetostrictive element 1210 and the whole (i.e., 100%) of frame 1230. 5000 turns of detection coil was loaded at a portion corresponding to the magnetostrictive element of the obtained integral structure. The length of the coil was 15 mm. Subsequently, 7 g of tungsten anchor 1240 was fixed by an adhesive next to magnetostrictive element 1210. NdFeB magnet 1250 was fixed to the inner side (elastic material 1222 side) of the terminal portion of the frame extending from the portion bent in an L-shape, thereby obtaining magnetostrictive power generation device 1200 in which the whole of fame 1230 is formed integrally with magnetostrictive element 1210.

Fixation part 1270 at the lower portion of the U-shape of the obtained magnetostrictive power generating device was fixed on an excitation apparatus with an adhesive. Subsequently, a bias magnetic field was applied by NdFeB magnet 1250. The magnet was selected by measuring the peak voltage while changing the magnitude (size) of the magnet, and a magnet which achieved a maximum peak voltage was used. The strength of the magnetic field applied to the magnetostrictive element was estimated to be about 2800 A/m (35 Oe) for the grain-oriented electrical steel sheet. The excitation apparatus was excited at 0.5 G, and peak-voltage at resonant frequency was measured by an oscilloscope.

The resonant frequency of the device using a grain-oriented electrical steel sheet as the magnetostrictive material was 104 Hz. Peak voltage is shown in Table 33.

TABLE 33

| | Peak Voltage (mV) |
| --- | --- |
| Grain-Oriented Electrical Steel Sheet/SUS304 | 987 |

As apparent from the results shown in Table 33, the device of the present invention showed a power generation performance of 500 mV or more in response to the external vibration.

Example III-14

In Example III-14, magnetostrictive power generation device 1300 having the structure shown in FIG. 18 was produced using a grain-oriented electrical steel sheet as electrical steel sheet 1321 (magnetostrictive material), SUS304 which is a non-magnetic material as elastic material 1322, and an SUS304 block as pillar 1380.

The device of FIG. 18 was produced in substantially the same manner as in Example III-13, except that, after forming frame 1330, an SUS304 block as pillar 1380 was attached to elastic material 1322 (SUS304) using an epoxy-based adhesive.

When magnetostrictive power generating device 1300 was evaluated in the same manner as in Example III-13, the resonant frequency was 177 Hz. The peak voltage is shown in Table 34.

TABLE 34

| | Peak Voltage (mV) |
| --- | --- |
| Grain-Oriented Electrical Steel Sheet/SUS304 | 886 |

As apparent from the results shown in Table 34, the device of the present invention showed a power generation performance of 500 mV or more in response to the external vibration. In this Example, the length of the laminate to be vibrated was shortened by attaching a block of SUS304 as a pillar to the elastic material (SUS304) using an epoxy-based adhesive. As a result, the resonant frequency became increased to 177 Hz, as compared to that of the device shown in FIG. 17 which was 104 Hz. In addition, vibration amplitude became smaller by the increase in the resonance frequency and caused the peak value of the generated voltage to be 886 mV, which is smaller than 987 mV shown in Table 33. However, the power generation performance of the device was 500 mV or more.

In device 1300, since the laminate at the right of the pillar vibrates, control of the resonant frequency becomes possible by adjusting the length of the laminate to be vibrated by changing the position for attaching the pillar.

Example III-15

In Example III-15, magnetostrictive power generation device 1400 having the structure shown in FIG. 19 was produced using a grain-oriented electrical steel sheet as electrical steel sheet 1421 (magnetostrictive material), and SUS304 which is a non-magnetic material as elastic material 1422.

The device of FIG. 19 was prepared in substantially the same manner as in Example III-12, except that, during the preparation of frame 1430, the length of the SUS304 being bonded to the grain-oriented electrical steel sheet was shortened so that a part for providing NdFeB magnet 1450 does not have elastic material 1422. NdFeB magnet 1450 was attached directly to grain-oriented electrical steel sheet 1421.

Fixation part 1470 at the lower portion of the U-shape of the obtained magnetostrictive power generating device was fixed on an excitation apparatus with an adhesive. Subsequently, a bias magnetic field was applied by NdFeB magnet 1450. The magnet was selected by measuring the peak voltage while changing the magnitude (size) of the magnet, and a magnet which achieved a maximum peak voltage was used. The strength of the magnetic field applied to the magnetostrictive element was estimated to be about 2800 A/m (35 Oe) for the grain-oriented electrical steel sheet. The excitation apparatus was excited at 0.5 G, and peak-voltage at resonant frequency was measured by an oscilloscope.

The resonant frequency of the device using a grain-oriented electrical steel sheet as the magnetostrictive material was 101 Hz. The peak voltage is shown in Table 35.

TABLE 35

| | Peak Voltage (mV) |
|---|---|
| Grain-Oriented Electrical Steel Sheet/SUS304 | 989 |

As apparent from the results shown in Table 35, the device of the present invention showed a power generation performance of 500 mV or more in response to the external vibration.

As compared to device 1200 of Example III-13, influence of a magnetic gap is reduce in device 1400 because there is no elastic material (SUS304 which is a non-magnetic material) between the magnet and the grain-oriented electrical steel sheet. Accordingly, the device was capable of using a magnet which is smaller in size as compared to the NdFeB magnet used in device 1200.

Example III-16

In Example III-16, magnetostrictive power generation device 1500 having the structure shown in FIG. 20 was produced using a grain-oriented electrical steel sheet as electrical steel sheet 1521 (magnetostrictive material), SUS304 which is a non-magnetic material as elastic material 1522, and an SUS304 block as pillar 1580.

The device of FIG. 20 was prepared in substantially the same manner as in Example III-15, except that, after the preparation of frame 1530, an SUS304 block as pillar 1380 was attached to elastic material 1522 (SUS304) using an epoxy-based adhesive.

When magnetostrictive power generating device 1500 was evaluated in the same manner as in Example III-15, the resonant frequency was 172 Hz. The peak voltage is shown in Table 36.

TABLE 36

| | Peak Voltage (mV) |
|---|---|
| Grain-Oriented Electrical Steel Sheet/SUS304 | 890 |

As apparent from the results shown in Table 36, the device of the present invention showed a power generation performance of 500 mV or more in response to the external vibration. In this Example, the length of the laminate to be vibrated was shortened by attaching a block of SUS304 as a pillar to the elastic material (SUS304) using an epoxy-based adhesive. As a result, the resonant frequency became increased to 172 Hz, as compared to that of the device shown in FIG. 19 which was 101 Hz. In addition, vibration amplitude became smaller by the increase in the resonance frequency and caused the peak value of the generated voltage to be 890 mV, which is smaller than 989 mV shown in Table 35. However, the power generation performance of the device was 500 mV or more.

In device 1500, since the laminate at the right of the pillar vibrates, control of the resonant frequency becomes possible by adjusting the length of the laminate to be vibrated by changing the position for attaching the pillar.

Example III-17

In Example III-17, magnetostrictive power generation device 1600 having the structure shown in FIG. 21 was produced using a grain-oriented electrical steel sheet as electrical steel sheet 1621 (magnetostrictive material), and SUS304 which is a non-magnetic material as elastic material 1622.

As the grain-oriented electrical steel sheet, grain-oriented electrical steel sheet 27ZH100 (manufactured by Nippon Steel Corporation) with coating, was used. The thickness of the electrical steel sheet was 0.27 mm and the crystallographic orientation was {110}<100> GOSS texture. The longitudinal direction of the grain-oriented electrical steel sheet was taken as the <100> direction and was cut into 110 mm in length and 6 mm in width by shearing. The sheet was shaped by bending into a shape with a U-shaped portion and two L-shaped portions as shown in FIG. 21. The length of a lower portion corresponding to fixation part 1670 was about 35 mm, and the length of an upper portion for providing detection coil 1660 and anchor 1640 was about 40 mm. After bending the sheet into a shape with a U-shaped portion and two L-shaped portions, the shaped sheet was annealed at 800° C. for 2 hours under vacuum for removing the strain.

As elastic material 1622, SUS304 which is a non-magnetic material and having a thickness of 0.5 mm and a width of 6 mm was used. The SUS304 was cut into a size which is a little shorter than 110 mm so as to enable integration with the electrical steel sheet having a U-shaped portion and two L-shaped portions. The cut-out sheet was shaped into a shape with a U-shaped portion and two L-shaped portions. The SUS304 shaped into a shape with a U-shaped portion and two L-shaped portions was held under vacuum at 1050° C. for 1 minute, and subjected to a solid solution treatment by gas quenching for removing the influence of cutting strain.

The shaped grain-oriented electrical steel sheet and SUS304 were bonded together at room temperature by an epoxy-based adhesive to form laminate 1620, thereby obtaining an integral structure of the magnetostrictive element section corresponding to magnetostrictive element 1610 and the whole (i.e., 100%) of frame 1630. 5000 turns of detection coil was loaded at a portion corresponding to the magnetostrictive element of the obtained integral structure. The length of the coil was 15 mm. Subsequently, 7 g of tungsten anchor 1640 was fixed by an adhesive next to magnetostrictive element 1610. NdFeB magnet 1650 was fixed to upper elastic material 1622 side of the L-shaped portion closer to the terminus, thereby obtaining magnetostrictive power generation device 1600 in which the whole of frame 1630 is formed integrally with magnetostrictive element 1610.

Fixation part 1670 at the lower portion of the U-shape of the obtained magnetostrictive power generating device was fixed on an excitation apparatus with an adhesive. Subsequently, a bias magnetic field was applied by NdFeB magnet 1650. The magnet was selected by measuring the peak voltage while changing the magnitude (size) of the magnet, and a magnet which achieved a maximum peak voltage was used. The strength of the magnetic field applied to the magnetostrictive element was estimated to be about 2800 A/m (350 e) for the grain-oriented electrical steel sheet. The excitation apparatus was excited at 0.5 G, and peak-voltage at resonant frequency was measured by an oscilloscope.

The resonant frequency of the device using a grain-oriented electrical steel sheet as the magnetostrictive material was 105 Hz. The peak voltage is shown in Table 37.

TABLE 37

| | Peak Voltage (mV) |
|---|---|
| Grain-Oriented Electrical Steel Sheet/SUS304 | 985 |

As apparent from the results shown in Table 37, the device of the present invention showed a power generation performance of 500 mV or more in response to the external vibration. As compared to device 1000 of Example III-11, in device 1600, the magnet and the magnetostrictive element section were closer to each other. Narrowing of the magnetic gap enabled the use of a magnet which is smaller in size as compared to the NdFeB magnet used in the device 1000.

Example III-18

In Example III-18, magnetostrictive power generation device 1700 having the structure shown in FIG. 22 was produced using a grain-oriented electrical steel sheet as electrical steel sheet 1721 (magnetostrictive material), SUS304 which is a non-magnetic material as elastic material 1722, and an SUS304 block as pillar 1780.

The device of FIG. 22 was prepared in substantially the same manner as in Example III-17, except that, after the preparation of frame 1730, an SUS304 block as pillar 1780 was attached to elastic material 1722 (SUS304) using an epoxy-based adhesive.

When magnetostrictive power generating device 1700 was evaluated in the same manner as in Example III-17, the resonant frequency was 173 Hz. The peak voltage is shown in Table 38.

TABLE 38

| | Peak Voltage (mV) |
|---|---|
| Grain-Oriented Electrical Steel Sheet/SUS304 | 892 |

As apparent from the results shown in Table 38, the device of the present invention showed a power generation performance of 500 mV or more in response to the external vibration. In this Example, the length of the laminate to be vibrated was shortened by attaching a block of SUS304 as a pillar to SUS304 using an epoxy-based adhesive. As a result, the resonant frequency became increased to 173 Hz, as compared to that of the device shown in FIG. 21 which was 105 Hz. In addition, vibration amplitude became smaller by the increase in the resonance frequency and caused the peak value of the generated voltage to be 892 mV, which is smaller than 985 mV shown in Table 35. However, the power generation performance of the device was 500 mV or more.

Example III-19

In Example III-19, magnetostrictive power generation device 1800 having the structure shown in FIG. 23 was produced using a grain-oriented electrical steel sheet as electrical steel sheet 1821 (magnetostrictive material), and SUS304 which is a non-magnetic material as elastic material 1822.

The device of FIG. 23 was prepared in substantially the same manner as in Example III-16, except that, during the preparation of frame 1830, the length of the SUS304 being bonded to the grain-oriented electrical steel sheet was shortened so that a part for providing NdFeB magnet 1850 does not have elastic material 1822. NdFeB magnet 1850 was attached directly to grain-oriented electrical steel sheet 1821.

Fixation part 1870 at the lower portion of the U-shape of the obtained magnetostrictive power generating device was fixed on an excitation apparatus with an adhesive. Subsequently, a bias magnetic field was applied by NdFeB magnet 1850. The magnet was selected by measuring the peak voltage while changing the magnitude (size) of the magnet, and a magnet which achieved a maximum peak voltage was used. The strength of the magnetic field applied to the magnetostrictive element was estimated to be about 2800 A/m (35 Oe) for the grain-oriented electrical steel sheet. The excitation apparatus was excited at 0.5 G, and peak-voltage at resonant frequency was measured by an oscilloscope.

The resonant frequency of the device using a grain-oriented electrical steel sheet as the magnetostrictive material was 103 Hz. The peak voltage is shown in Table 39.

TABLE 39

| | Peak Voltage (mV) |
|---|---|
| Grain-Oriented Electrical Steel Sheet/SUS304 | 992 |

As apparent from the results shown in Table 39, the device of the present invention showed a power generation performance of 500 mV or more in response to the external vibration.

As compared to device 1600 of Example III-17, influence of a magnetic gap is reduce in device 1800 because there is no elastic material (SUS304 which is a non-magnetic material) between the magnet and the grain-oriented electrical steel sheet. Accordingly, the device was capable of using a magnet which is smaller in size as compared to the NdFeB magnet used in device 1600.

Example III-20

In Example III-20, magnetostrictive power generation device 1900 having the structure shown in FIG. 24 was produced using a grain-oriented electrical steel sheet as electrical steel sheet 1921 (magnetostrictive material), SUS304 which is a non-magnetic material as elastic material 1922, and an SUS304 block as pillar 1980.

The device of FIG. 24 was prepared in substantially the same manner as in Example III-19, except that, after the preparation of frame 1930, an SUS304 block as pillar 1980 was attached to elastic material 1922 (SUS304) using an epoxy-based adhesive.

When magnetostrictive power generating device 1900 was evaluated in the same manner as in Example III-19, the resonant frequency was 169 Hz. The peak voltage is shown in Table 40.

TABLE 40

| | Peak Voltage (mV) |
| --- | --- |
| Grain-Oriented Electrical Steel Sheet/SUS304 | 897 |

As apparent from the results shown in Table 40, the device of the present invention showed a power generation performance of 500 mV or more in response to the external vibration. In this Example, the length of the laminate to be vibrated was shortened by attaching a block of SUS304 as a pillar to SUS304 sheet using an epoxy-based adhesive. As a result, the resonant frequency became increased to 169 Hz, as compared to that of the device shown in FIG. 23 which was 103 Hz. In addition, vibration amplitude became smaller by the increase in the resonance frequency and caused the peak value of the generated voltage to be 897 mV, which is smaller than 992 mV shown in Table 39. However, the power generation performance of the device was 500 mV or more.

Example III-21

Continuous vibration was applied to each of the devices prepared in Examples III-11 to III-20 by an excitation apparatus.

As a result, each of the devices of Examples III-11 to III-20, in which at least a part of the frame is composed of a laminate containing an electrical steel sheet extending from a magnetostrictive part and an elastic material extending from a stress control part, worked satisfactorily even after 24 hours of vibration.

Present application claims priority to Japanese Patent Application Nos. 2019-234429, 2019-234437, and 2019-234443, all filed on Dec. 25, 2019. The contents set forth in the specification of the basic applications are incorporated herein by reference in their entirety.

INDUSTRIAL APPLICABILITY

The present invention provides a magnetostrictive element for power generation and a magnetostrictive power generation device capable of achieving a magnetostrictive power generation in an amount equivalent to or exceeding that of the prior art by using an electrical steel sheet, which is less expensive than a FeGa alloy, FeCo alloy, or FeAl alloy, as a magnetostrictive material for the magnetostrictive element. The magnetostrictive element for power generation of the present invention is lower in cost as compared to the conventional magnetostrictive elements, but enables the achievement of power generation in an amount equivalent to or exceeding that of the magnetostrictive power generation devices. Therefore, it is useful as a power source in not only wireless sensor module for IoT or the like, but also in various devices.

REFERENCE SIGNS LIST

10, 20 Unit for measuring magnetic flux density change ΔB
11, 21 Magnetostrictive element
11*a*, 21*a* Magnetostrictive part
11*b* Stress control part
12, 22 Coil for bias magnetic field
13, 23 Detection coil
14, 24 DC power supply
15 Fixing support base
16, 26 Flux meter
17 Pressure
17*a* Distance moved
27 Tensile strain
28 Compressive strain
30 Magnetostrictive vibration apparatus
31 Magnetostrictive element section
31*a* Magnetostrictive part
31*b* Stress control part (non-magnetic material)
32 Anchor
33 Detection coil
34 Magnet
35 Frame (non-magnetic material)
100, 200, 300, 400, 500, 600, 700, 800, 900, 1000, 1100, 1200, 1300, 1400, 1500, 1600, 1700, 1800, 1900 Magnetostrictive power generation device
110, 210, 310, 410, 510, 610, 710, 810, 910, 1010, 1110, 1210, 1310, 1410, 1510, 1610, 1710, 1810, 1910 Magnetostrictive element for power generation
111, 211, 311, 411, 511, 611, 711, 811, 911, 1011, 1111, 1211, 1311, 1411, 1511, 1611, 1711, 1811, 1911 Magnetostrictive part (electrical steel sheet)
112, 212, 312, 412, 512, 612, 712, 812, 912, 1012, 1112, 1212, 1312, 1412, 1512, 1612, 1712, 1812, 1912 Stress control part (elastic material)
120, 220, 320, 420, 520, 620, 720, 820, 1020, 1120, 1220, 1320, 1420, 1520, 1620, 1720, 1820, 1920 Laminate
121, 221, 321, 421, 521, 621, 721, 821, 1021, 1121, 1221, 1321, 1421, 1521, 1621, 1721, 1821, 1921 Electrical steel sheet
122, 222, 322, 422, 522, 622, 722, 822, 922, 1022, 1122, 1222, 1322, 1422, 1522, 1622, 1722, 1822, 1922 Elastic material
130, 230, 330, 430, 530, 630, 730, 830, 930, 1030, 1130, 1230, 1330, 1430, 1530, 1630, 1730, 1830, 1930 Frame
140, 240, 340, 440, 550, 640, 740, 840, 940, 1040, 1140, 1240, 1340, 1440, 1540, 1640, 1740, 1840, 1940 Anchor
150, 250, 350, 450, 550, 650, 750, 850, 950, 1050, 1150, 1250, 1350, 1450, 1550, 1650, 1750, 1850, 1950 Magnet
160, 260, 360, 460, 560, 660, 760, 860, 960, 1060, 1160, 1260, 1360, 1460, 1560, 1660, 1760, 1860, 1960 Detection coil
170, 270, 370, 470, 570, 670, 770, 870, 970, 1070, 1170, 1270, 1370, 1470, 1570, 1670, 1770, 1870, 1970 Fixation part
780, 880, 1180, 1380, 1580, 1780, 1980 Pillar

The invention claimed is:

1. A magnetostrictive element for power generation comprising a magnetostrictive part formed of a grain-oriented electrical steel having a {110} <100> GOSS texture and a stress control part formed of an elastic material laminated to the grain-oriented electrical steel sheet.

2. The magnetostrictive element for power generation according to claim 1, wherein, when the grain-oriented electrical steel sheet has a Young's modulus Em [GPa] and a sheet thickness tm [mm], and the elastic material has a Young's modulus Es [GPa] and a sheet thickness ts [mm], the magnetostrictive element simultaneously satisfies the relationships of the following Equations (1) and (2):

$$Em < Es \tag{1}$$

$$1.1 \le \frac{Es \times ts^2}{Em \times tm^2}. \tag{2}$$

3. The magnetostrictive element for power generation according to claim 2, wherein the elastic material is a non-magnetic material.

4. The magnetostrictive element for power generation according to claim 1, wherein the elastic material is a non-magnetic material.

5. A magnetostrictive power generation device comprising:

the magnetostrictive element according to claim 1 having the magnetostrictive part formed of the grain-oriented electrical steel sheet having a {110} <100> GOSS texture and the stress control part formed of the elastic material; and a frame continuous with the magnetostrictive element for power generation, wherein at least a part of the frame is composed of a laminate comprising the grain-oriented electrical steel sheet extending from the magnetostrictive part and the elastic material extending from the stress control part.

6. The magnetostrictive power generation device according to claim 5, wherein whole of the frame is formed integrally with the grain-oriented electrical steel sheet extending from the magnetostrictive part.

7. The magnetostrictive power generation device according to claim 5, wherein whole of the frame is formed integrally with the elastic material extending from the stress control part.

8. The magnetostrictive power generation device according to claim 5, wherein whole of the frame is formed integrally with the magnetostrictive element for power generation.

9. The magnetostrictive power generation device according to claim 5, wherein the frame has a shape with at least one bent portion, and wherein, in the frame and the magnetostrictive element for power generation, the grain-oriented electrical steel sheet is positioned at an inner side of the magnetostrictive power generation device and the elastic material is positioned at an outer side of the magnetostrictive power generation device.

10. The magnetostrictive power generation device according to claim 5, wherein the frame has a shape with at least one bent portion, and wherein, in the frame and the magnetostrictive element for power generation, the elastic material is positioned at an inner side of the magnetostrictive power generation device and the grain-oriented electrical steel sheet is positioned at an outer side of the magnetostrictive power generation device.

11. The magnetostrictive power generation device according to claim 5, wherein:

the grain-oriented electrical steel sheet is configured such that a bias magnetic field is applied in <100> direction thereof.

12. A magnetostrictive power generation device comprising a magnetostrictive element for power generation, wherein magnetostrictive element comprises a magnetostrictive part formed of a grain-oriented electrical steel having a {110} <100> GOSS texture, and the grain-oriented electrical steel sheet is configured such that a bias magnetic field is applied in <100> direction thereof.

* * * * *